(12) United States Patent
Diao et al.

(10) Patent No.: US 12,328,996 B2
(45) Date of Patent: Jun. 10, 2025

(54) DISPLAY SUBSTRATE, METHOD OF FORMING DISPLAY SUBSTRATE, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yongfu Diao, Beijing (CN); Chenyu Chen, Beijing (CN); Biao Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 935 days.

(21) Appl. No.: 17/254,168

(22) PCT Filed: Nov. 29, 2019

(86) PCT No.: PCT/CN2019/121950
§ 371 (c)(1),
(2) Date: Dec. 18, 2020

(87) PCT Pub. No.: WO2021/102905
PCT Pub. Date: Jun. 3, 2021

(65) Prior Publication Data
US 2021/0335989 A1    Oct. 28, 2021

(51) Int. Cl.
*H10K 59/131*    (2023.01)
*H10K 59/12*    (2023.01)
(Continued)

(52) U.S. Cl.
CPC ......... *H10K 59/131* (2023.02); *H10K 59/126* (2023.02); *H10K 71/00* (2023.02); *H10K 59/1201* (2023.02)

(58) Field of Classification Search
None
See application file for complete search history.

(56) References Cited

U.S. PATENT DOCUMENTS

2016/0043159 A1    2/2016  Kim et al.
2016/0141348 A1    5/2016  Lin et al.
(Continued)

FOREIGN PATENT DOCUMENTS

CN    105336295 A    2/2016
CN    205081121 U    3/2016
(Continued)

*Primary Examiner* — Erik T. K. Peterson
*Assistant Examiner* — Christopher A. Schodde
(74) *Attorney, Agent, or Firm* — Muncy, Geissler, Olds & Lowe, P.C.

(57) ABSTRACT

A display substrate, a method of forming a display substrate and a display device are provided. The display substrate includes a substrate and a plurality of sub-pixels arranged in an array on the substrate; The sub-pixel includes a data line pattern extending in a first direction; an initialization signal line pattern including a portion extending in a second direction, the second direction intersecting the first direction, the initialization signal line pattern configured to transmit an initialization signal having a fixed potential; a sub-pixel driving circuit including a driving transistor, a first transistor coupled to a gate of the driving transistor, and a first shielding member coupled to an initialization signal line pattern, an orthographic projection of the first shielding member on a substrate, between the orthographic projection of the first transistor on the substrate and the orthographic projection of the target data line pattern on the substrate; a (Continued)

target data line pattern is included in the next sub-pixel adjacent to the sub-pixel in the second direction.

23 Claims, 24 Drawing Sheets

(51) Int. Cl.
*H10K 59/126* (2023.01)
*H10K 71/00* (2023.01)

(56) References Cited

U.S. PATENT DOCUMENTS

| | | | |
|---|---|---|---|
| 2017/0154944 | A1 | 6/2017 | Kim et al. |
| 2017/0365647 | A1* | 12/2017 | Choi .................... G09G 3/3258 |
| 2018/0040680 | A1* | 2/2018 | Cai .................... H10K 59/1213 |
| 2018/0175135 | A1 | 6/2018 | Lim et al. |
| 2018/0212016 | A1 | 7/2018 | Choi et al. |
| 2019/0103455 | A1* | 4/2019 | Song .................... H10K 59/131 |
| 2021/0066429 | A1* | 3/2021 | Kim .................... G09G 3/3266 |

FOREIGN PATENT DOCUMENTS

| | | |
|---|---|---|
| CN | 106847170 A | 6/2017 |
| CN | 107527590 A | 12/2017 |
| CN | 108154842 A | 6/2018 |
| CN | 108206203 A | 6/2018 |

* cited by examiner

DISPLAY SUBSTRATE, METHOD OF FORMING DISPLAY SUBSTRATE, AND DISPLAY DEVICE

CROSS-REFERENCE TO RELATED APPLICATION

This application is the U.S. national phase of PCT Application PCT/CN2019/121950 filed on Nov. 29, 2019, the disclosure of which is incorporated herein in its entirety by reference.

TECHNICAL FIELD

The present disclosure relates to the field of display technologies, and more particularly, to a display substrate, a method of forming a display substrate, and a display device.

BACKGROUND

An organic light-emitting diode (Organic Light-Emitting Diode, OLED for short) display product is widely used in various fields because of its high brightness, low power consumption, fast response, high definition, good flexibility, high luminous efficiency, and the like.

However, as the application range of the OLED display product becomes wider and wider, the display quality of the OLED display product becomes higher and higher, and the factors influencing the display quality of the display product are various. The vertical crosstalk phenomenon generated by the pixel circuit structure included in the display product is widely concerned as an important factor, and there are roughly two reasons for the vertical crosstalk phenomenon, namely, vertical crosstalk caused by voltage drop on a power supply signal line in the display product and vertical crosstalk caused by a data signal of a data line transmission change.

SUMMARY

An object of the present disclosure is to provide a display substrate, a method of forming a display substrate, and a display device.

A display substrate is provided in a first aspect of the present disclosure, including a substrate and a plurality of sub-pixels arranged in an array on the substrate, where the sub-pixels include:

a data line pattern extending in a first direction;

an initialization signal line pattern including a portion extending in a second direction intersecting the first direction, where the initialization signal line pattern is configured to transmit an initialization signal having a fixed potential;

a sub-pixel driving circuit including a driving transistor, a first transistor coupled to a gate of the driving transistor, and a first shielding member coupled to the initialization signal line pattern, where an orthographic projection of the first shielding member on the substrate is between an orthographic projection of the first transistor on the substrate and an orthographic projection of the target data line pattern on the substrate; the target data line pattern is arranged in a next sub-pixel adjacent to the sub-pixel in the second direction.

Optionally, the plurality of sub-pixels arranged in the array include a plurality of rows of sub-pixels, each row of the sub-pixels includes the sub-pixels arranged in the second direction, and the initialization signal lines corresponding to the rows of sub-pixels are formed by sequentially coupling the initialization signal line patterns in the same row of sub-pixels;

the first shielding member extends in the first direction and is coupled to at least one of the initialization signal lines.

Optionally, the first shielding member is coupled to two adjacent initialization signal lines.

Optionally, the first shielding member is at a different layer from the initialization signal line pattern, an orthographic projection of the first shielding member on the substrate and an orthographic projection of the initialization signal line pattern on the substrate overlap at a first overlapping region, and the first shielding member is coupled to the initialization signal line pattern through a first via-hole in the first overlapping region.

Optionally, the first shielding member and the data line pattern are made of a same material.

Optionally, the display substrate includes a first interlayer insulating layer, and the first shielding member and the data line pattern are both on a surface of the first interlayer insulating layer away from the substrate.

Optionally, the sub-pixel driving circuit further includes a second transistor coupled to a gate of the driving transistor, the second transistor includes:

a first semiconductor pattern, a second semiconductor pattern, and a third conductor pattern coupled to the first semiconductor pattern and the second semiconductor pattern, the third conductor pattern having a conductivity superior to conductivities of the first semiconductor pattern and the second semiconductor pattern;

a first gate pattern and a second gate pattern, an orthographic projection of the first gate pattern on the substrate at least partially overlapping with an orthographic projection of the first semiconductor pattern on the substrate, an orthographic projection of the second gate pattern on the substrate at least partially overlapping with an orthographic projection of the second semiconductor pattern on the substrate;

where an orthographic projection of the third conductor pattern on the substrate does not overlap with the orthographic projection of the first gate pattern on the substrate and the orthographic projection of the second gate pattern on the substrate;

the orthographic projection of the third conductor pattern on the substrate at least partially overlaps with an orthographic projection of the initialization signal pattern on the substrate.

Optionally, the sub-pixel driving circuit further includes a first extension portion extending from the first semiconductor pattern, an conductivity of the first extension portion is superior to the conductivity of the first semiconductor pattern;

the first extension includes a first portion, a second portion and a third portion, the first portion and the third portion each extends in the first direction, the second portion extends in the second direction, one end of the second portion is coupled to the first portion, and the other end of the second portion is coupled to the third portion;

an end of the third portion away from the second portion is coupled to the first transistor.

Optionally, the first transistor includes:

a fourth semiconductor pattern, a fifth semiconductor pattern, and a sixth conductor pattern coupled to the fourth semiconductor pattern and the fifth semiconductor pattern, the sixth conductor pattern having a conductivity superior to conductivities of the fourth semiconductor pattern and the fifth semiconductor pattern;

a third gate pattern and a fourth gate pattern coupled to the third gate pattern, where the orthographic projection of the third gate pattern on the substrate partially overlaps with the orthographic projection portion of the fourth semiconductor pattern on the substrate, the orthographic projection of the fourth gate pattern on the substrate partially overlaps with the orthographic projection portion of the fifth semiconductor pattern on the substrate;

an orthographic projection of the sixth conductor pattern on the substrate does not overlap with the orthographic projection of the third gate pattern on the substrate and the orthographic projection of the fourth gate pattern on the substrate.

Optionally, an orthographic projection of the first shield member on the substrate at least partially overlaps with an orthographic projection of the sixth conductor pattern on the substrate.

Optionally, the sub-pixel driving circuit further includes:
a second shielding member coupled to the first shielding member, where an orthographic projection of the second shielding member on the substrate at least partially overlaps with the orthographic projection of the sixth conductor pattern on the substrate.

Optionally, the second shielding member and the first shielding member are in different layers, an orthographic projection of the second shielding member on the substrate and the orthographic projection of the first shielding member on the substrate overlaps at a second overlapping region, and the second shielding member and the first shielding member are coupled through a second via-hole in the second overlapping region.

Optionally, the second shielding member and the initialization signal line pattern are made of a same material.

Optionally, the display substrate further includes a second interlayer insulating layer, the second shielding member and the initialization signal pattern are both on a surface of the second interlayer insulating layer away from the substrate.

Optionally, the sub-pixel further includes a power signal line pattern, the power signal line pattern including a portion extending in the first direction, the sub-pixel drive circuit further includes a storage capacitor, a first electrode plate of the storage capacitor is used as a gate of the drive transistor, a second electrode plate of the storage capacitor is coupled to the power signal line pattern, and a second electrode plate of the storage capacitor is on a surface of the second interlayer insulating layer away from the substrate.

Optionally, the sub-pixel further includes a reset signal line pattern extending in a second direction intersecting the first direction, and the sub-pixel driving circuit further includes:
a first conductive connection portion, where an orthographic projection of the first conductive connection portion on the substrate covers an orthographic projection of at least a portion of the sixth conductor pattern on the substrate;
a second transistor, a first electrode of the second transistor is coupled to the initialization signal line pattern through the first conductive connection, a second electrode of the second transistor is coupled to a gate of the driving transistor, and a gate of the second transistor is coupled to the reset signal line pattern.

Optionally, the sub-pixel further includes a gate line pattern, a light emission control signal line pattern, a reset signal line pattern, and a power supply signal line pattern; the gate line pattern, the light emission control signal line pattern, and the reset signal line pattern each extends in the second direction, the power supply signal line pattern includes a portion extending in the first direction;
the sub-pixel driving circuit further includes a second transistor, a fourth transistor, a fifth transistor, a sixth transistor, and a seventh transistor;
a gate of the driving transistor is coupled to a second electrode of the first transistor, a first electrode of the driving transistor is coupled to a second electrode of the fifth transistor, and a second electrode of the driving transistor is coupled to a first electrode of the first transistor;
a gate of the first transistor is coupled to the gate line pattern;
a gate of the second transistor is coupled to the reset signal line pattern, a first electrode of the second transistor is coupled to the initialization signal line pattern, and a second electrode of the second transistor is coupled to a gate of the driving transistor;
a gate of the fourth transistor is coupled to the gate line pattern, a first electrode of the fourth transistor is coupled to the data line pattern, and a second electrode of the fourth transistor is coupled to the first electrode of the driving transistor;
a gate of the fifth transistor is coupled to the light emission control signal line pattern, and a first electrode of the fifth transistor is coupled to the power supply signal line pattern;
a gate of the sixth transistor is coupled to the light-emitting control signal line pattern, a first electrode of the sixth transistor is coupled to a second electrode of the driving transistor, and a second electrode of the sixth transistor is coupled to a light-emitting element in the sub-pixel;
a gate of the seventh transistor is coupled to a reset signal pattern arranged in a next sub-pixel adjacent in the first direction, a first electrode of the seventh transistor is coupled to an initialization signal pattern arranged in the next sub-pixel, and a second electrode of the seventh transistor is coupled to a light-emitting element in the sub-pixel.

Optionally, the sub-pixel further includes a gate line pattern, a light emission control signal line pattern, a reset signal line pattern, and a power supply signal line pattern; the gate line pattern, the light emission control signal line pattern, and the reset signal line pattern each extends in the second direction, the power supply signal line pattern includes a portion extending in the first direction; the orthographic projection of the first shielding member on the substrate partially overlaps with an orthographic projection of the gate pattern on the substrate and an orthographic projection portion of the light emission control signal pattern on the substrate.

A display substrate is provided in a second aspect of the present disclosure, including a substrate and a plurality of sub-pixels arranged in an array on the substrate; the sub-pixels include:
a data line pattern extending in a first direction;
an initialization signal line pattern including a portion extending in a second direction intersecting the first direction, the initialization signal line pattern is configured to transmit an initialization signal having a fixed potential;
a sub-pixel driving circuit including a driving transistor, a first transistor coupled to a gate of the driving transistor and a first shielding member coupled to the initialization signal line pattern, where the first shielding member is configured to form a coupling capacitor with a first electrode of the first transistor, an orthographic projection of the first shielding member on the substrate does not overlap with an orthographic projection of the target data line pattern on the substrate; the target data line pattern is arranged in a next sub-pixel adjacent to the sub-pixel in the second direction.

Optionally, the plurality of sub-pixels arranged in the array include a plurality of rows of sub-pixels, each row of the sub-pixels includes the sub-pixels arranged in the second direction, and the initialization signal lines corresponding to the rows of sub-pixels are formed by sequentially coupling the initialization signal line patterns in the same row of sub-pixels;
the first shielding member extends in the first direction and is coupled to at least one of the initialization signal lines.

Optionally, the first shielding member is coupled to two adjacent initialization signal lines.

Optionally, the first shielding member is at a different layer from the initialization signal line pattern, an orthographic projection of the first shielding member on the substrate and an orthographic projection of the initialization signal line pattern on the substrate overlap at a first overlapping region, and the first shielding member is coupled to the initialization signal line pattern through a first via-hole in the first overlapping region.

Optionally, the first shielding member and the data line pattern are made of a same material.

Optionally, the display substrate includes a first interlayer insulating layer, and the first shielding member and the data line pattern are both on a surface of the first interlayer insulating layer away from the substrate.

Optionally, the sub-pixel driving circuit further includes a second transistor coupled to a gate of the driving transistor, the second transistor includes:
a first semiconductor pattern, a second semiconductor pattern, and a third conductor pattern coupled to the first semiconductor pattern and the second semiconductor pattern, the third conductor pattern having a conductivity superior to conductivities of the first semiconductor pattern and the second semiconductor pattern;
a first gate pattern and a second gate pattern, an orthographic projection of the first gate pattern on the substrate at least partially overlapping with an orthographic projection of the first semiconductor pattern on the substrate, an orthographic projection of the second gate pattern on the substrate at least partially overlapping with an orthographic projection of the second semiconductor pattern on the substrate;
where an orthographic projection of the third conductor pattern on the substrate does not overlap with the orthographic projection of the first gate pattern on the substrate and the orthographic projection of the second gate pattern on the substrate;
the orthographic projection of the third conductor pattern on the substrate at least partially overlaps with an orthographic projection of the initialization signal pattern on the substrate.

Optionally, the sub-pixel driving circuit further includes a first extension portion extending from the first semiconductor pattern, an conductivity of the first extension portion is superior to the conductivity of the first semiconductor pattern;
the first extension includes a first portion, a second portion and a third portion, the first portion and the third portion each extends in the first direction, the second portion extends in the second direction, one end of the second portion is coupled to the first portion, and the other end of the second portion is coupled to the third portion;
an end of the third portion away from the second portion is coupled to the first transistor.

Optionally, the first transistor includes:
a fourth semiconductor pattern, a fifth semiconductor pattern, and a sixth conductor pattern coupled to the fourth semiconductor pattern and the fifth semiconductor pattern, the sixth conductor pattern having a conductivity superior to conductivities of the fourth semiconductor pattern and the fifth semiconductor pattern;
a third gate pattern and a fourth gate pattern coupled to the third gate pattern,
where the orthographic projection of the third gate pattern on the substrate partially overlaps with the orthographic projection portion of the fourth semiconductor pattern on the substrate, the orthographic projection of the fourth gate pattern on the substrate partially overlaps with the orthographic projection portion of the fifth semiconductor pattern on the substrate;
an orthographic projection of the sixth conductor pattern on the substrate does not overlap with the orthographic projection of the third gate pattern on the substrate and the orthographic projection of the fourth gate pattern on the substrate.

Optionally, an orthographic projection of the first shield member on the substrate at least partially overlaps with an orthographic projection of the sixth conductor pattern on the substrate.

Optionally, the sub-pixel driving circuit further includes:
a second shielding member coupled to the first shielding member, where an orthographic projection of the second shielding member on the substrate at least partially overlaps with the orthographic projection of the sixth conductor pattern on the substrate.

Optionally, the second shielding member and the first shielding member are in different layers, an orthographic projection of the second shielding member on the substrate and the orthographic projection of the first shielding member on the substrate overlaps at a second overlapping region, and the second shielding member and the first shielding member are coupled through a second via-hole in the second overlapping region.

Optionally, the second shielding member and the initialization signal line pattern are made of a same material.

Optionally, the display substrate further includes a second interlayer insulating layer, the second shielding member and the initialization signal pattern are both on a surface of the second interlayer insulating layer away from the substrate.

Optionally, the sub-pixel further includes a power signal line pattern, the power signal line pattern including a portion extending in the first direction, the sub-pixel drive circuit further includes a storage capacitor, a first electrode plate of the storage capacitor is used as a gate of the drive transistor, a second electrode plate of the storage capacitor is coupled to the power signal line pattern, and a second electrode plate of the storage capacitor is on a surface of the second interlayer insulating layer away from the substrate.

Optionally, the sub-pixel further includes a reset signal line pattern extending in a second direction intersecting the first direction, and the sub-pixel driving circuit further includes:

a first conductive connection portion, where an orthographic projection of the first conductive connection portion on the substrate covers an orthographic projection of at least a portion of the sixth conductor pattern on the substrate;

a second transistor, a first electrode of the second transistor is coupled to the initialization signal line pattern through the first conductive connection, a second electrode of the second transistor is coupled to a gate of the driving transistor, and a gate of the second transistor is coupled to the reset signal line pattern.

Optionally, the sub-pixel further includes a gate line pattern, a light emission control signal line pattern, a reset signal line pattern, and a power supply signal line pattern; the gate line pattern, the light emission control signal line pattern, and the reset signal line pattern each extends in the second direction, the power supply signal line pattern includes a portion extending in the first direction;

the sub-pixel driving circuit further includes a second transistor, a fourth transistor, a fifth transistor, a sixth transistor, and a seventh transistor;

a gate of the driving transistor is coupled to a second electrode of the first transistor, a first electrode of the driving transistor is coupled to a second electrode of the fifth transistor, and a second electrode of the driving transistor is coupled to a first electrode of the first transistor;

a gate of the first transistor is coupled to the gate line pattern;

a gate of the second transistor is coupled to the reset signal line pattern, a first electrode of the second transistor is coupled to the initialization signal line pattern, and a second electrode of the second transistor is coupled to a gate of the driving transistor;

a gate of the fourth transistor is coupled to the gate line pattern, a first electrode of the fourth transistor is coupled to the data line pattern, and a second electrode of the fourth transistor is coupled to the first electrode of the driving transistor;

a gate of the fifth transistor is coupled to the light emission control signal line pattern, and a first electrode of the fifth transistor is coupled to the power supply signal line pattern;

a gate of the sixth transistor is coupled to the light-emitting control signal line pattern, a first electrode of the sixth transistor is coupled to a second electrode of the driving transistor, and a second electrode of the sixth transistor is coupled to a light-emitting element in the sub-pixel;

a gate of the seventh transistor is coupled to a reset signal pattern arranged in a next sub-pixel adjacent in the first direction, a first electrode of the seventh transistor is coupled to an initialization signal pattern arranged in the next sub-pixel, and a second electrode of the seventh transistor is coupled to a light-emitting element in the sub-pixel.

Optionally, the sub-pixel further includes a gate line pattern, a light emission control signal line pattern, a reset signal line pattern, and a power supply signal line pattern; the gate line pattern, the light emission control signal line pattern, and the reset signal line pattern each extends in the second direction, the power supply signal line pattern includes a portion extending in the first direction; the orthographic projection of the first shielding member on the substrate partially overlaps with an orthographic projection of the gate pattern on the substrate and an orthographic projection portion of the light emission control signal pattern on the substrate.

A display substrate is provided in a third aspect of the present disclosure, including a substrate and a plurality of sub-pixels arrayed on the substrate; The sub-pixels include:

a data line pattern extending in a first direction;

a power signal line pattern including a portion extending in the first direction;

a sub-pixel driving circuit including two switching transistors, a driving transistor, and a storage capacitor; a first plate of the storage capacitor is coupled to a gate of the drive transistor, and a second plate of the storage capacitor is coupled to the power supply signal line graph; a second pole of each of the two switching transistors is coupled to a first pole of the driving transistor, an orthographic projection of at least one of the two switching transistors on the substrate, an orthographic projection of at least one of the two switching transistors at least partially overlapped with the power supply signal line graph on the substrate, and an orthographic projection of at least partially overlapped with the second pole plate of the storage capacitor on the substrate.

Optionally, the second pole of the two switching transistors is integrated with the first pole of the driving transistor, and the integrated structure includes a first conductive portion extending in the first direction, an orthographic projection of the first conductive portion on the substrate, an orthographic projection of the first conductive portion on the substrate with the power supply signal pattern, and an orthographic projection of the second pole plate of the storage capacitor on the substrate having a first overlapping region, the first overlapping region not overlapping the orthographic projection of the data line pattern on the substrate.

Optionally, the orthographic projection of the first pole of the drive transistor on the substrate is located inside the orthographic projection of the second pole plate of the storage capacitor on the substrate.

Optionally, the sub-pixel further includes a gate line pattern and a light emission control signal line pattern each extending in a second direction, the second direction intersecting the first direction;

the sub-pixel driving circuit further includes a first transistor and a sixth transistor; The two switching transistors include a fourth transistor and a fifth transistor;

a gate of the fourth transistor is coupled to the gate line pattern, a first pole of the fourth transistor is coupled to the data line pattern, a second pole of the fourth transistor is coupled to a second pole of the fifth transistor, a gate of the fifth transistor is coupled to the light emission control signal line pattern, and a first pole of the fifth transistor is coupled to the power supply signal line pattern;

the gate of the first transistor is coupled to the gate line pattern, the second electrode of the first transistor is coupled to the gate of the driving transistor, the first electrode of the first transistor, the first electrode of the sixth transistor and the second electrode of the driving transistor are formed in an integrated structure including a second conductive portion extending in the first direction, the gate of the sixth transistor is coupled to the light-emitting control signal line pattern, and the second electrode of the sixth transistor is coupled to a light-emitting element in the sub-pixel;

an orthographic projection of a channel region of the driving transistor on the substrate between an orthographic projection of the first conductive portion on the substrate and an orthographic projection of the second conductive portion on the substrate; and in the second direction, a minimum distance between an orthographic projection of the channel region of the driving transistor on the substrate and an orthographic projection of the first conductive portion on the substrate is smaller than a minimum distance between an orthographic projection of the channel region on the substrate and an orthographic projection of the second conductive portion on the substrate.

Optionally, the sub-pixel further includes a gate line pattern and a light emission control signal line pattern each extending in a second direction, the second direction intersecting the first direction;

the sub-pixel driving circuit further includes a first transistor and a sixth transistor; the two switching transistors include a fourth transistor and a fifth transistor;

a gate of the fourth transistor is coupled to the gate line pattern, a first pole of the fourth transistor is coupled to the data line pattern, a second pole of the fourth transistor is coupled to a second pole of the fifth transistor, a gate of the fifth transistor is coupled to the light emission control signal line pattern, and a first pole of the fifth transistor is coupled to the power supply signal line pattern;

the gate of the first transistor is coupled to the gate line pattern, the second electrode of the first transistor is coupled to the gate of the driving transistor, the first electrode of the first transistor, the first electrode of the sixth transistor and the second electrode of the driving transistor are formed in an integrated structure including a second conductive portion extending in the first direction, the gate of the sixth transistor is coupled to the light-emitting control signal line pattern, and the second electrode of the sixth transistor is coupled to a light-emitting element in the sub-pixel;

an orthographic projection of a channel region of the driving transistor on the substrate between an orthographic projection of the first conductive portion on the substrate and an orthographic projection of the second conductive portion on the substrate; each of the first and second poles of the driving transistor includes a first portion extending in the second direction, and a length of the first portion of the first pole in the second direction is different from a length of the first portion of the second pole extending in the second direction.

A display device is provided in a fourth aspect of the present disclosure, including the di splay substrate hereinabove.

A method of forming a display substrates is provided in a fifth aspect of the present disclosure, including:

forming a plurality of sub-pixels arranged in an array on a substrate, where the sub-pixels include:

a data line pattern extending in a first direction;

an initialization signal line pattern including a portion extending in a second direction intersecting the first direction, where the initialization signal line pattern is configured to transmit an initialization signal having a fixed potential;

a sub-pixel driving circuit including a driving transistor, a first transistor coupled to a gate of the driving transistor, and a first shielding member coupled to the initialization signal line pattern, where an orthographic projection of the first shielding member on the substrate is between an orthographic projection of the first transistor on the substrate and an orthographic projection of the target data line pattern on the substrate; the target data line pattern is arranged in a next sub-pixel adjacent to the sub-pixel in the second direction.

BRIEF DESCRIPTION OF THE DRAWINGS

The drawing drawings, which are illustrated herein to provide a further understanding of the disclosure and constitute a part of this disclosure, illustrate exemplary embodiments of the disclosure and the description thereof to explain the disclosure, and are not to be construed as unduly limiting the disclosure. In the drawings.

DETAILED DESCRIPTION

Figure 1:
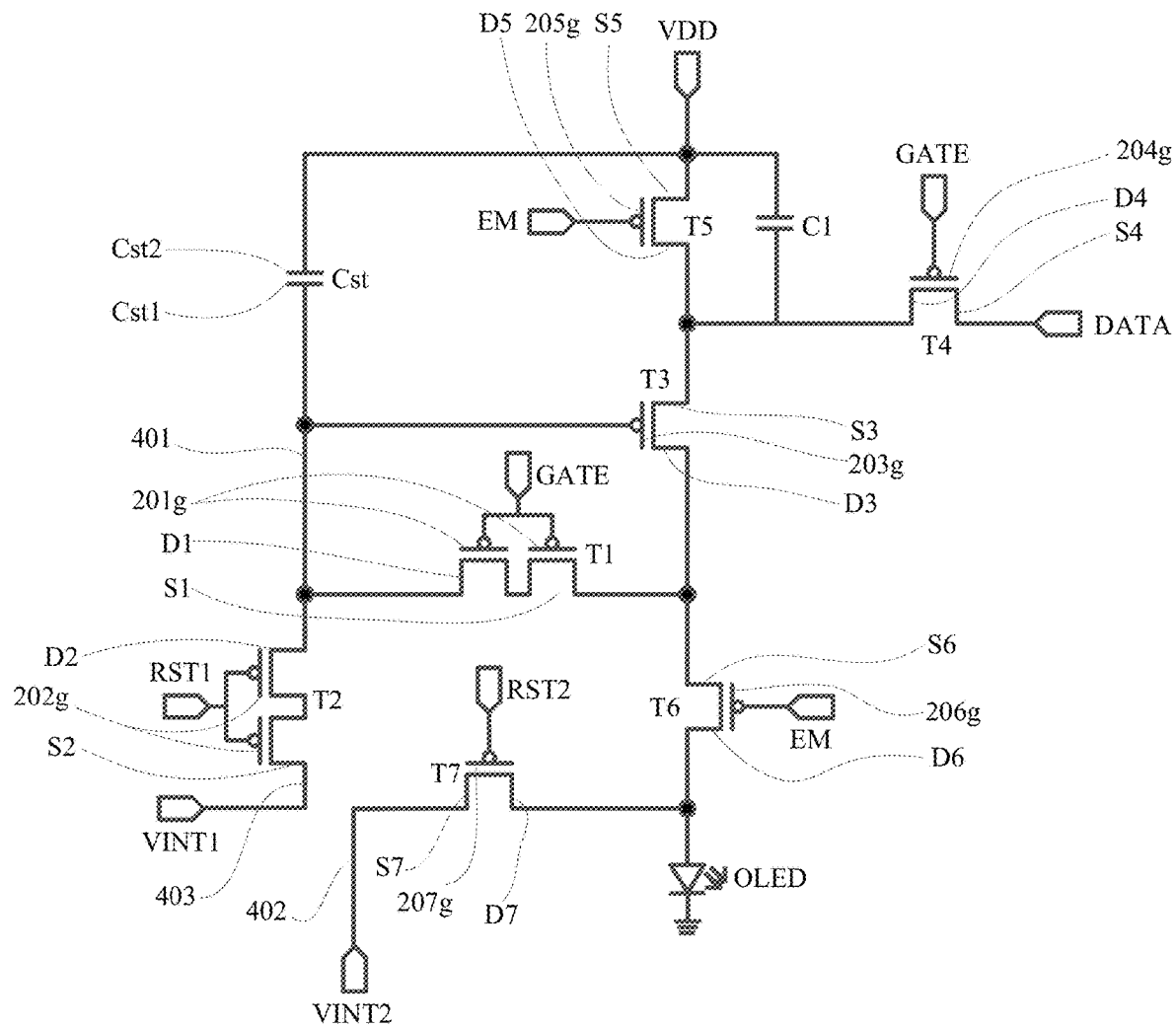
FIG. 1 is a schematic structural diagram of a sub-pixel driving circuit according to an embodiment of the present disclosure.

In order to further explain the display substrate, the forming method, and the display device in the embodiments of the present disclosure, the following description will be made in detail with reference to the drawing drawings of the description.

The causes of vertical crosstalk in the OLED display products generally include vertical crosstalk caused by a voltage drop on the power supply signal line and vertical crosstalk caused by a varying data signal loaded on the data line; The vertical crosstalk caused by the data line is the main factor causing the vertical crosstalk phenomenon of the OLED display product. Therefore, how to solve the vertical crosstalk caused by the data line becomes an urgent problem to be solved.

Based on the above problems, the inventors of the present disclosure have found that a shielding pattern may be provided between a data line and a portion that is cross-disturbed by the data line, and the coupling effect between the data line and the portion is reduced by the shielding pattern, thereby reducing the problem of vertical cross-talk caused by the data line, thereby achieving a better display effect of a display product.

It should be noted that one or more embodiments described herein correspond to a display substrate having 7T1C (i.e., 7 thin film transistors and 1 capacitor) sub-pixel drive circuitry. In another embodiment, the display substrate may include different sub-pixel drive circuits, e.g., greater than or less than 7 thin film transistors, and include one or more capacitors.

As shown in FIG. 1, the display substrate in the present disclosure includes a plurality of sub-pixels, each of which may include a gate line pattern GATE, a first reset signal line pattern RST1, a first initialization signal line pattern VINT1, a data line pattern DATA, a light emission control signal pattern EM, a power supply signal pattern VDD, a second reset signal pattern RST2, and a second initialization signal pattern VINT2.

Each of the sub-pixel driving circuits may include a first transistor T1, a second transistor T2, a third transistor T3, a fourth transistor T4, a fifth transistor T5, a sixth transistor T6, a seventh transistor T7, and a storage capacitor Cst. Also included in FIG. 1 is a first capacitor C1, which is a parasitic capacitor.

As an example, each transistor included in the sub-pixel driving circuit includes a P-type transistor, where the first transistor T1 is a double-gate structure, the gate 201g of the first transistor T1 is coupled to the gate line pattern GATE, the source S1 of the first transistor T1 is coupled to the drain D3 of the third transistor T3, and the drain D1 of the first transistor T1 is coupled to the gate 203g of the third transistor T3.

The second transistor T2 has a double-gate structure, the gate 202g of the second transistor T2 is coupled to the first reset signal pattern RST1, the source S2 of the second transistor T2 is coupled to the first initialization signal pattern VINT1, and the drain D2 of the second transistor T2 is coupled to the gate 203g of the third transistor T3.

The gate 204g of the fourth transistor T4 is coupled to the gate line pattern GATE, the source S4 of the fourth transistor T4 is coupled to the data line pattern DATA, and the drain D4 of the fourth transistor T4 is coupled to the source S3 of the third transistor T3.

The gate 205g of the fifth transistor T5 is coupled to the light emission control signal pattern EM, the source S5 of the fifth transistor T5 is coupled to the power supply signal pattern VDD, and the drain D5 of the fifth transistor T5 is coupled to the source S3 of the third transistor T3.

The gate 206g of the sixth transistor T6 is coupled to the light-emitting control signal pattern EM, the source S6 of the sixth transistor T6 is coupled to the drain D3 of the third transistor T3, and the drain D6 of the sixth transistor T6 is coupled to the anode of the light-emitting element OLED.

The gate 207g of the seventh transistor T7 is coupled to the second reset signal line pattern RST2, the drain D7 of the seventh transistor T7 is coupled to the anode of the light emitting element OLED, and the source S7 of the seventh transistor T7 is coupled to the second initialization signal line pattern VINT2.

The first electrode plate Cst1 of the storage capacitor Cst is coupled to the gate 203g of the third transistor T3, and the second electrode plate Cst2 of the storage capacitor Cst is coupled to the power supply signal line pattern VDD.

Figure 2:
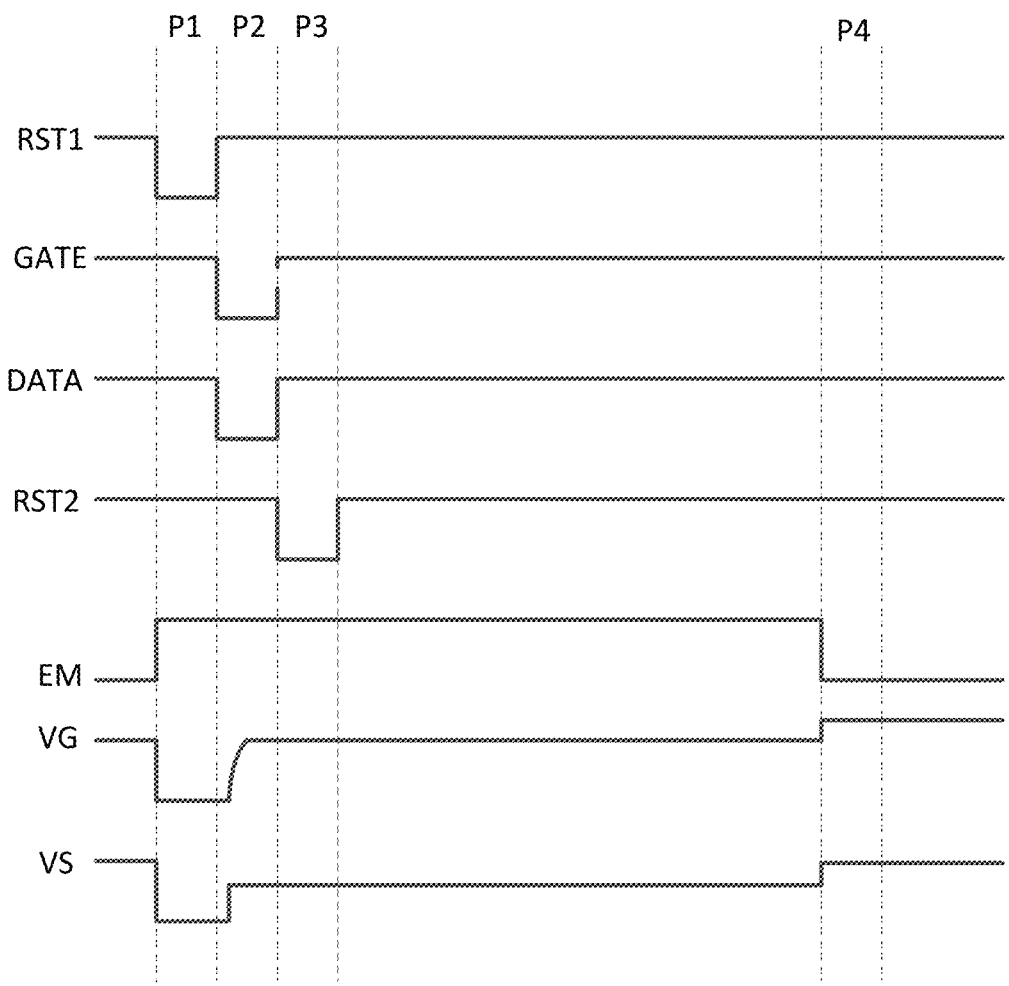
FIG. 2 is a timing chart corresponding to a sub-pixel driving circuit according to an embodiment of the present disclosure.

As shown in FIG. 2, each duty cycle of the sub-pixel driving circuit of the above-described configuration includes a first reset period P1, a write compensation period P2, a second reset period P3, and a light emission period P4 in operation.

In the first reset period P1, the first reset signal input from the first reset signal line pattern RST1 is at an active level, the second transistor T2 is turned on, and the initialization signal transmitted from the first initialization signal line pattern VINT1 is input to the gate 203g of the third transistor T3, so that the gate-source voltage Vgs of the previous frame held on the third transistor T3 is reset, thereby realizing reset of the gate 203g of the third transistor T3.

In the write compensation period P2, the first reset signal is at an inactive level, the second transistor T2 is turned off, the gate scan signal inputted from the gate line pattern GATE is at an active level, the first transistor T1 and the fourth transistor T4 are controlled to be turned on, the data line pattern DATA is written into the data signal, and is transmitted to the source S3 of the third transistor T3 through the fourth transistor T4, and at the same time, the first transistor T1 and the fourth transistor T4 are turned on, so that the third transistor T3 is formed into a diode structure, so that the threshold voltage compensation for the third transistor T3 is realized by the cooperation of the first transistor T1, the third transistor T3 and the fourth transistor T4, and when the compensation time is long enough, the gate 203g potential of the third transistor T3 can be controlled to finally reach Vdata+Vth, where Vdata represents the data signal voltage value and Vth represents the threshold voltage of the third transistor T3.

In the second reset period P3, the gate scan signal is at an inactive level, the first transistor T1 and the fourth transistor T4 are both turned off, the second reset signal input from the second reset signal line RST2 is at an active level, the seventh transistor T7 is controlled to be turned on, the initialization signal transmitted from the second initialization signal line pattern VINT2 is input to the anode of the light-emitting element OLED, and the light-emitting element OLED is controlled not to emit light.

In the light-emitting period P4, the light-emitting control signal written in the light-emitting control signal pattern EM is at an active level, and the fifth transistor T5 and the sixth transistor T6 are controlled to be turned on so that the power supply signal transmitted by the power supply signal pattern VDD is input to the source S3 of the third transistor T3, while the third transistor T3 is turned on because the gate 203g of the third transistor T3 is kept at Vdata+Vth, and the gate-source voltage corresponding to the third transistor T3 is Vdata+Vth-VDD, where VDD is a voltage value corresponding to the power supply signal, and the corresponding light-emitting element OLED is driven to emit light based on the leakage current generated by the gate-source voltage to the anode of the corresponding light-emitting element OLED.

Figure 3:
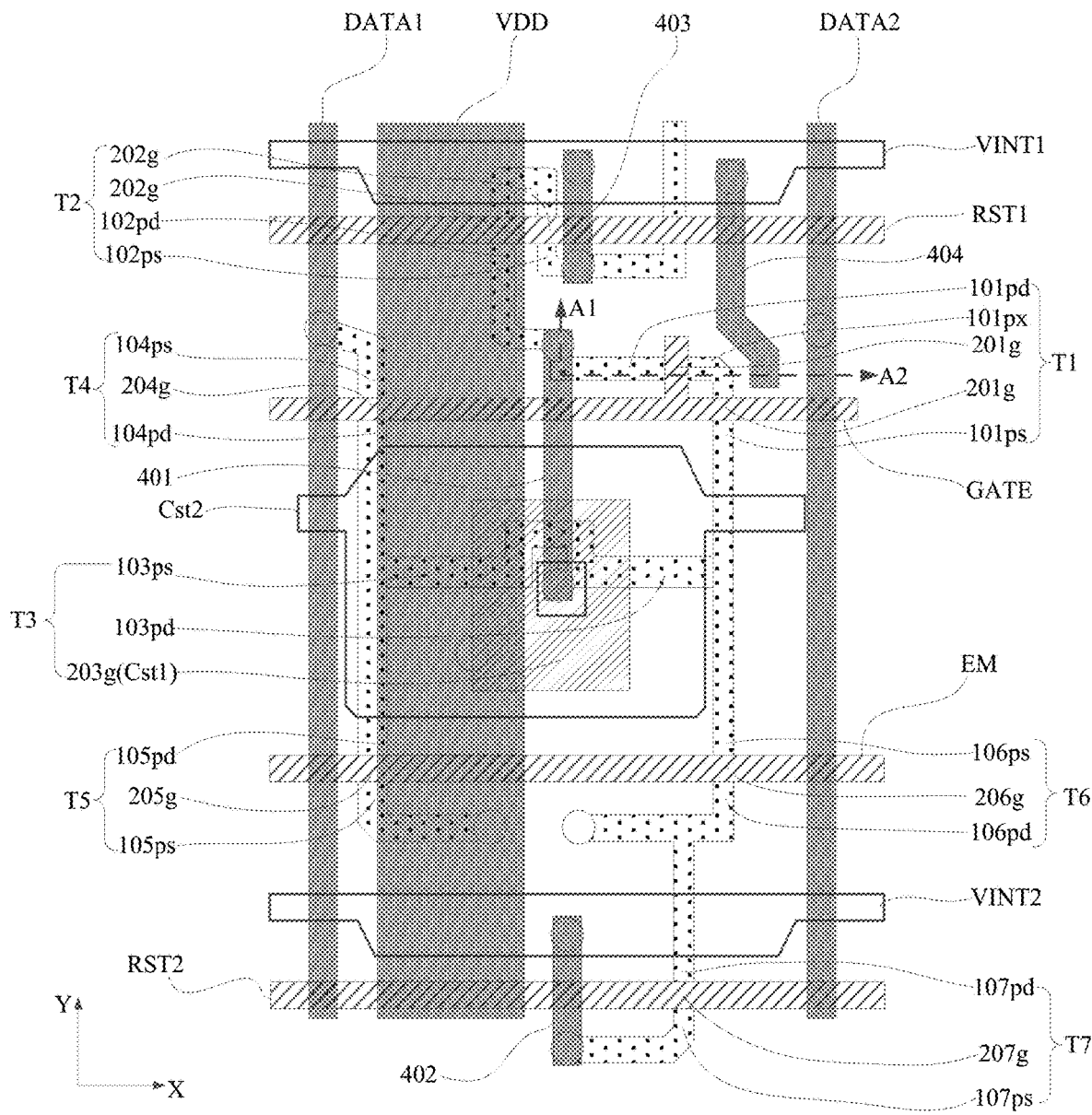
FIG. 3 is a schematic diagram of a first layout of a sub-pixel driving circuit in a display substrate according to an embodiment of the present disclosure.

As shown in FIG. 3, when the sub-pixel driving circuit is manufactured, the layout of each film layer corresponding to the sub-pixel driving circuit is as follows:

An active film layer, a gate insulating layer, a first gate metal layer, a first interlayer insulating layer, a second gate metal layer, a second interlayer insulating layer, a first source drain metal layer, and a third interlayer insulating layer are sequentially stacked in a direction away from the substrate.

Figure 4:
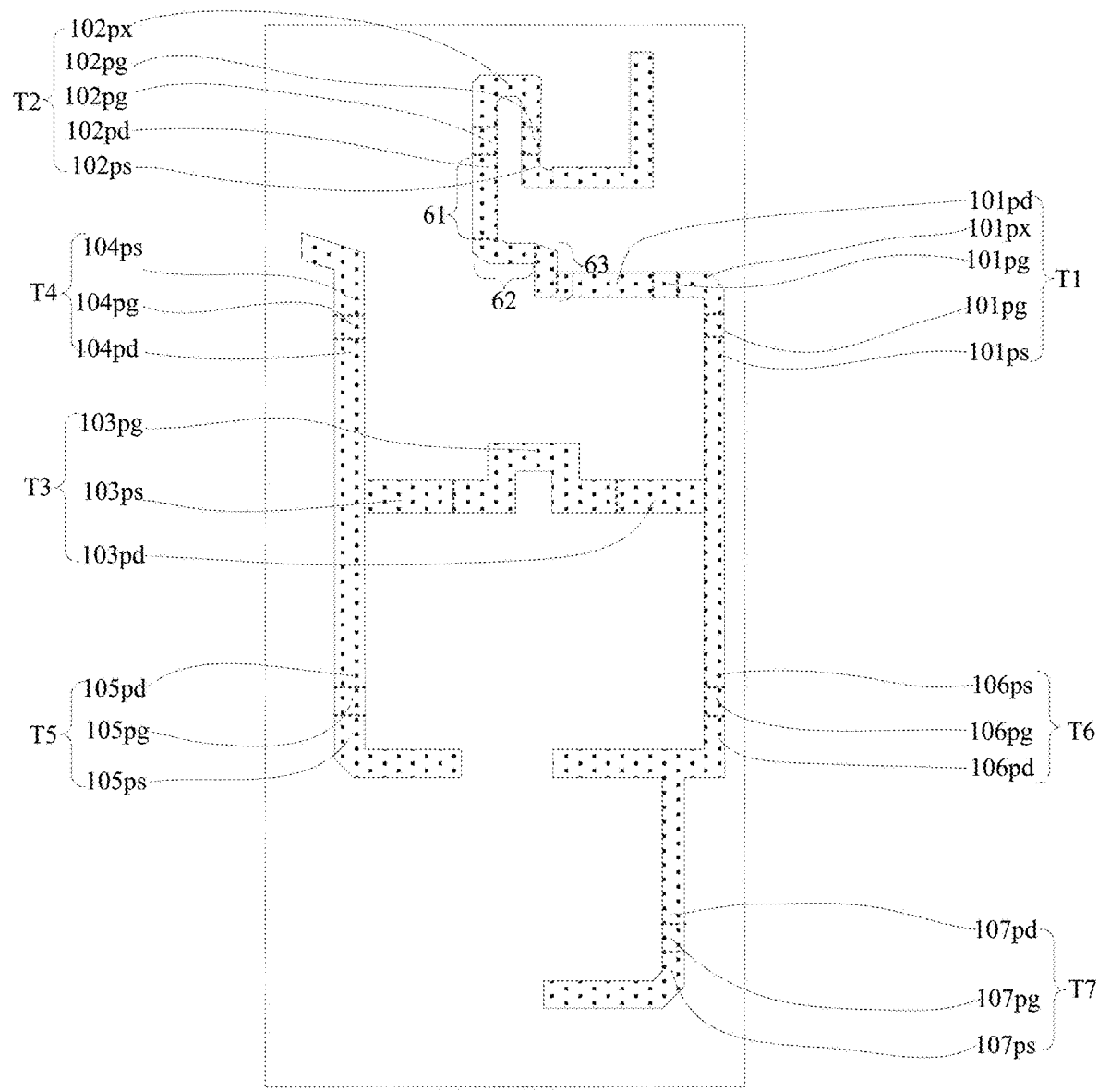
FIG. 4 is a schematic diagram of a first layout of an active film layer according to an embodiment of the present disclosure.

As shown in FIG. 4, the active film layer is used to form a channel region (e.g., 101pg~107pg), a source formation region (e.g., 101ps~107ps), and a drain formation region (e.g., 101pd~107pd) of each transistor in the sub-pixel driving circuit, and the active film layer corresponding to the source formation region and the drain formation region is superior to the active film layer corresponding to the channel region due to doping. The active film layer may be made of amorphous silicon, polysilicon, oxide semiconductor material, or the like. It should be noted that the source and drain regions may be regions doped with n-type impurities or p-type impurities.

It is noted that, the active film layer corresponding to the source-forming region and the drain-forming region may be directly used as the corresponding source or drain, or the source in contact with the source-forming region may be made of a metal material, and the drain in contact with the drain-forming region may be made of a metal material.

Figure 5:
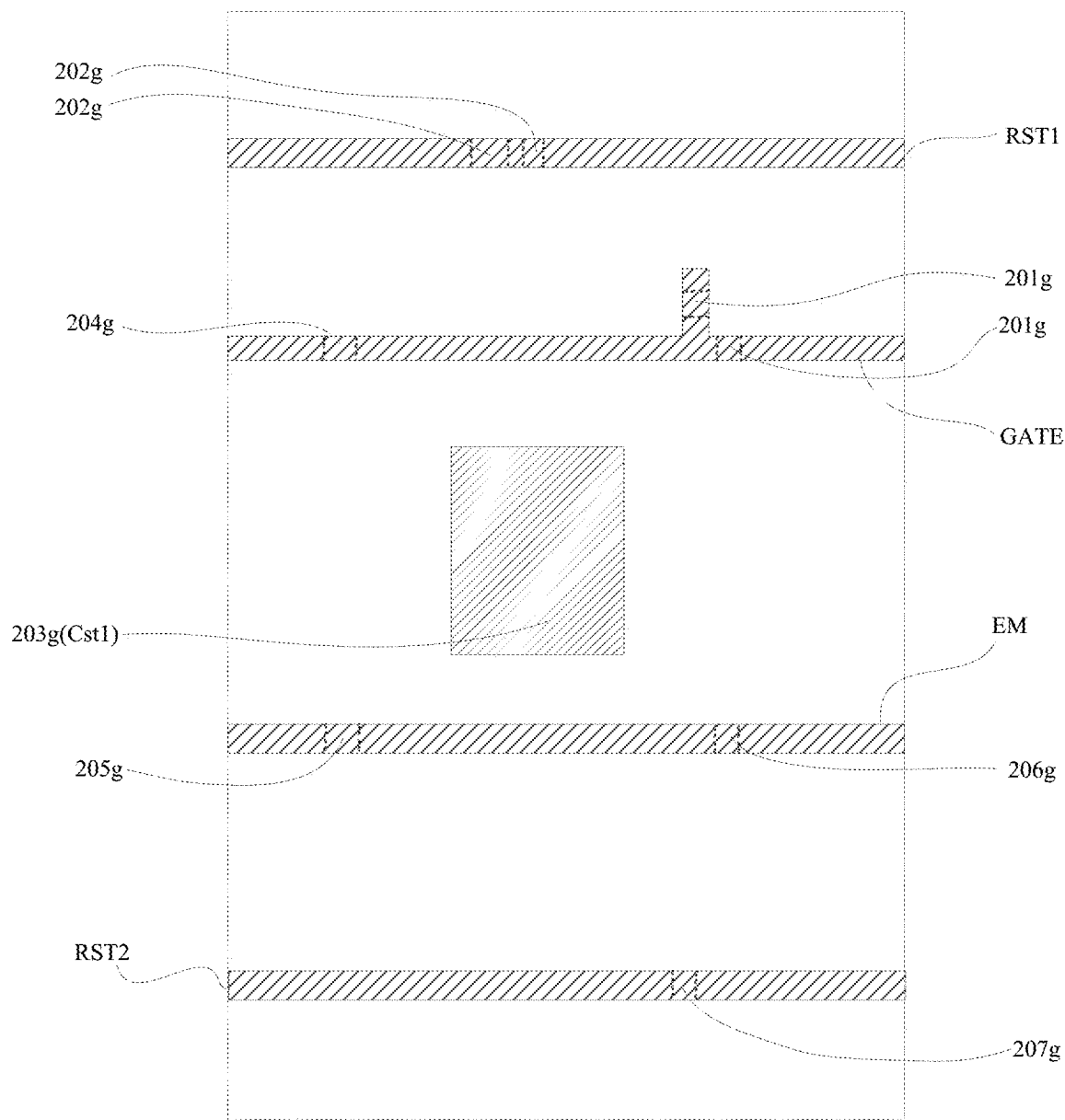
FIG. 5 is a schematic diagram of a first layout of a first gate metal layer according to an embodiment of the present disclosure.

As shown in FIG. 5, the first gate metal layer is used to form a gate electrode (e.g., 201g~207g) of each transistor in the sub-pixel driving circuit, and a structure such as a gate line pattern GATE, a light emission control signal pattern EM, a first reset signal pattern RST1, and a second reset signal pattern RST2 included in the display substrate. The gate electrode 203g of the third transistor T3 in each sub-pixel driving circuit is multiplexed as the first electrode plate Cst1 of the storage capacitor Cst in the sub-pixel driving circuit.

Figure 6:
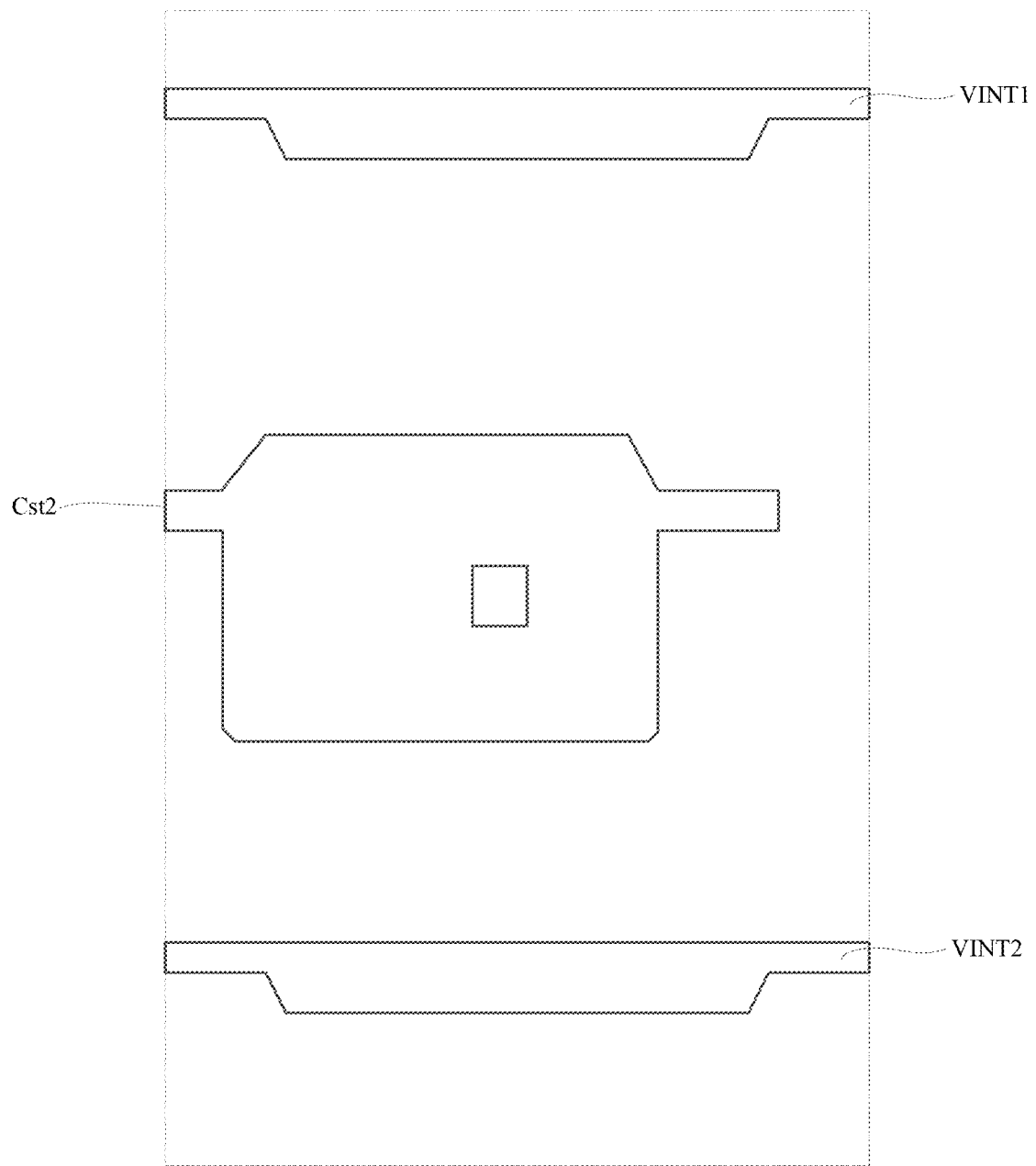
FIG. 6 is a schematic diagram of a first layout of a second gate metal layer according to an embodiment of the present disclosure.

As shown in FIG. 6, the second gate metal layer is used to form the second electrode plate Cst2 of the storage capacitor Cst, and the display substrate includes a first initialization signal line pattern VINT1 and a second initialization signal line pattern VINT2.

Figure 7:
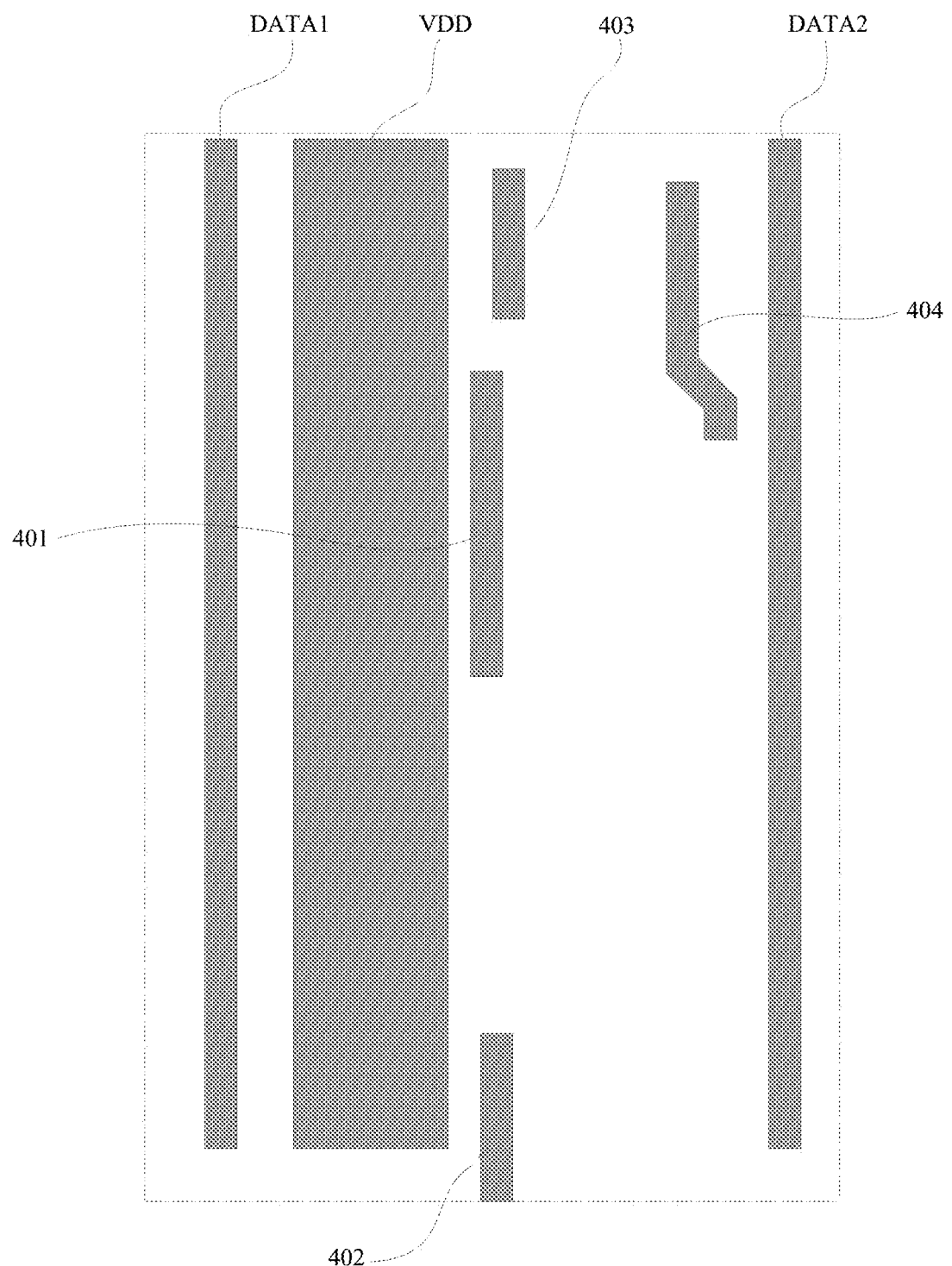
FIG. 7 is a schematic diagram of a first layout of a source-drain metal layer according to an embodiment of the present disclosure.

As shown in FIGS. 1, 3, and 7, the first source-drain metal layer is used to form a source (e.g., S1~S7) and a drain (e.g., D1~D7) of each transistor in the sub-pixel driving circuit, and a data line pattern (e.g., DATA1 and DATA2) and a power supply signal line pattern VDD included in the display substrate.

Figure 10:
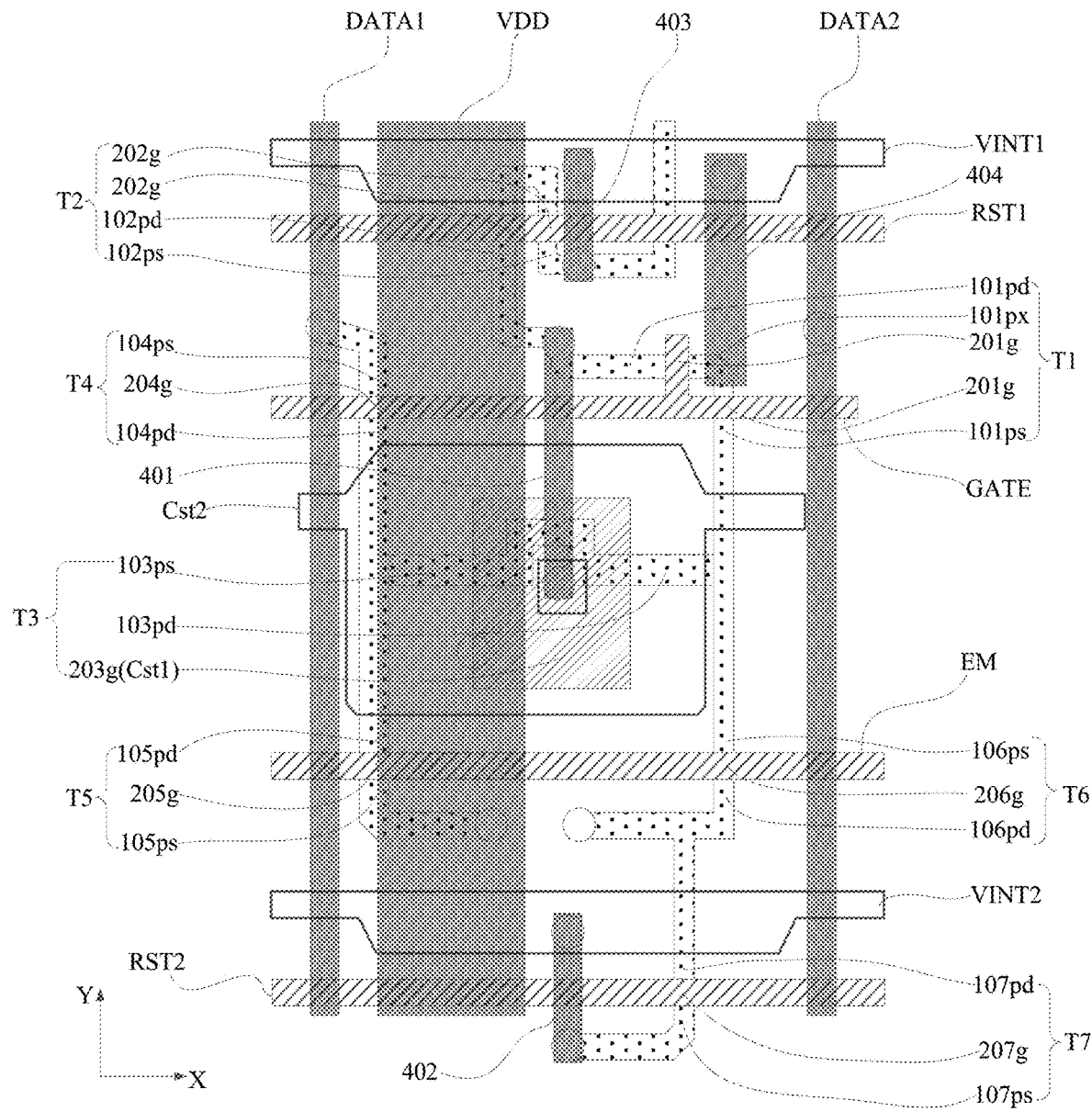
FIG. 10 is a third layout diagram of a sub-pixel driving circuit in a display substrate according to an embodiment of the present disclosure.

In more detail, referring to FIGS. 3 and 10, the gate 201g of the first transistor T1 covers the first channel region 101pg, the source S1 of the first transistor T1 is located in the first source forming region 101ps, and the drain D1 of the first transistor T1 is located in the first drain forming region 101pd.

The gate 202g of the second transistor T2 covers the second channel region 102pg, the source S2 of the second transistor T2 is located in the second source formation region 102ps, and the drain D2 of the second transistor T2 is located in the second drain formation region 102pd.

The gate 203g of the third transistor T3 covers the third channel region 103pg, the source S3 of the third transistor T3 is located in the third source forming region 103ps, and the drain D3 of the third transistor T3 is located in the third drain forming region 103pd.

The gate 204g of the fourth transistor T4 covers the fourth channel region 104pg, the source S4 of the fourth transistor T4 is located in the fourth source formation region 104ps, and the drain D4 of the fourth transistor T4 is located in the fourth drain formation region 104pd.

The gate 205g of the fifth transistor T5 covers the fifth channel region 105pg, the source S5 of the fifth transistor T5 is located in the fifth source forming region 105ps, and the drain D5 of the fifth transistor T5 is located in the fifth drain forming region 105pd.

The gate 206g of the sixth transistor T6 covers the sixth channel region 106pg, the source S6 of the sixth transistor T6 is located in the sixth source forming region 106ps, and the drain D6 of the sixth transistor T6 is located in the sixth drain forming region 106pd.

The gate 207g of the seventh transistor T7 covers the seventh channel region 107pg, the source S7 of the seventh transistor T7 is located in the seventh source formation region 107ps, and the drain D7 of the seventh transistor T7 is located in the seventh drain formation region 107pd.

The gate 203g of the third transistor T3 is multiplexed as the first electrode plate Cst1 of the storage capacitor Cst, and the second electrode plate Cst2 of the storage capacitor Cst is coupled to the power supply signal line pattern VDD.

It should be noted that the connection lines 401, 402, and 403 in FIG. 1 are each formed of a first source and drain metal layer, and a specific layout is shown in FIGS. 3 and 7. The first capacitor C1 in FIG. 1 is a parasitic capacitor. As shown in FIG. 3, there is an overlapping region in which the orthographic projection of the second electrode plate Cst2 of the storage capacitor Cst on the substrate corresponds to the orthographic projection of the downward extension of the fourth drain forming region 104pd corresponding to the fourth transistor T4 on the substrate, that is, the overlapping region is formed as the first capacitor C1.

In addition, in the display substrate provided by the present disclosure, a plurality of sub-pixels may be arranged in an array, the plurality of sub-pixels may be divided into a plurality of rows of sub-pixels and a plurality of columns of sub-pixels, each row of the sub-pixels includes a plurality of sub-pixels arranged in a second direction, each column of sub-pixels includes a plurality of sub-pixels arranged in a first direction, and the first direction intersects the second direction; The gate line pattern GATE, the first reset signal pattern RST1, the first initialization signal pattern VINT1, the light emission control signal pattern EM, the second reset signal line pattern RST2, and the second initialization signal pattern VINT2 included in the sub-pixel may each extend in the second direction; The data line pattern DATA and the power signal pattern VDD included in the sub-pixels extend in the first direction.

The gate line pattern GATE located in the same row may be formed as a gate line in an integrated structure, the first reset signal line pattern RST1 located in the same row may be formed as a first reset signal line in an integrated structure, the first initialization signal line pattern VINT1 located in the same row may be formed as a first initialization signal line in an integrated structure, the light-emitting control signal line pattern EM located in the same row may be formed as a light-emitting control signal line in an integrated structure, the second reset signal line pattern RST2 located in the same row may be formed as a second reset signal line in an integrated structure, and the second initialization signal line pattern VINT2 located in the same row may be formed as a second initialization signal line in an integrated structure. The data line pattern DATA located in the same column may be formed as one data line in an integrated structure, and the power signal pattern VDD located in the same column may be formed as one power signal line in an integrated structure.

In order to simplify the layout space of the sub-pixels, a second reset signal line corresponding to one row of sub-pixels may be multiplexed as a first reset signal line corresponding to an adjacent next row of sub-pixels; Similarly, a second initialization signal line corresponding to one row of sub-pixels may be multiplexed as a first initialization signal line corresponding to an adjacent next row of sub-pixels.

As shown in FIG. 3, in some embodiments, the gate 204g of the fourth transistor T4, the gate 201g of the first transistor T1, and the gate 202g of the second transistor T2 are all on the first side of the gate of the driving transistor (i.e., the gate 203g of the third transistor T3), and the gate of the seventh transistor T7, the gate 206g of the sixth transistor T6, and the gate of the fifth transistor T5 are all on the second side of the gate of the driving transistor, taking the sub-pixel driving circuit included in one sub-pixel as an example. For example, the first side and the second side of the gate of the driving transistor are opposite sides of the gate of the driving transistor in the first direction. Further, the first side of the gate of the driving transistor may be the upper side of the gate of the driving transistor, and the second side of the gate of the driving transistor may be the lower side of the gate of the driving transistor T1. The lower side, for example, one side of the display substrate for binding the IC is the lower side of the display substrate, and the lower side of the gate of the driving transistor is the side of the gate of the driving transistor closer to the IC. The upper side is the opposite side of the lower side, for example, the side of the gate of the driving transistor further away from the IC.

In some embodiments, as shown in FIG. 3, in the second direction (e.g., the X direction), the gate 204g of the fourth transistor T4 and the gate 205g of the fifth transistor T5 are both on the third side of the gate of the driving transistor, and the gate 201g of the first transistor T1 and the gate 206g of the sixth transistor T6 are both on the fourth side of the gate of the driving transistor T1. For example, the third side and the fourth side of the gate of the driving transistor are opposite sides of the gate of the driving transistor in the second direction X; Further, the third side of the gate of the driving transistor may be the left side of the gate of the driving transistor, and the fourth side of the gate of the driving transistor may be the right side of the gate of the driving transistor. The left side and the right side, for example, in the same sub-pixel, the first data line pattern DATA1 is on the left side of the power supply signal line pattern VDD, which is on the right side of the first data line pattern DATA1.

Figure 8:
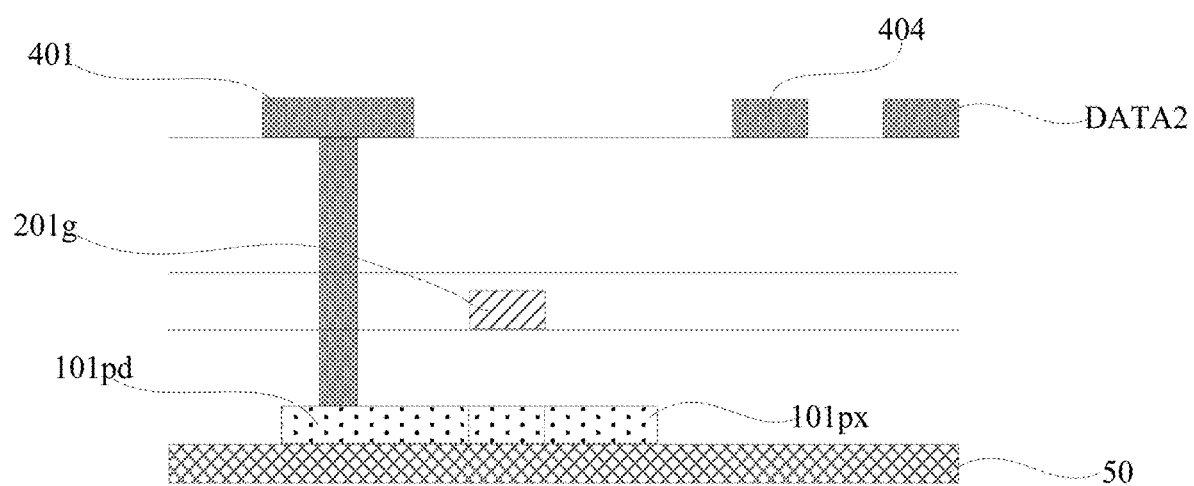
FIG. 8 is a schematic cross-sectional view in the A1A2 direction of FIG. 3.

Referring to FIGS. 3 and 8, an embodiment of the present disclosure provides a display substrate including a substrate 50 and a plurality of sub-pixels arranged in an array on the substrate 50; The sub-pixels include:

A data line pattern (DATA1 in FIG. 3) extending in a first direction;

An initialization signal line pattern (VINT1 in FIG. 3) including a portion extending in a second direction intersecting the first direction, the initialization signal line pattern configured to transmit an initialization signal having a fixed potential;

A sub-pixel driving circuit including a driving transistor (T3 in FIG. 3), a first transistor T1 coupled to a gate of the driving transistor, and a first shielding member 404 coupled to the initialization signal pattern, the first shielding member 404 having an orthographic projection on the substrate 50 between the orthographic projection of the first transistor T1 on the substrate 50 and an orthographic projection of a target data line pattern (DATA2 in FIG. 3) on the substrate 50; The target data line pattern is included in a next sub-pixel adjacent to the sub-pixel in the second direction.

Specifically, the display substrate generally includes a plurality of sub-pixels arranged in an array, each sub-pixel including a data line pattern (DATA1 in FIG. 3) extending in a first direction, and an initialization signal line pattern (VINT1 in FIG. 3) extending at least partially in a second direction; The data line pattern is used configured to transmit a data signal, and the initialization signal pattern is used configured to transmit an initialization signal having a fixed potential; For example, the first direction includes a Y direction and the second direction includes an X direction.

The target data line pattern is a data line pattern included in the next sub-pixel adjacent to the current sub-pixel in the second direction.

Each sub-pixel further includes a sub-pixel driving circuit, and a light-emitting element corresponding to the sub-pixel driving circuit one by one, the light-emitting element including an anode, an organic light-emitting material layer, and a cathode arranged in a stacked manner, where the anode of the light-emitting element is coupled to the corresponding sub-pixel driving circuit, and the light-emitting element emits light under the driving of the driving signal provided by the sub-pixel driving circuit.

In more detail, as shown in FIGS. 1, 3, and 4, for example, the sub-pixel driving circuit includes the above-described 7T1C, the gate 203g of the third transistor T3 (i.e., the driving transistor) is coupled to the drain D1 of the first transistor T1 through the connection line 401, and the drain D3 of the third transistor T3 is coupled to the source S1 of the first transistor T1. In the X direction, the minimum distance between the orthographic projection of the first channel region 101pg of the first transistor T1 on the substrate 50 and the orthographic projection of the target data line pattern (DATA2 in FIG. 3) on the substrate 50 is smaller than the minimum distance between the orthographic projection of the third channel region 103pg of the third transistor T3 on the substrate 50 and the orthographic projection of the target data line pattern on the substrate 50. It is noted that, the minimum distance between the orthographic projection of the channel region (e.g., the first channel region 101*pg* and the third channel region 103*pg*) on the substrate 50 and the orthographic projection of the target data line pattern (DATA2 in FIG. 3) on the substrate 50 refers to the minimum distance between the channel region and the orthographic projection of the target data line pattern (DATA2 in FIG. 3) on the substrate 50 closest to the boundary of the target data line pattern in the orthographic projection on the substrate 50.

In the sub-pixel driving circuit of the above-described configuration, when the data signal transmitted by the target data line pattern changes, the performance of the first transistor T1 is affected, because the first transistor T1 is coupled to the third transistor T3 through the connection line 401, and the performance of the third transistor T3 is affected.

The disclosed embodiment provides a first shielding member 404 coupled to the initialization signal line pattern (VINT1 in FIG. 3) in the sub-pixel driving circuit so that the first shielding member 404 has the same fixed potential as the initialization signal, and provides an orthographic projection of the first shielding member 404 on the substrate 50 between the orthographic projection of the first transistor T1 on the substrate 50 and the orthographic projection of the target data line pattern (DATA2 in FIG. 3) on the substrate 50, so that the first shielding member 404 can reduce the influence of the signal variation transmitted on the target data line pattern on the performance of the first transistor T1, thereby reducing the influence of the coupling between the gate (i.e., 203*g*) of the driving transistor and the target data line pattern, and reducing the problem of vertical crosstalk, so that the display substrate can obtain a better display effect when used for display.

In addition, by coupling the first shielding member 404 with the initialization signal pattern, in addition to the first shielding member 404 having a fixed potential, the voltage of the initialization signal pattern is enhanced, so that the voltage of the initialization signal transmitted on the initialization signal line pattern is more stable, thereby facilitating the operation performance of the sub-pixel driving circuit.

It is noted that, in addition to coupling the first shielding member 404 to the initialization signal pattern, the first shielding member 404 may be coupled to the power supply signal pattern VDD included in the sub-pixel such that the first shielding member 404 has the same fixed potential as the power supply signal transmitted by the power supply signal pattern VDD.

When the first shielding member 404 is coupled to the power supply signal line pattern VDD, it is possible to ensure that the first shielding member 404 has a fixed potential, but the parasitic capacitance generated by the power supply signal line pattern VDD is increased, so that the RC load of the power supply signal line pattern VDD is larger, and vertical crosstalk is not weakened.

As shown in FIG. 3, in some embodiments, the gate 201*g* of the first transistor T1 and the gate line pattern GATE are integrated structures, and the gate 201*g* of the first transistor T1 is a portion of the integrated structure that can form an overlapping region with the active film layer in a direction perpendicular to the substrate.

As shown in FIG. 3, in some embodiments, the plurality of sub-pixels include a plurality of rows of sub-pixels, each row of the sub-pixels including a plurality of the sub-pixels arranged in the second direction, and the initialization signal lines in the same row of sub-pixels are sequentially coupled to form initialization signal lines corresponding to the row of sub-pixels; The first shielding member 404 extends in the first direction and is coupled to at least one of the initialization signal lines.

Specifically, the plurality of sub-pixels may be divided into a plurality of rows of sub-pixels and a plurality of columns of sub-pixels, each row of the sub-pixels including a plurality of sub-pixels arranged in a second direction, each column of sub-pixels including a plurality of sub-pixels arranged in a first direction, the first direction intersecting the second direction; The initialization signal lines located in the same row of sub-pixels are sequentially coupled to form an initialization signal line corresponding to the row of sub-pixels.

The first shielding member 404 is arranged to extend in the first direction, and is coupled to at least one of the initialization signal lines, so that the first shielding member 404 can reduce the influence of the signal change transmitted on the target data line pattern on the performance of the first transistor T1, thereby reducing the influence of the coupling between the gate of the driving transistor (i.e., 203*g*) and the target data line pattern, and reducing the problem of vertical crosstalk, so that the display substrate can obtain a better display effect when used for display; Furthermore, it is also achieved that the voltage of the initialization signal line is enhanced, so that the voltage of the initialization signal transmitted on the initialization signal line is more stable, thereby facilitating the operation performance of the sub-pixel driving circuit.

Figure 9:
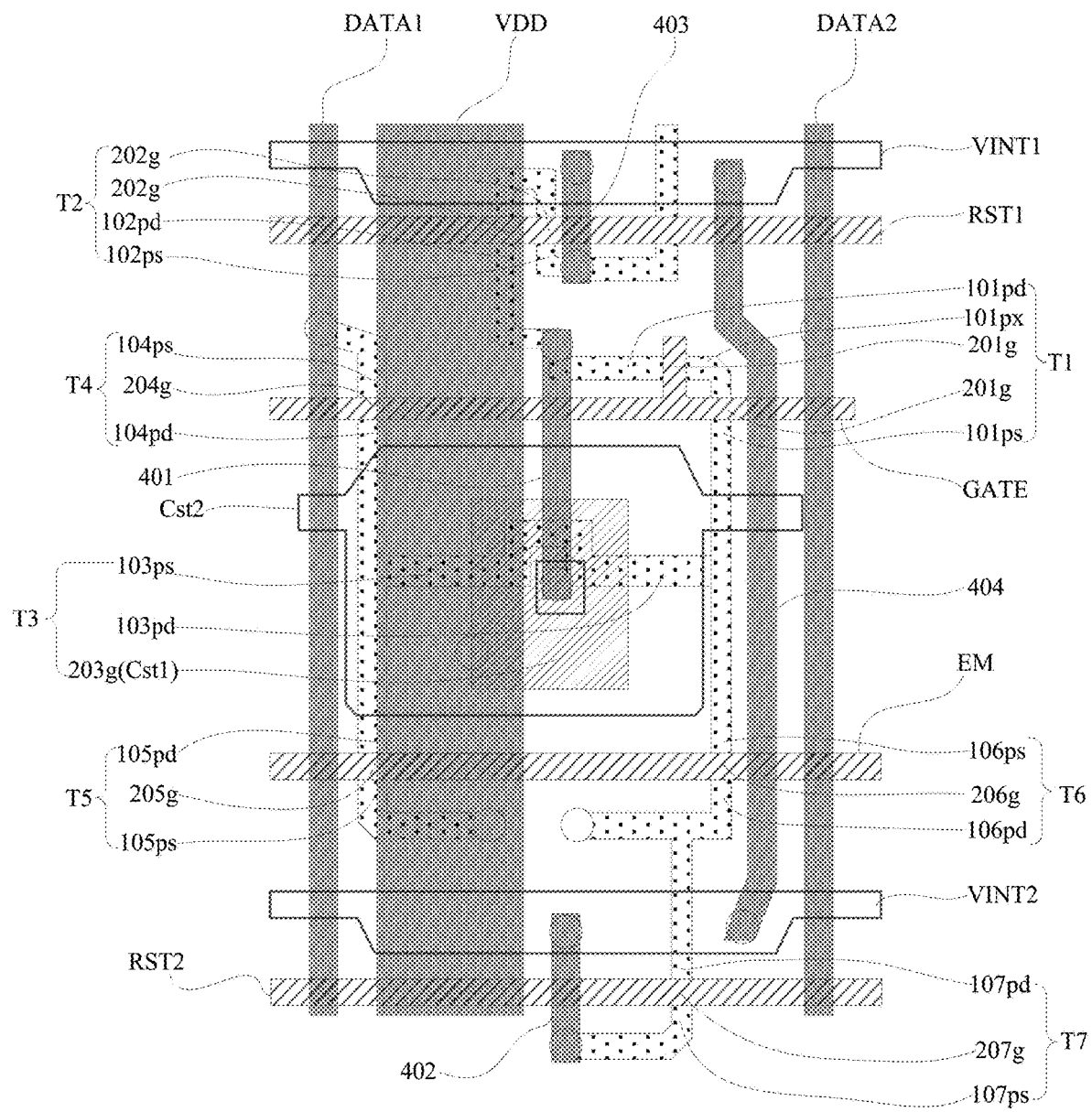
FIG. 9 is a schematic diagram of a second layout of a sub-pixel driving circuit in a display substrate according to an embodiment of the present disclosure.

As shown in FIG. 9, in some embodiments, the first shield member 404 is coupled to two adjacent ones of the initialization signal lines.

Specifically, when the first shielding member 404 is provided to be coupled to the initialization signal line, the coupling manner of the first shielding member 404 to the initialization signal line, and the specific structure and the arrangement manner of the first shielding member 404 are varied. For example, as shown in FIG. 3, the first shielding member 404 may be provided to be coupled to two adjacent initialization signal lines; This arrangement is such that the orthographic projection of the first shielding member 404 on the substrate 50 is not only between the orthographic projection of the first transistor T1 on the substrate 50 and the orthographic projection of the target data line pattern on the substrate 50; Further enabling the orthographic projection of the first shielding member 404 on the substrate 50 to be located between the orthographic projection of the connection line 401 on the substrate 50 and the orthographic projection of the target data line pattern on the substrate 50; Also, the orthographic projection of the first shielding member 404 on the substrate 50 can be positioned between the orthographic projection of the driving transistor (i.e., the third transistor T3) on the substrate 50 and the orthographic projection of the target data line pattern on the substrate 50.

The above arrangement reduces the first crosstalk generated between the target signal pattern and the first transistor T1 and the second crosstalk generated between the target signal pattern and the connection line 401, thereby reducing the indirect crosstalk caused to the driving transistor by the first crosstalk and the second crosstalk. In addition, the above-described arrangement reduces the direct crosstalk between the target signal pattern and the driving transistor, thereby better ensuring the operation performance of the display substrate.

Referring to FIG. 3, in some embodiments, the first shielding member 404 is disposed at a different level from the initialization signal line pattern (VINT1 in FIG. 3), and the first shielding member 404 has an orthographic projection on the substrate 50 and a first overlapping region exists from the orthographic projection of the initialization signal line pattern on the substrate, and the first shielding member 404 is coupled to the initialization signal line pattern through a first via-hole disposed in the first overlapping region.

Specifically, the first shielding member 404 may be in the same layer or different layer as the initialization signal line shape, and when the first shielding member 404 is in the different layer as the initialization signal line shape, an orthographic projection of the first shielding member 404 on the substrate 50 may be provided, and there is a first overlap area with the orthographic projection of the initialization signal line shape on the substrate 50, so that coupling between the first shielding member 404 and the initialization signal line may be realized by providing the first through hole in the first overlap area.

It should be noted that the above-mentioned "the first shielding member 404 may be in the same layer as the initialization signal pattern" includes that the first shielding member 404 and the initialization signal pattern are on the same horizontal plane; the first shielding member 404 and the initialization signal pattern are located in the same film layer; the first shielding member 404 and the initialization signal line pattern are each provided on a surface of the same layer of insulating layer away from the substrate; and at least one of a plurality of cases in which the first shielding member 404 and the initialization signal pattern are formed by a one-time patterning process.

The above "the first shielding member 404 may be disposed at a layer different from the initialization signal line pattern" includes that the first shielding member 404 and the initialization signal line pattern are not located in the same film layer; The first shielding member 404 and the initialization signal pattern cannot be formed by a one-time patterning process or the like.

In some embodiments, the first shield member 404 may be in the same material as the data line pattern (DATA1 in FIG. 3).

In some embodiments, the display substrate may be including a first interlayer insulating layer, the first shield member 404 and the data line pattern (DATA1 in FIG. 3) both is on a surface of the first interlayer insulating layer away from the substrate.

Specifically, the first shielding member 404 is in the manner described above, so that the first shielding member 404 and the data line pattern can be simultaneously formed on the surface of the first interlayer insulating layer away from the substrate by the one-time patterning process, thereby avoiding the addition of an additional patterning process for forming the first shielding member 404, thereby simplifying the forming process of the display substrate and saving the forming cost.

As shown in FIG. 3, in some embodiments, the sub-pixel driving circuit further includes a second transistor T2 coupled to the gate of the driving transistor, the second transistor T2 including:

A first semiconductor pattern, a second semiconductor pattern, and a third conductor pattern coupled to the first semiconductor pattern and the second semiconductor pattern, the third conductor pattern having a conductivity superior to conductivities of the first semiconductor pattern and the second semiconductor pattern;

A first gate pattern and a second gate pattern coupled, the orthographic projection of the first gate pattern on the substrate 50 overlapping the orthographic projection portion of the first semiconductor pattern on the substrate 50, and the orthographic projection of the second gate pattern on the substrate 50 overlapping the orthographic projection portion of the second semiconductor pattern on the substrate 50;

The orthographic projection of the third conductor pattern on the substrate 50 does not overlap with the orthographic projection of the first gate pattern on the substrate 50 and the orthographic projection of the second gate pattern on the substrate 50;

The orthographic projection of the third conductor pattern on the substrate 50 at least partially overlaps the orthographic projection of the initialization signal line pattern (VINT1 in FIG. 3) on the substrate 50.

Specifically, as shown in FIG. 7, the above-mentioned second transistor T2 is a double-gate structure including the first semiconductor pattern and the second semiconductor pattern formed as channel regions of the second transistor T2 (corresponding to the positions of the marks 102*pg* in FIG. 7), and including the third conductor pattern 102*px*, due to doping, is superior in conductivity to the first semiconductor pattern and the second semiconductor pattern, and the second transistor T2 includes the first gate pattern and the second gate pattern, one corresponding to cover the first semiconductor pattern and the second semiconductor pattern, and may collectively serve as a gate 202*g* of the second transistor T2.

In the second transistor T2 of the above-described structure, since the third conductor pattern 102*px* has good conductivity and is not covered by the gate pattern, it is easy to couple with other conductive patterns in the vicinity of the third conductor pattern 102*px*, and crosstalk is generated. In the technical solution in the above embodiment, by providing an orthographic projection of the third conductor pattern on the substrate 50, and at least partially overlapping with the orthographic projection of the initialized signal line pattern (VINT1 in FIG. 3) on the substrate 50, the initialized signal line pattern can cover the third conductor pattern 102*px*, and since the initialized signal having a fixed potential is transmitted on the initialized signal line pattern, coupling between the third conductor pattern 102*px* and other conductive patterns in the vicinity thereof is better reduced, thereby making the operation performance of the display substrate more stable.

As shown in FIG. 4, in some embodiments, the sub-pixel driving circuit further includes a first extension extending from the first semiconductor pattern, the first extension having a superior conductivity to the first semiconductor pattern; The first extension includes a first portion 61, a second portion 62, and a third portion 63, each extending in the first direction, the second portion 62 extending in the second direction, one end of the second portion 62 coupled to the first portion 61, and the other end of the second portion 62 coupled to the third portion 63; The third portion 63 is coupled to the first transistor T1 at an end away from the second portion 62.

Specifically, the first extension portion and the first semiconductor pattern may be formed in a one-time patterning process, and after the first semiconductor pattern is formed, the first extension portion is doped so that the first extension portion is superior in conductivity to the first semiconductor pattern.

After the first shielding member 404 is added, the first extension portion is provided so that when the second transistor T2 is coupled to the first transistor T1 and the gate of the driving transistor, through the first extension portion, it is more advantageous to reduce the influence of the signal change transmitted on the target data line pattern on the performance of the first transistor T1 and the performance of the second transistor T2, thereby reducing the influence of the coupling between the gate of the driving transistor (i.e., 203g) and the target data line pattern, and reducing the problem of vertical crosstalk, so that the display substrate can obtain a better display effect when used for display.

As shown in FIGS. 3 and 4, in some embodiments, the first transistor T1 includes:

A fourth semiconductor pattern, a fifth semiconductor pattern, and a sixth conductor pattern coupled to the fourth semiconductor pattern and the fifth semiconductor pattern, the sixth conductor pattern having a conductivity superior to conductivities of the fourth semiconductor pattern and the fifth semiconductor pattern;

A third gate pattern and a fourth gate pattern coupled to the third gate pattern, the orthographic projection of the third gate pattern on the substrate 50 overlapping the orthographic projection portion of the fourth semiconductor pattern on the substrate 50, the orthographic projection of the fourth gate pattern on the substrate 50 overlapping the orthographic projection portion of the fifth semiconductor pattern on the substrate 50;

The orthographic projection of the sixth conductor pattern on the substrate 50 and the orthographic projection of the third gate pattern on the substrate 50, and the orthographic projection of the fourth gate pattern on the substrate 50 do not overlap.

Specifically, as shown in FIG. 4, the first transistor is a double-gate structure including the fourth semiconductor pattern and the fifth semiconductor pattern formed as a channel region of the first transistor (corresponding to the mark 101pg in FIG. 4), and including the sixth conductor pattern 101px whose conductivity is superior to conductivities of the fourth semiconductor pattern and the fifth semiconductor pattern due to doping, and the first transistor includes a third gate pattern and a fourth gate pattern which respectively cover the fourth semiconductor pattern and the fifth semiconductor pattern and can collectively serve as a gate 201g of the first transistor T1.

As shown in FIG. 10, in some embodiments, the orthographic projection of the first shield member 404 on the substrate 50 at least partially overlaps with the orthographic projection of the sixth conductor pattern 101px on the substrate 50.

Specifically, in the first transistor T1 of the above-described structure, since the sixth conductor pattern 101px has good conductive performance and is not covered by the gate pattern, it is easy to couple with other conductive patterns in the vicinity thereof, and crosstalk phenomenon is generated. In the technical solution in the above embodiment, the first shielding member 404 can cover the sixth conductor pattern 101px by providing an orthographic projection of the first shielding member 404 on the substrate 50 and at least partially overlapping with the orthographic projection of the sixth conductor pattern 101px on the substrate 50, and since the first shielding member 404 has a fixed potential, coupling between the sixth conductor pattern 101px and other conductive patterns in the vicinity of the sixth conductor pattern 101px is better reduced, so that the operation performance of the display substrate is more stable.

Figure 11:
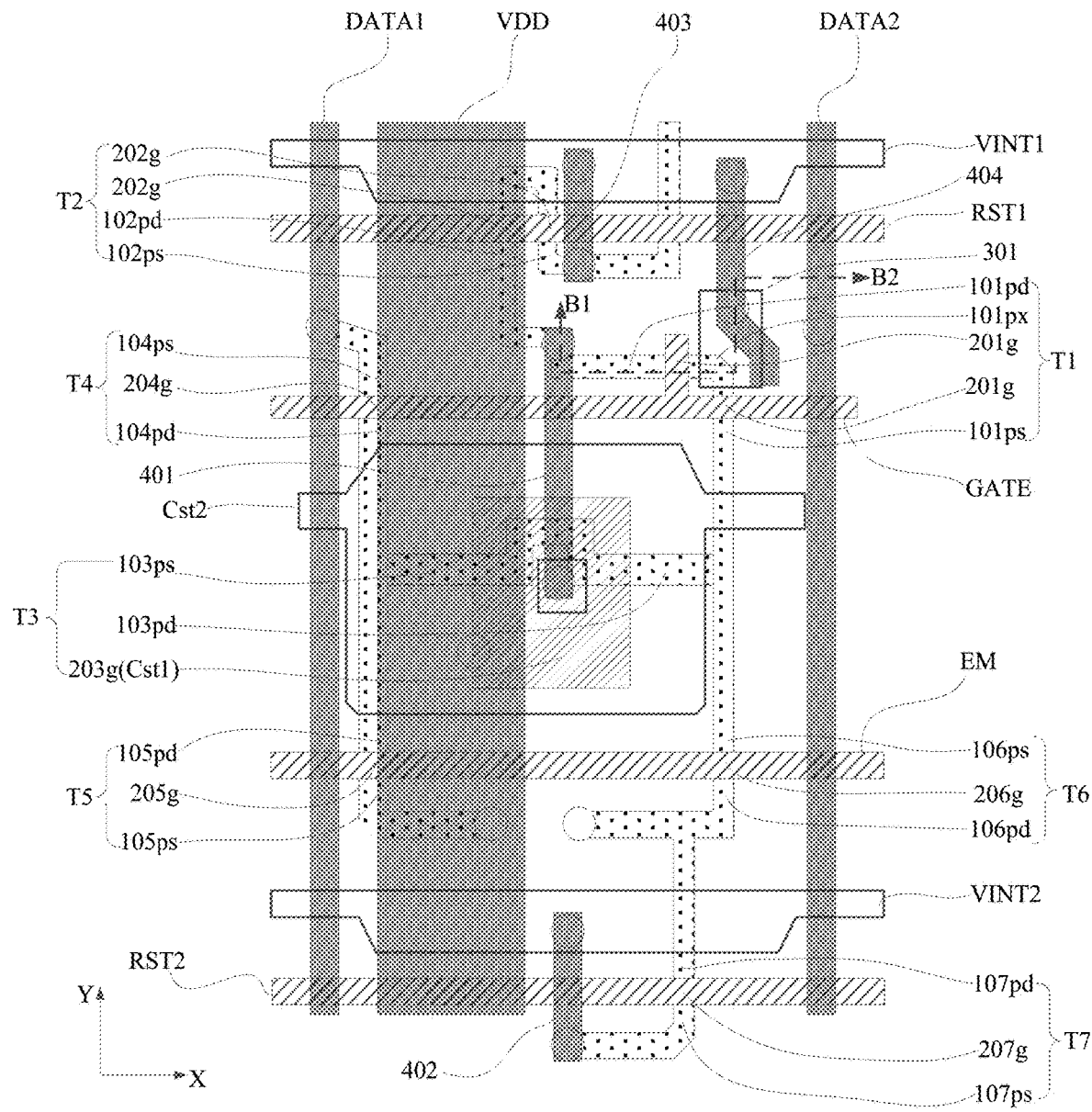
FIG. 11 is a fourth layout diagram of a sub-pixel driving circuit in a display substrate according to an embodiment of the present disclosure.
Figure 12:
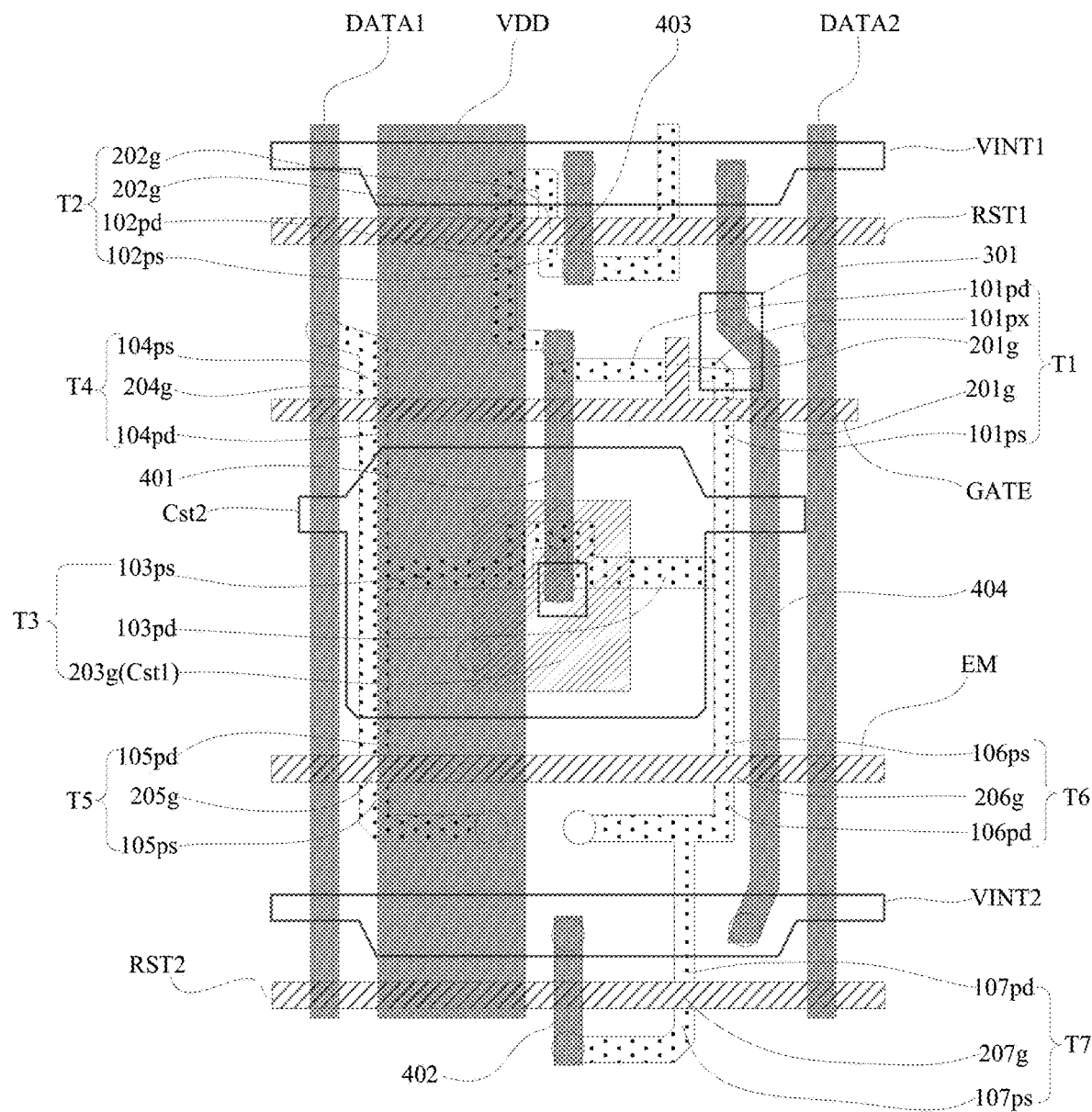
FIG. 12 is a fifth layout diagram of a sub-pixel driving circuit in a display substrate according to an embodiment of the present disclosure.
Figure 13:
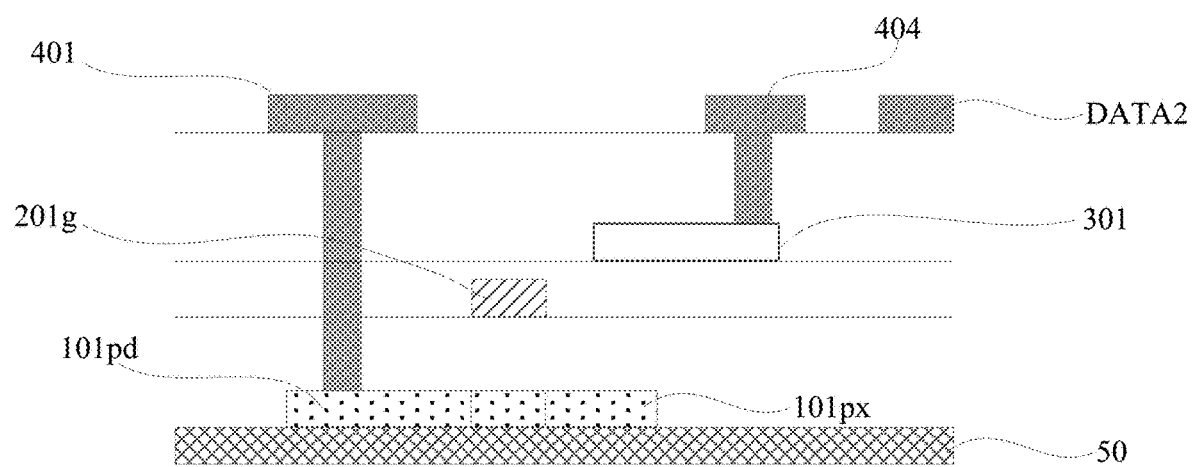
FIG. 13 is a schematic sectional view in the B1B2 direction of FIG. 11.

As shown in FIGS. 11, 12, and 13, in some embodiments, the sub-pixel driving circuit further includes a second shielding member 301 coupled to the first shielding member 404, the second shielding member 301 orthographic projection on the substrate 50 at least partially overlapping with the orthographic projection of the sixth conductor pattern 101px on the substrate 50.

Specifically, the orthographic projection of the second shielding member 301 provided on the substrate 50 at least partially overlaps with the orthographic projection of the sixth conductor pattern 101px on the substrate 50, so that the second shielding member 301 can cover the sixth conductor pattern 101px, and since the second shielding member 301 is coupled to the first shielding member 404, the second shielding member 301 has a fixed potential, thereby better reducing the coupling effect between the sixth conductor pattern 101px and other conductive patterns in the vicinity thereof, so that the operation performance of the display substrate is more stable.

Therefore, in the display substrate in the above embodiment, since the first shielding member 404 and the second shielding member 301 each have a fixed potential, the parasitic capacitance formed between the first transistor T1 and the target data line pattern (e.g., DATA2) is better prevented or reduced, and the vertical crosstalk defect is effectively prevented or reduced.

Further, the orthographic projection of the second shielding member 301 on the substrate 50 may be provided to cover the entire orthographic projection of the sixth conductor pattern on the substrate 50.

Specifically, the orthographic projection of the second shielding member 301 on the substrate 50 is provided to cover the entire orthographic projection of the sixth conductor pattern 101px on the substrate 50, so that the second shielding member 301 can completely cover the sixth conductor pattern 101px, thereby minimizing the coupling effect between the sixth conductor pattern 101px and other conductive patterns in the vicinity thereof, and improving the operation stability of the display substrate.

In some embodiments, the second shielding member 301 and the first shielding member 404 are in a different layer, and a second overlapping region exists between an orthographic projection of the second shielding member 301 on the substrate 50 and an orthographic projection of the first shielding member 404 on the substrate 50, and the second shielding member 301 and the first shielding member 404 are coupled through a second via-hole in the second overlapping region.

Specifically, the second shielding member 301 may be in the same layer or different layer from the first shielding member 404, and when the second shielding member 301 is in different layer from the first shielding member 404, there may be provided a second overlapping region between the orthographic projection of the second shielding member 301 on the substrate 50 and the orthographic projection of the first shielding member 404 on the substrate 50, so that coupling between the second shielding member 301 and the first shielding member 404 can be realized through the second via-hole by providing the second via-hole in the second overlapping region.

In some embodiments, the second shielding member 301 may be provided with the same material arrangement as the initialization signal pattern.

In some embodiments, the display substrate may further include a second interlayer insulating layer, the second shielding member 301 and the initialization signal line pattern (VINT1 in FIG. 3) are both on a surface of the second interlayer insulating layer away from the substrate.

Specifically, the second shielding member 301 and the initialization signal line pattern (VINT1 in FIG. 3) are made of a same material, and both the second shielding member 301 and the initialization signal line pattern (VINT1 in FIG. 3) are on the surface of the second interlayer insulating layer away from the substrate, so that the second shielding member 301 and the initialization signal line pattern can be simultaneously formed in the same primary patterning process, thereby avoiding the addition of an additional forming process specifically for forming the second shielding member 301, thereby simplifying the forming process of the display substrate and saving the production cost.

As shown in FIG. 3, in some embodiments, the sub-pixel further includes a power signal pattern VDD including a portion extending in the first direction, the sub-pixel driving circuit further includes a storage capacitor Cst, a first electrode plate Cst1 in the storage capacitor Cst is multiplexed as a gate of the driving transistor, a second electrode plate Cst2 in the storage capacitor Cst is coupled to the power signal pattern VDD, and a second electrode plate Cst2 in the storage capacitor Cst is on a surface of the second interlayer insulating layer away from the substrate.

Specifically, the storage capacitor Cst included in the sub-pixel driving circuit has a first electrode plate Cst1 and a second electrode plate Cst2, the first electrode plate Cst1 and the second electrode plate Cst2 are oppositely disposed, and the first electrode plate Cst1 is coupled to the gate of the driving transistor, and the second electrode plate Cst2 is coupled to the power supply signal line pattern VDD. When the storage capacitor Cst is arranged, the first electrode plate Cst1 can be directly multiplexed as the gate of the driving transistor, so that the storage capacitor Cst can be coupled to the gate of the driving transistor, the space occupied by the sub-pixel driving circuit is reduced, and the resolution of the display substrate can be improved. In addition, the second electrode plate Cst2 in the storage capacitor Cst is provided on the surface of the second interlayer insulating layer away from the substrate, so that the second electrode plate Cst2 in the storage capacitor Cst can be formed simultaneously with the second shielding member 301 and the initialization signal pattern in the same patterning process, thereby simplifying the forming process of the display substrate and saving the production cost.

Figure 14:
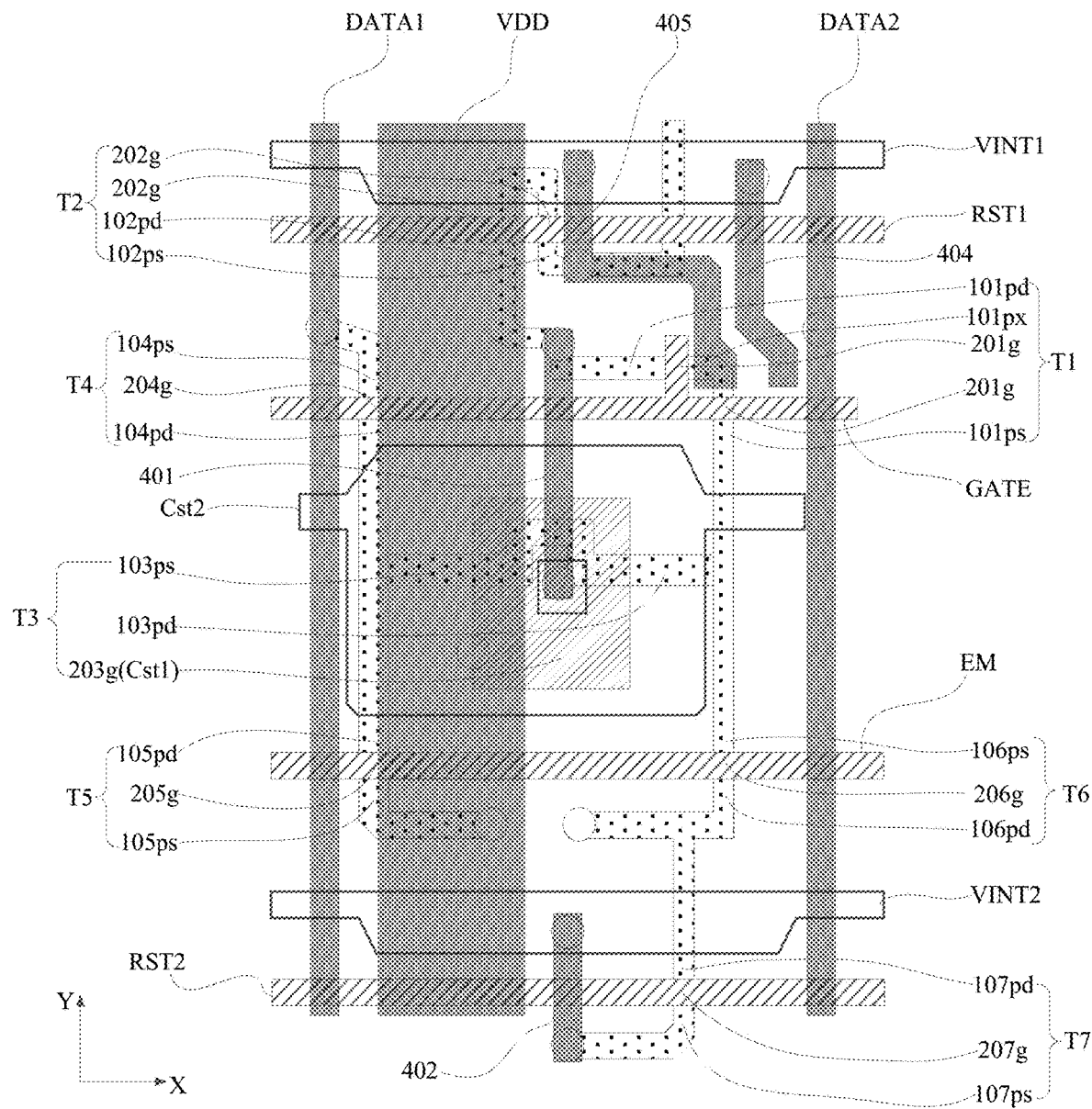
FIG. 14 is a sixth layout diagram of a sub-pixel driving circuit in a display substrate according to an embodiment of the present disclosure.

As shown in FIG. 14, in some embodiments, the sub-pixel further includes a reset signal line pattern (RST1 in FIG. 3) extending in a second direction intersecting the first direction, and the sub-pixel driving circuit further includes:

A first conductive connection 405 whose orthographic projection on the substrate 50 covers at least part of the orthographic projection of the sixth conductor pattern 101*px* on the substrate 50;

A second transistor T2 having a first electrode (e.g., source S2) coupled to the initialization signal line pattern (e.g., VINT1) through the first conductive connection 405, a second electrode (e.g., drain D2) of the second transistor T2 coupled to the gate of the driving transistor, and a gate 202*g* of the second transistor T2 coupled to the reset signal line pattern (e.g., RST1).

Specifically, the first conductive connection portion 405 may be made of a metal material and may be formed in the same patterning process as the data line pattern.

The orthographic projection of the first conductive connection portion 405 on the substrate 50 covers at least a part of the orthographic projection of the sixth conductive pattern 101*px* on the substrate 50, so that the first conductive connection portion 405 can cover the sixth conductive pattern 101*px*, and since the first conductive connection portion 405 is coupled to the initialization signal line pattern, the first conductive connection portion 405 has a fixed potential, thereby better reducing the coupling effect between the sixth conductive pattern 101*px* and other conductive patterns in the vicinity of the first conductive connection portion 405, thereby making the operation performance of the display substrate more stable.

As shown in FIG. 3, in some embodiments, the sub-pixel further includes a gate line pattern GATE, a light emission control signal pattern EM, a reset signal line pattern (RST1 in FIG. 3), and a power supply signal pattern VDD; The gate line pattern GATE, the light emission control signal pattern EM, and the reset signal pattern each extend in the second direction, and the power supply signal pattern VDD includes a portion extending in the first direction;

The sub-pixel driving circuit further includes a second transistor T2, a fourth transistor T4, a fifth transistor T5, a sixth transistor T6, and a seventh transistor T7;

A gate of the driving transistor, such as a gate 203*g* of a third transistor T3, is coupled to a second electrode of the first transistor T1, a first electrode of the driving transistor is coupled to a second electrode of the fifth transistor T5, and a second electrode of the driving transistor is coupled to a first electrode of the first transistor T1;

A gate 201*g* of the first transistor T1 is coupled to the gate pattern GATE;

A gate 202*g* of the second transistor T2 is coupled to the reset signal line pattern, a first electrode of the second transistor T2 is coupled to the initialization signal line pattern, and a second electrode of the second transistor T2 is coupled to the gate of the driving transistor;

A gate 204*g* of the fourth transistor T4 is coupled to the gate line pattern GATE, a first electrode of the fourth transistor T4 is coupled to the data line pattern (DATA1 in FIG. 3), and a second electrode of the fourth transistor T4 is coupled to the first electrode of the driving transistor;

A gate 205*g* of the fifth transistor T5 is coupled to the light emission control signal pattern EM, and a first electrode of the fifth transistor T5 is coupled to the power supply signal pattern VDD;

A gate 206*g* of the sixth transistor T6 is coupled to the light-emitting control signal pattern EM, a first electrode of the sixth transistor T6 is coupled to a second electrode of the driving transistor, and a second electrode of the sixth transistor T6 is coupled to a light-emitting element in the sub-pixel;

The gate 207*g* of the seventh transistor T7 is coupled to a reset signal pattern (e.g., RST2) included in the next sub-pixel adjacent in the first direction, the first electrode of the seventh transistor T7 is coupled to an initialization signal pattern (e.g., VINT2) included in the next sub-pixel, and the second electrode of the seventh transistor T7 is coupled to a light-emitting element in the sub-pixel.

Specifically, a plurality of sub-pixels included in the display substrate may be arranged in an array, the plurality of sub-pixels may be divided into a plurality of rows of sub-pixels and a plurality of columns of sub-pixels, each row of the sub-pixels including a plurality of sub-pixels arranged in a second direction, each column of sub-pixels including a plurality of sub-pixels arranged in a first direction, the first direction intersecting the second direction.

It is noted that, the next sub-pixel adjacent to the first direction is the next sub-pixel adjacent to the seventh transistor T7 in the same column.

The sub-pixel and the sub-pixel driving circuit included in the sub-pixel driving circuit are in the above-described structure, so that the layout space occupied by the sub-pixel driving circuit can be effectively reduced while the operation performance of the sub-pixel driving circuit is ensured, thereby facilitating improvement of the resolution of the display substrate.

It should be noted that the gates of the transistors included in the sub-pixel driving circuit and the functional patterns coupled thereto may be integrated. For example, the gates of the first transistor and the fourth transistor are integrated with the corresponding coupled gate line patterns, the gates of the fifth transistor and the sixth transistor are integrated with the corresponding coupled light-emitting control signal line patterns, and the gates of the second transistor and the seventh transistor are integrated with the corresponding coupled reset signal line patterns.

In addition, the first transistor T1 is used for threshold compensation of the driving transistor (e.g., the third transistor T3), the second transistor T2 is used for resetting the gate of the driving transistor, the fourth transistor T4 is used for writing the data signal transmitted by the data line pattern, the fifth transistor T5 is used for writing the power signal transmitted by the power signal line pattern to the first electrode of the driving transistor, the sixth transistor T6 is used for controlling whether the corresponding light-emitting element emits light, and the seventh transistor T7 is used for resetting the anode of the light-emitting element.

In some embodiments, the sub-pixel further includes a gate line pattern GATE, a light emission control signal pattern EM, a reset signal pattern RST, and a power supply signal pattern VDD; The grid line pattern GATE, the light emission control signal line pattern EM, and the reset signal line pattern RST each extend in the second direction, the power supply signal line pattern VDD including a portion extending in the first direction; The orthographic projection of the first shielding member 404 on the substrate 50 overlaps the orthographic projection of the gate pattern GATE on the substrate 50 and the orthographic projection portion of the light emission control signal pattern EM on the substrate 50.

Specifically, the first shielding member 404 is arranged in the above-described manner so that the first shielding member 404 can combine both the first transistor T1 and the driving transistor with the target data line pattern (e.g., DATA2) quarantine, thereby more advantageously reducing data signal variation on the target data line pattern, crosstalk caused by the first transistor T1 and the driving transistor.

In some embodiments, the second electrode of the seventh transistor T7 is coupled to the light-emitting element in the sub-pixel in a plurality of ways. Exemplarily, the orthographic projection of the anode of the light-emitting element on the substrate overlaps the orthographic projection of the second electrode of the seventh transistor T7 on the substrate, and the anode of the light-emitting element can be coupled to the second electrode of the seventh transistor T7 through a via hole at the overlap; alternatively, the orthographic projection of the anode of the light-emitting element on the substrate does not overlap the orthographic projection of the second electrode of the seventh transistor T7 on the substrate, the sub-pixel driving circuit further includes a second conductive connection portion 406 and a third conductive connection portion 407, the orthographic projection of the anode of the light-emitting element on the substrate overlaps the orthographic projection of the first end of the third conductive connection portion 407 on the substrate, the anode of the light-emitting element is coupled to the first end of the third conductive connection portion 407 through a via hole at the overlap, the second end of the third conductive connection portion 407 overlaps the first end of the second conductive connection portion 406, the second end of the third conductive connection portion 407 is coupled to the first end of the second conductive connection portion 406 through a via hole at the overlap, and the orthographic projection of the second electrode of the seventh transistor T7 on the substrate overlaps the orthographic projection of the second end of the second conductive connection portion 406 on the substrate, the second electrode of the seventh transistor T7 is coupled to the second terminal of the second conductive connection portion 406 through a via hole at the overlap, so that the anode of the light-emitting element can be coupled to the second electrode of the seventh transistor T7 through the second conductive connection portion 406 and the third conductive connection portion 407.

When the anode of the light-emitting element is provided to be coupled to the second electrode of the seventh transistor T7 through the second conductive connection 406 and the third conductive connection 407, the second conductive connection 406 may include a portion extending in the first direction, the anode of the light-emitting element may be on the upper side of the light-emitting control signal pattern in its corresponding sub-pixel, and the second electrode of the seventh transistor T7 may be on the lower side of the light-emitting control signal pattern in its corresponding sub-pixel.

Figure 15:
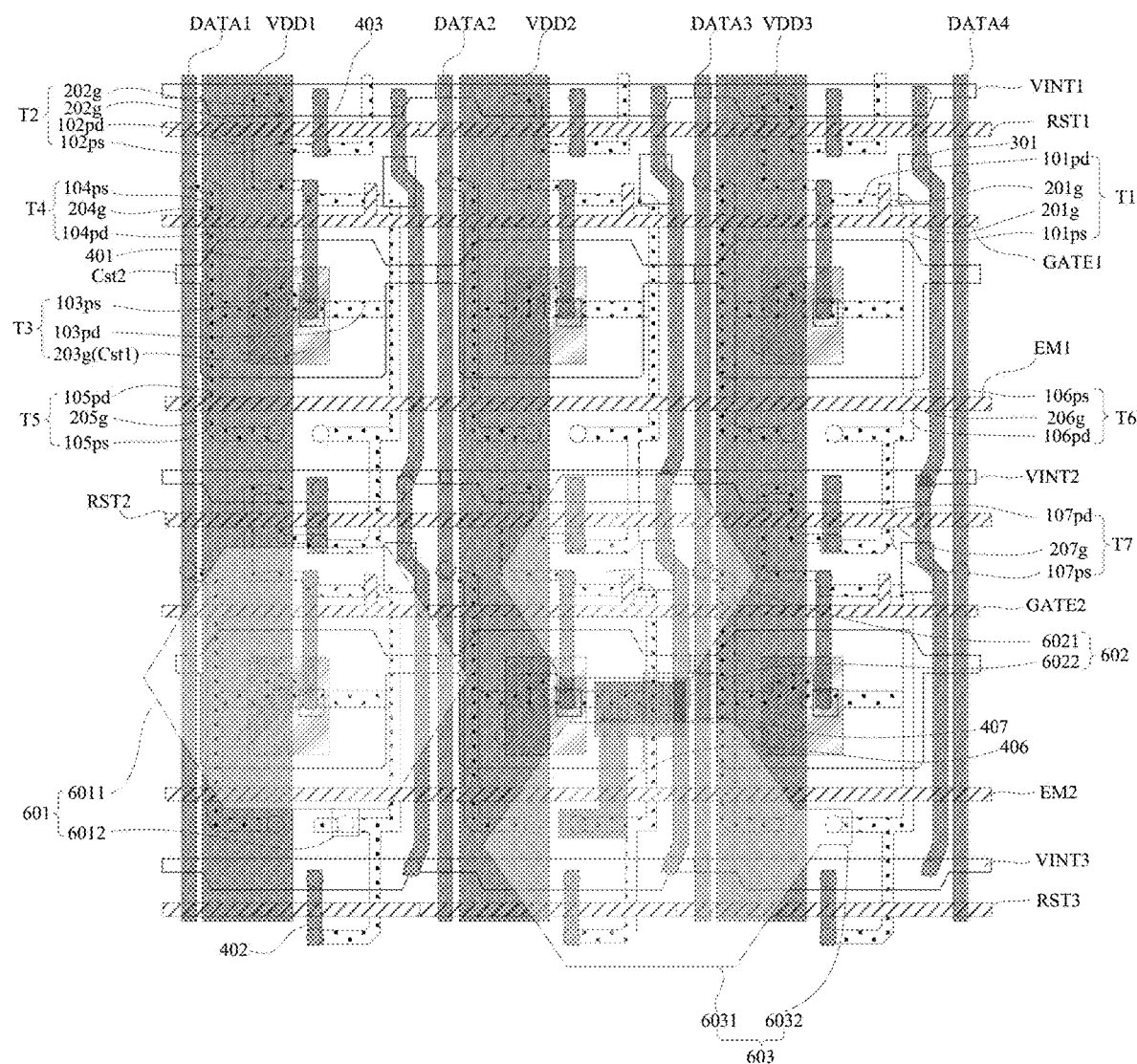
FIG. 15 is a schematic diagram of a first layout of a plurality of sub-pixels in a display substrate according to an embodiment of the present disclosure.
Figure 24:
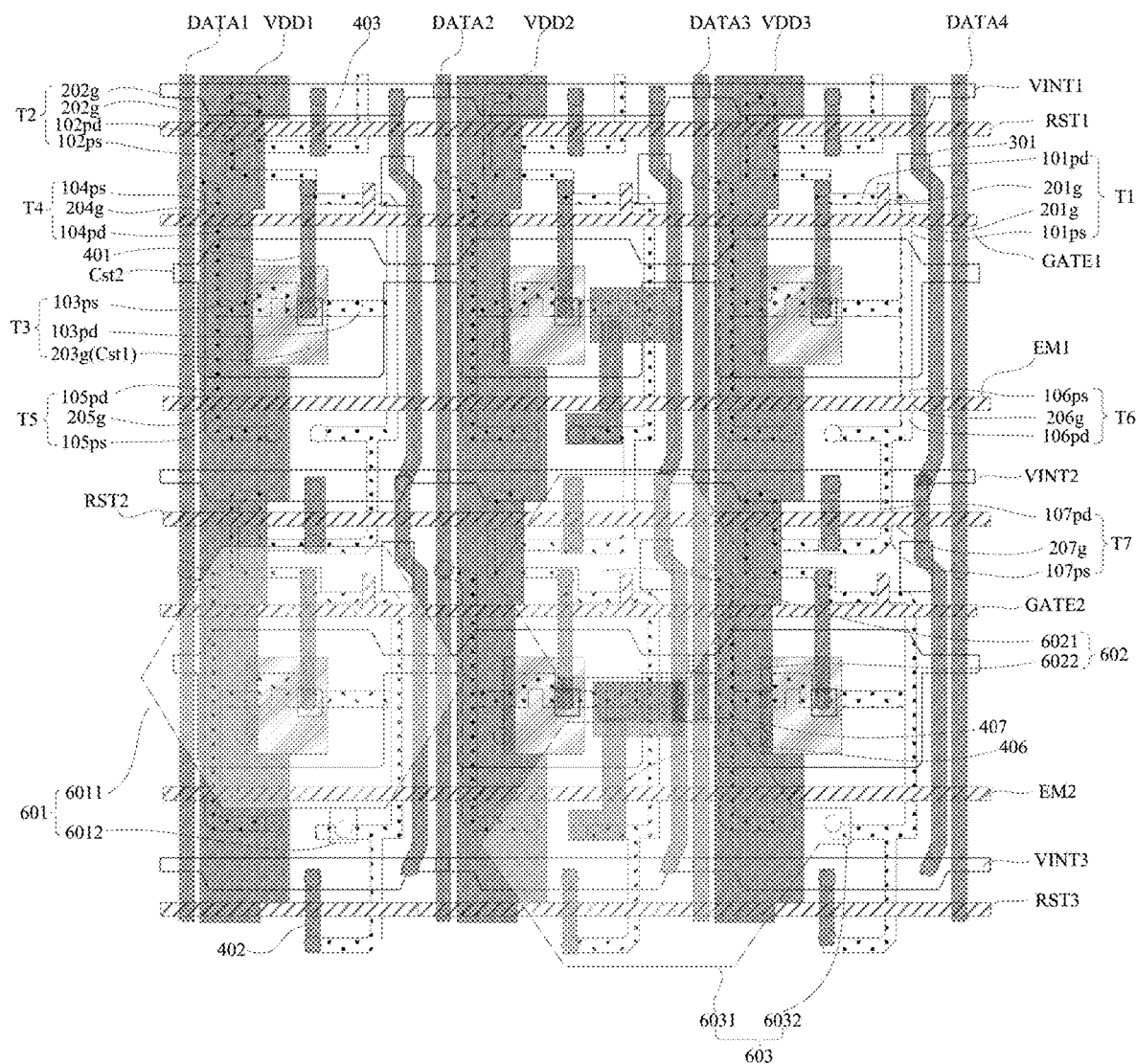
FIG. 24 is a second layout diagram of a plurality of sub-pixels in a display substrate according to an embodiment of the present disclosure.

As shown in FIGS. 15 and 24, the structure of the three-color sub-pixels will be described by taking the three-color sub-pixels shown in the figure as an example.

The light-emitting element in the first color sub-pixel includes a first anode 601, a first organic light-emitting material layer, and a first cathode, which are sequentially stacked in a direction away from the substrate; the orthographic projection of the first anode 601 on the substrate overlaps with the corresponding orthographic projection portion of the second electrode of the seventh transistor T7 on the substrate, and the first anode 601 is coupled to the corresponding second electrode of the seventh transistor T7 through a via hole at the overlap.

The light-emitting element in the second color sub-pixel includes a second anode 602, a second organic light-emitting material layer, and a second cathode, which are sequentially stacked in a direction away from the substrate; the orthographic projection of the second anode 602 on the substrate does not overlap with the forward projection of the corresponding second electrode of the seventh transistor T7 on the substrate, and the sub-pixel driving circuit in the second color sub-pixel further includes a second conductive connection 406 and a third conductive connection 407, and the second anode 602 is coupled to the corresponding second electrode of the seventh transistor T7 through the second conductive connection 406 and the third conductive connection 407.

The light-emitting element in the third color sub-pixel includes a third anode 603, a third organic light-emitting material layer, and a third cathode, which are sequentially stacked in a direction away from the substrate; An orthographic projection of the third anode 603 on the substrate overlaps with a corresponding orthographic projection portion of the second electrode of the seventh transistor T7 on the substrate, and the third anode 603 is coupled to the corresponding second electrode of the seventh transistor T7 through a via hole at the overlap.

For example, as shown in FIG. 15, the anode of the organic light-emitting element of each color sub-pixel includes a main part electrode and a connecting electrode, and the main part electrode has a hexagonal shape.

As shown in FIG. 15, the first anode 601 of the first color sub-pixel includes a first main part electrode 6011 and a first connection electrode 6012, the first main part electrode 6011 and the first connection electrode 6012 may be integrated, and the first connection electrode 6012 is connected to the second electrode of the seventh transistor T7 of the first color sub-pixel through a connection hole. The second anode 602 of the second color sub-pixel includes a second main part electrode 6021 and a second connecting electrode 6022, the second main part electrode 6021 and the second connecting electrode 6022 may be an integral structure, and the second connecting electrode 6022 is connected to the second electrode of the seventh transistor T7 of the second color sub-pixel through the second conductive connecting portion 406 and the third conductive connecting portion 407. The third anode electrode 603 of the third color sub-pixel includes a third main part electrode 6031 and a third connection electrode 6032, the third main part electrode 6031 and the third connection electrode 6032 may be of an integral structure, and the third connection electrode 6032 is connected to the second electrode of the seventh transistor T7 of the third color sub-pixel through the connection hole.

For example, the first connection electrode 6012 of the first color sub-pixel is on the side of the data line pattern in which the center of the first main part electrode 6011 is away from the sub-pixel pixel pixel circuit in the X direction, and on the side of the light emission control signal line in which the center of the first main part electrode 6011 is away from the sub-pixel pixel pixel circuit in the Y direction. For example, the first connection electrode 6012 of the first color sub-pixel and the first main part electrode 6011 are arranged in the Y direction, and the first connection electrode 6012 is located in the lower right corner of the first main part electrode 6011. For example, the second connection electrode 6022 of the second color sub-pixel is located at one side of the center of the second main part electrode 6021 away from the data line of the sub-pixel pixel pixel circuit in the X direction, and at one side of the center of the second main part electrode 6021 adjacent to the light emission control signal line of the sub-pixel pixel circuit in the Y direction. For example, the second connection electrode 6022 and the second main part electrode 6021 of the second color sub-pixel are arranged in the Y direction, and the second connection electrode 6022 is located in the lower right corner of the first main part electrode 1231. For example, the third connection electrode 6032 of the third color sub-pixel and the third main part electrode 6031 are arranged in the X direction, and the third connection electrode 6032 is on the right side of the third main part electrode 6031, that is, near the side of the sub-pixel pixel circuit near the shielding line.

As shown in FIG. 15, the first main part electrode 6011 of the first anode 601 of the first color sub-pixel covers the driving transistor of the first color sub-pixel, the second main part electrode 6021 of the second anode 602 of the second color sub-pixel and the driving transistor of the second color sub-pixel are substantially not overlapped or partially overlapped, and the third main part electrode 6031 of the third anode 603 of the third color sub-image and the driving transistor of the third color sub-pixel are not overlapped.

As shown in FIG. 15, a first main part electrode 6011 of a first color sub-pixel 601 (e.g., a blue sub-pixel) overlaps a gate line pattern and a light emission control signal line pattern; A second main part electrode 6021 of a second color sub-pixel (e.g., a red sub-pixel) overlaps the gate line pattern and the reset signal line pattern; A third main part electrode 6031 of a third color sub-pixel (for example, a green sub-pixel) overlaps with the light emission control signal line pattern, the reset signal line pattern of the next row sub-pixel driving circuit, and the initialization signal line pattern of the next row sub-pixel driving circuit. For example, the third main part electrode 6031 of the third color sub-pixel (e.g., green sub-pixel) overlaps the pixel driving circuit area of the next row of the first color sub-pixel (e.g., blue sub-pixel) adjacent thereto.

For example, the first main part electrode 6011 of the first color sub-pixel 601 overlaps with a portion of a driving transistor of an adjacent third color sub-pixel, and the first main part electrode 6011 of the first color sub-pixel 601 overlaps with a data line pattern in a sub-pixel driving circuit of the first color sub-pixel 601, a data line pattern in a sub-pixel driving circuit of the first shielding member 404, and a data line pattern in a sub-pixel driving circuit of an adjacent second color sub-pixel. The second main part electrode 6021 of the second color sub-pixel is not overlapped with the data line pattern in the sub-pixel driving circuit of the second color sub-pixel, and overlapped with the power supply signal line pattern in the sub-pixel driving circuit of the second color sub-pixel and the power supply signal line pattern and the data line pattern in the sub-pixel driving circuit of the adjacent third color sub-pixel. The third main part electrode 6031 of the third color sub-pixel overlaps both the data line pattern and the power supply signal line pattern in the sub-pixel driving circuit of the third color sub-pixel, and overlaps the power supply signal line pattern in the sub-pixel driving circuit of the adjacent second color sub-pixel.

For example, as shown in FIG. 15, the first main part electrode 6011 of the first color sub-pixel 601 is provided with a first connection electrode 6012 connected to the first main part electrode 6011 of the first color sub-pixel 601 near the next line reset signal line shape; A second main part electrode 6021 of the second color sub-pixel is provided with a second connection electrode 6022 connected to the second main part electrode 6021 near the next line reset signal line shape; The third main part electrode 6031 of the third color sub-pixel is provided with a third connection electrode 6032 connected to the third main part electrode 6031 of the third color sub-pixel adjacent to one side of the seventh transistor T7 thereof.

For example, as shown in FIG. 15, the first connection electrode 6012 of the first color sub-pixel 601 overlaps the second electrode of the seventh transistor T7 in the sub-pixel driving circuit thereof. The second connection electrode 6022 of the second color sub-pixel is not overlapped with the second electrode of the seventh transistor T7 in the sub-pixel driving circuit, and the second electrode of the seventh transistor T7 of the second color sub-pixel is overlapped with the third main part electrode 6031 of the third color sub-pixel. The third connection electrode 6032 of the third color sub-pixel overlaps with the second electrode of the seventh transistor T7 in the sub-pixel driving circuit.

Figure 26:
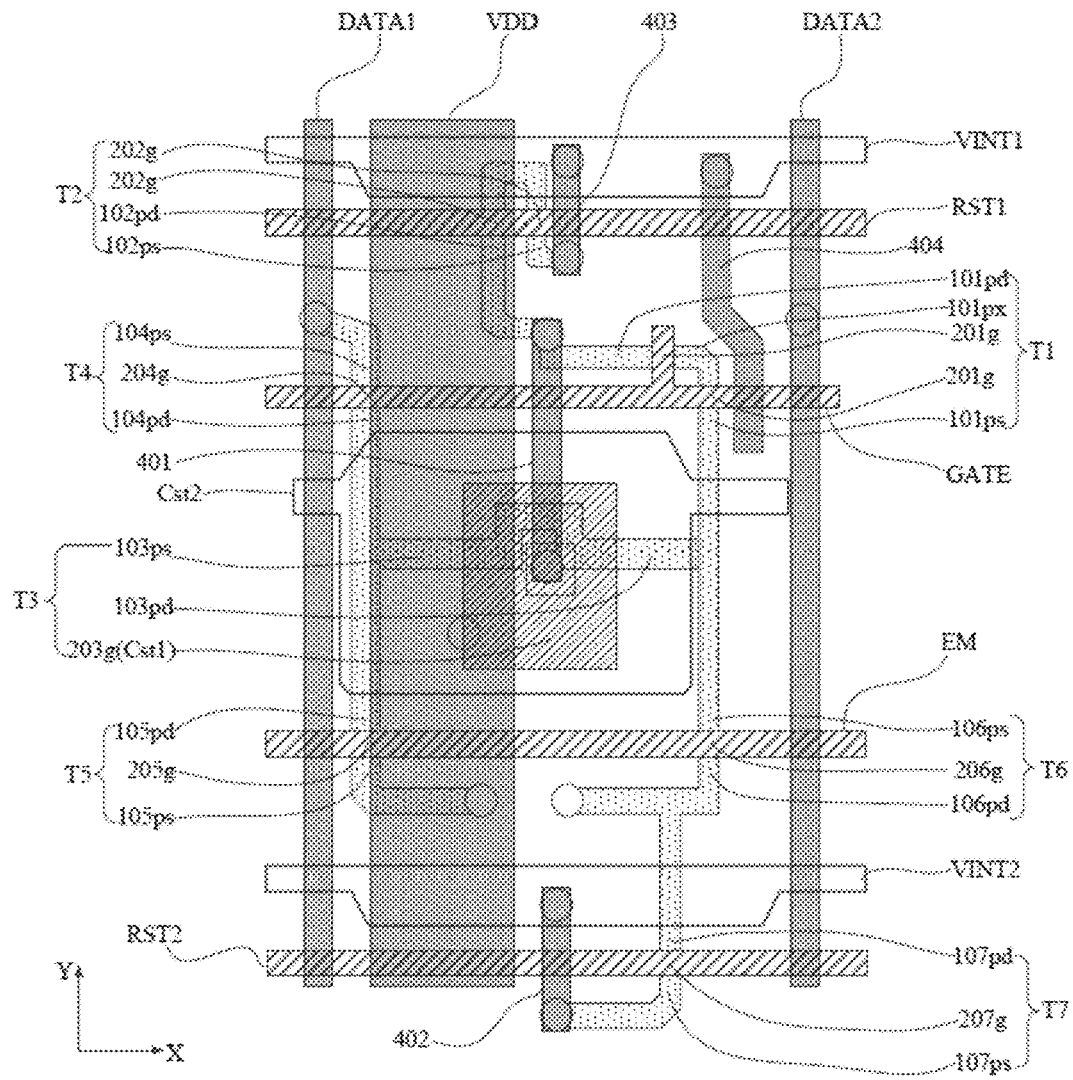
FIG. 26 is a schematic diagram of an eleventh layout of a sub-pixel driving circuit in a display substrate according to an embodiment of the present disclosure.

As shown in FIG. 26, an embodiment of the present disclosure further provides a display substrate including a substrate 50 and a plurality of sub-pixels arranged in an array on the substrate 50; The sub-pixels include:

A data line pattern (e.g., DATA1) extending in a first direction;

An initialization signal line pattern (e.g., VINT1) including a portion extending in a second direction intersecting the first direction, the initialization signal line pattern configured to transmit an initialization signal having a fixed potential;

A sub-pixel driving circuit including a driving transistor (e.g., a third transistor T3), a first transistor T1 coupled to a gate of the driving transistor, and a first shielding section 404 coupled to the initialization signal line pattern, the first shielding section 404 forming a coupling capacitor with a first electrode (i.e., a source S1) of the first transistor T1, the first shielding section 404 projecting orthogonally on a substrate 50 not overlapping with a target data line pattern (e.g., DATA2) projecting orthogonally on the substrate 50, the target data line pattern being included in a next sub-pixel adjacent to the sub-pixel in the second direction.

Specifically, the display substrate generally includes a plurality of sub-pixels arranged in an array, each sub-pixel including a data line pattern (DATA1 in FIG. 3) extending in a first direction, and an initialization signal line pattern (VINT1 in FIG. 3) extending at least partially in a second direction; The data line pattern is used configured to transmit a data signal, and the initialization signal pattern is used configured to transmit an initialization signal having a fixed potential; For example, the first direction includes a Y direction and the second direction includes an X direction.

The target data line pattern is a data line pattern included in the next sub-pixel adjacent to the current sub-pixel in the second direction.

Each sub-pixel further includes a sub-pixel driving circuit, and a light-emitting element corresponding to the sub-pixel driving circuit one by one, the light-emitting element including an anode, an organic light-emitting material layer, and a cathode arranged in a stacked manner, where the anode of the light-emitting element is coupled to the corresponding sub-pixel driving circuit, and the light-emitting element emits light under the driving of the driving signal provided by the sub-pixel driving circuit.

In more detail, as shown in FIGS. 1, 3, and 4, for example, the sub-pixel driving circuit includes the above-described 7T1C, the gate 203g of the third transistor T3 (i.e., the driving transistor) is coupled to the drain D1 of the first transistor T1 through the connection line 401, and the drain D3 of the third transistor T3 is coupled to the source S1 of the first transistor T1. In the X direction, the minimum distance between the orthographic projection of the first channel region 101pg of the first transistor T1 on the substrate 50 and the orthographic projection of the target data line pattern (DATA2 in FIG. 3) on the substrate 50 is smaller than the minimum distance between the orthographic projection of the third channel region 103pg of the third transistor T3 on the substrate 50 and the orthographic projection of the target data line pattern on the substrate 50. It is noted that, the minimum distance between the orthographic projection of the channel region (e.g., the first channel region 101pg and the third channel region 103pg) on the substrate 50 and the orthographic projection of the target data line pattern (DATA2 in FIG. 3) on the substrate 50 refers to the minimum distance between the channel region and the orthographic projection of the target data line pattern (DATA2 in FIG. 3) on the substrate 50 closest to the boundary of the target data line pattern in the orthographic projection on the substrate 50.

In the sub-pixel driving circuit of the above-described configuration, when the data signal transmitted by the target data line pattern changes, the performance of the first transistor T1 is affected, because the first transistor T1 is coupled to the third transistor T3 through the connection line 401, and the performance of the third transistor T3 is affected.

A first shielding member 404 coupled to the initialization signal line pattern (VINT1 in FIG. 3) is in the sub-pixel driving circuit in the disclosed embodiment, so that the first shielding member 404 has the same fixed potential as the initialization signal, and the first shielding member 404 can form a coupling capacitor with the first electrode (i.e., the source S1) of the first transistor T1, so that the first shielding member 404 can reduce the influence on the performance of the first transistor T1 due to the signal change transmitted on the target data line pattern, thereby reducing the influence on the coupling between the gate (i.e., 203g) of the driving transistor and the target data line pattern, and reducing the problem of vertical crosstalk, so that the display substrate can obtain a better display effect when used for display.

In addition, by coupling the first shielding member 404 with the initialization signal pattern, in addition to the first shielding member 404 having a fixed potential, the voltage of the initialization signal pattern is enhanced, so that the voltage of the initialization signal transmitted on the initialization signal line pattern is more stable, thereby facilitating the operation performance of the sub-pixel driving circuit.

It is noted that, in addition to coupling the first shielding member 404 to the initialization signal pattern, the first shielding member 404 may be coupled to the power supply signal pattern VDD included in the sub-pixel such that the first shielding member 404 has the same fixed potential as the power supply signal transmitted by the power supply signal pattern VDD.

When the first shielding member 404 is coupled to the power supply signal line pattern VDD, it is possible to ensure that the first shielding member 404 has a fixed potential, but the parasitic capacitance generated by the power supply signal line pattern VDD is increased, so that the RC load of the power supply signal line pattern VDD is larger, and vertical crosstalk is not weakened.

As shown in FIG. 3, in some embodiments, the gate 201g of the first transistor T1 and the gate line pattern GATE are integrated structures, and the gate 201g of the first transistor T1 is a portion of the integrated structure that can form an overlapping region with the active film layer in a direction perpendicular to the substrate.

As shown in FIG. 3, in some embodiments, the plurality of sub-pixels include a plurality of rows of sub-pixels, each row of the sub-pixels including a plurality of the sub-pixels arranged in the second direction, and the initialization signal lines in the same row of sub-pixels are sequentially coupled to form initialization signal lines corresponding to the row of sub-pixels; The first shielding member 404 extends in the first direction and is coupled to at least one of the initialization signal lines.

Specifically, the plurality of sub-pixels may be divided into a plurality of rows of sub-pixels and a plurality of columns of sub-pixels, each row of the sub-pixels including a plurality of sub-pixels arranged in a second direction, each column of sub-pixels including a plurality of sub-pixels arranged in a first direction, the first direction intersecting the second direction; The initialization signal lines located in the same row of sub-pixels are sequentially coupled to form an initialization signal line corresponding to the row of sub-pixels.

The first shielding member 404 is arranged to extend in the first direction, and is coupled to at least one of the initialization signal lines, so that the first shielding member 404 can reduce the influence of the signal change transmitted on the target data line pattern on the performance of the first transistor T1, thereby reducing the influence of the coupling between the gate of the driving transistor (i.e., 203g) and the target data line pattern, and reducing the problem of vertical crosstalk, so that the display substrate can obtain a better display effect when used for display;

Furthermore, it is also achieved that the voltage of the initialization signal line is enhanced, so that the voltage of the initialization signal transmitted on the initialization signal line is more stable, thereby facilitating the operation performance of the sub-pixel driving circuit.

As shown in FIG. 9, in some embodiments, the first shield member 404 is coupled to two adjacent ones of the initialization signal lines.

Specifically, when the first shielding member 404 is provided to be coupled to the initialization signal line, the coupling manner of the first shielding member 404 to the initialization signal line, and the specific structure and the arrangement manner of the first shielding member 404 are varied. For example, as shown in FIG. 3, the first shielding member 404 may be provided to be coupled to two adjacent initialization signal lines; This arrangement is such that the orthographic projection of the first shielding member 404 on the substrate 50 is not only between the orthographic projection of the first transistor T1 on the substrate 50 and the orthographic projection of the target data line pattern on the substrate 50; Further enabling the orthographic projection of the first shielding member 404 on the substrate 50 to be located between the orthographic projection of the connection line 401 on the substrate 50 and the orthographic projection of the target data line pattern on the substrate 50; Also, the orthographic projection of the first shielding member 404 on the substrate 50 can be positioned between the orthographic projection of the driving transistor (i.e., the third transistor T3) on the substrate 50 and the orthographic projection of the target data line pattern on the substrate 50.

The above arrangement reduces the first crosstalk generated between the target signal pattern and the first transistor T1 and the second crosstalk generated between the target signal pattern and the connection line 401, thereby reducing the indirect crosstalk caused to the driving transistor by the first crosstalk and the second crosstalk. In addition, the above-described arrangement reduces the direct crosstalk between the target signal pattern and the driving transistor, thereby better ensuring the operation performance of the display substrate.

With continued reference to FIG. 3, in some embodiments, the first shielding member 404 is disposed at a different level from the initialization signal line pattern (VINT1 in FIG. 3), and the first shielding member 404 has an orthographic projection on the substrate 50 and a first overlapping region exists from the orthographic projection of the initialization signal line pattern on the substrate, and the first shielding member 404 is coupled to the initialization signal line pattern through a first via-hole disposed in the first overlapping region.

Specifically, the first shielding member 404 may be in the same layer or different layer as the initialization signal line shape, and when the first shielding member 404 is in the different layer as the initialization signal line shape, an orthographic projection of the first shielding member 404 on the substrate 50 may be provided, and there is a first overlap area with the orthographic projection of the initialization signal line shape on the substrate 50, so that coupling between the first shielding member 404 and the initialization signal line may be realized by providing the first through hole in the first overlap area.

It should be noted that the above-mentioned & #x201c; the first shielding member 404 may be in the same layer as the initialization signal pattern & #x201d; includes that the first shielding member 404 and the initialization signal pattern are in the same horizontal plane; The first shielding member 404 and the initialization signal pattern are located in the same film layer; The first shielding member 404 and the initialization signal line pattern are each provided on a surface of the same layer of insulating layer away from the substrate; And at least one of a plurality of cases in which the first shielding member 404 and the initialization signal pattern are formed by a one-time patterning process.

The above "the first shielding member 404 may be disposed at a layer different from the initialization signal line pattern" includes that the first shielding member 404 and the initialization signal line pattern are not located in the same film layer; The first shielding member 404 and the initialization signal pattern cannot be formed by a one-time patterning process or the like.

In some embodiments, the first shield member 404 may be in the same material as the data line pattern (DATA1 in FIG. 3).

In some embodiments, the display substrate may be including a first interlayer insulating layer, the first shield member 404 and the data line pattern (DATA1 in FIG. 3) both is on a surface of the first interlayer insulating layer away from the substrate.

Specifically, the first shielding member 404 is in the manner described above, so that the first shielding member 404 and the data line pattern can be simultaneously formed on the surface of the first interlayer insulating layer away from the substrate by the one-time patterning process, thereby avoiding the addition of an additional patterning process for forming the first shielding member 404, thereby simplifying the forming process of the display substrate and saving the forming cost.

As shown in FIG. 3, in some embodiments, the sub-pixel driving circuit further includes a second transistor T2 coupled to the gate of the driving transistor, the second transistor T2 including:

A first semiconductor pattern, a second semiconductor pattern, and a third conductor pattern coupled to the first semiconductor pattern and the second semiconductor pattern, the third conductor pattern having a conductivity superior to conductivities of the first semiconductor pattern and the second semiconductor pattern;

A first gate pattern and a second gate pattern coupled, the orthographic projection of the first gate pattern on the substrate 50 overlapping the orthographic projection portion of the first semiconductor pattern on the substrate 50, and the orthographic projection of the second gate pattern on the substrate 50 overlapping the orthographic projection portion of the second semiconductor pattern on the substrate 50;

The orthographic projection of the third conductor pattern on the substrate 50 does not overlap with the orthographic projection of the first gate pattern on the substrate 50 and the orthographic projection of the second gate pattern on the substrate 50;

The orthographic projection of the third conductor pattern on the substrate 50 at least partially overlaps the orthographic projection of the initialization signal line pattern (VINT1 in FIG. 3) on the substrate 50.

Specifically, as shown in FIG. 7, the above-mentioned second transistor T2 is a double-gate structure including the first semiconductor pattern and the second semiconductor pattern formed as channel regions of the second transistor T2 (corresponding to the positions of the marks $102pg$ in FIG. 7), and including the third conductor pattern $102px$, due to doping, is superior in conductivity to the first semiconductor pattern and the second semiconductor pattern, and the second transistor T2 includes the first gate pattern and the second gate pattern, one corresponding to cover the first semiconductor pattern and the second semiconductor pattern, and may collectively serve as a gate 202g of the second transistor T2.

In the second transistor T2 of the above-described structure, since the third conductor pattern 102px has good conductivity and is not covered by the gate pattern, it is easy to couple with other conductive patterns in the vicinity of the third conductor pattern 102px, and crosstalk is generated. In the technical solution in the above embodiment, by providing an orthographic projection of the third conductor pattern on the substrate 50, and at least partially overlapping with the orthographic projection of the initialized signal line pattern (VINT1 in FIG. 3) on the substrate 50, the initialized signal line pattern can cover the third conductor pattern 102px, and since the initialized signal having a fixed potential is transmitted on the initialized signal line pattern, coupling between the third conductor pattern 102px and other conductive patterns in the vicinity thereof is better reduced, thereby making the operation performance of the display substrate more stable.

As shown in FIG. 4, in some embodiments, the sub-pixel driving circuit further includes a first extension extending from the first semiconductor pattern, the first extension having a superior conductivity to the first semiconductor pattern; The first extension includes a first portion 61, a second portion 62, and a third portion 63, each extending in the first direction, the second portion 62 extending in the second direction, one end of the second portion 62 coupled to the first portion 61, and the other end of the second portion 62 coupled to the third portion 63; The third portion 63 is coupled to the first transistor T1 at an end away from the second portion 62.

Specifically, the first extension portion and the first semiconductor pattern may be formed in a one-time patterning process, and after the first semiconductor pattern is formed, the first extension portion is doped so that the first extension portion is superior in conductivity to the first semiconductor pattern.

After the first shielding member 404 is added, the first extension portion is provided so that when the second transistor T2 is coupled to the first transistor T1 and the gate of the driving transistor, through the first extension portion, it is more advantageous to reduce the influence of the signal change transmitted on the target data line pattern on the performance of the first transistor T1 and the performance of the second transistor T2, thereby reducing the influence of the coupling between the gate of the driving transistor (i.e., 203g) and the target data line pattern, and reducing the problem of vertical crosstalk, so that the display substrate can obtain a better display effect when used for display.

As shown in FIGS. 3 and 4, in some embodiments, the first transistor T1 includes:

A fourth semiconductor pattern, a fifth semiconductor pattern, and a sixth conductor pattern coupled to the fourth semiconductor pattern and the fifth semiconductor pattern, the sixth conductor pattern having a conductivity superior to conductivities of the fourth semiconductor pattern and the fifth semiconductor pattern;

A third gate pattern and a fourth gate pattern coupled to the third gate pattern, the orthographic projection of the third gate pattern on the substrate 50 overlapping the orthographic projection portion of the fourth semiconductor pattern on the substrate 50, the orthographic projection of the fourth gate pattern on the substrate 50 overlapping the orthographic projection portion of the fifth semiconductor pattern on the substrate 50;

The orthographic projection of the sixth conductor pattern on the substrate 50 and the orthographic projection of the third gate pattern on the substrate 50, and the orthographic projection of the fourth gate pattern on the substrate 50 do not overlap.

Specifically, as shown in FIG. 4, the first transistor is a double-gate structure including the fourth semiconductor pattern and the fifth semiconductor pattern formed as a channel region of the first transistor (corresponding to the mark 101pg in FIG. 4), and including the sixth conductor pattern 101px whose conductivity is superior to conductivities of the fourth semiconductor pattern and the fifth semiconductor pattern due to doping, and the first transistor includes a third gate pattern and a fourth gate pattern which respectively cover the fourth semiconductor pattern and the fifth semiconductor pattern and can collectively serve as a gate 201g of the first transistor T1.

As shown in FIG. 10, in some embodiments, the orthographic projection of the first shield member 404 on the substrate 50 at least partially overlaps with the orthographic projection of the sixth conductor pattern 101px on the substrate 50.

Specifically, in the first transistor T1 of the above-described structure, since the sixth conductor pattern 101px has good conductive performance and is not covered by the gate pattern, it is easy to couple with other conductive patterns in the vicinity thereof, and crosstalk phenomenon is generated. In the technical solution in the above embodiment, the first shielding member 404 can cover the sixth conductor pattern 101px by providing an orthographic projection of the first shielding member 404 on the substrate 50 and at least partially overlapping with the orthographic projection of the sixth conductor pattern 101px on the substrate 50, and since the first shielding member 404 has a fixed potential, coupling between the sixth conductor pattern 101px and other conductive patterns in the vicinity of the sixth conductor pattern 101px is better reduced, so that the operation performance of the display substrate is more stable.

As shown in FIGS. 11, 12, and 13, in some embodiments, the sub-pixel driving circuit further includes a second shielding member 301 coupled to the first shielding member 404, the second shielding member 301 orthographic projection on the substrate 50 at least partially overlapping with the orthographic projection of the sixth conductor pattern 101px on the substrate 50.

Specifically, the orthographic projection of the second shielding member 301 provided on the substrate 50 at least partially overlaps with the orthographic projection of the sixth conductor pattern 101px on the substrate 50, so that the second shielding member 301 can cover the sixth conductor pattern 101px, and since the second shielding member 301 is coupled to the first shielding member 404, the second shielding member 301 has a fixed potential, thereby better reducing the coupling effect between the sixth conductor pattern 101px and other conductive patterns in the vicinity thereof, so that the operation performance of the display substrate is more stable.

Therefore, in the display substrate in the above embodiment, since the first shielding member 404 and the second shielding member 301 each have a fixed potential, the parasitic capacitance formed between the first transistor T1 and the target data line pattern (e.g., DATA2) is better prevented or reduced, and the vertical crosstalk defect is effectively prevented or reduced.

Further, the orthographic projection of the second shielding member 301 on the substrate 50 may be provided to cover the entire orthographic projection of the sixth conductor pattern on the substrate 50.

Specifically, the orthographic projection of the second shielding member 301 on the substrate 50 is provided to cover the entire orthographic projection of the sixth conductor pattern 101px on the substrate 50, so that the second shielding member 301 can completely cover the sixth conductor pattern 101px, thereby minimizing the coupling effect between the sixth conductor pattern 101px and other conductive patterns in the vicinity thereof, and improving the operation stability of the display substrate.

In some embodiments, the second shielding member 301 and the first shielding member 404 are in a different layer, and a second overlapping region exists between an orthographic projection of the second shielding member 301 on the substrate 50 and an orthographic projection of the first shielding member 404 on the substrate 50, and the second shielding member 301 and the first shielding member 404 are coupled through a second via-hole in the second overlapping region.

Specifically, the second shielding member 301 may be in the same layer or different layer from the first shielding member 404, and when the second shielding member 301 is in different layer from the first shielding member 404, there may be provided a second overlapping region between the orthographic projection of the second shielding member 301 on the substrate 50 and the orthographic projection of the first shielding member 404 on the substrate 50, so that coupling between the second shielding member 301 and the first shielding member 404 can be realized through the second via-hole by providing the second via-hole in the second overlapping region.

In some embodiments, the second shielding member 301 may be provided with the same material arrangement as the initialization signal pattern.

In some embodiments, the display substrate may further include a second interlayer insulating layer, the second shielding member 301 and the initialization signal line pattern (VINT1 in FIG. 3) are both on a surface of the second interlayer insulating layer away from the substrate.

Specifically, the second shielding member 301 and the initialization signal line pattern (VINT1 in FIG. 3) are made of a same material, and both the second shielding member 301 and the initialization signal line pattern (VINT1 in FIG. 3) are on the surface of the second interlayer insulating layer away from the substrate, so that the second shielding member 301 and the initialization signal line pattern can be simultaneously formed in the same primary patterning process, thereby avoiding the addition of an additional forming process specifically for forming the second shielding member 301, thereby simplifying the forming process of the display substrate and saving the production cost.

As shown in FIG. 3, in some embodiments, the sub-pixel further includes a power signal pattern VDD including a portion extending in the first direction, the sub-pixel driving circuit further includes a storage capacitor Cst, a first electrode plate Cst1 in the storage capacitor Cst is multiplexed as a gate of the driving transistor, a second electrode plate Cst2 in the storage capacitor Cst is coupled to the power signal pattern VDD, and a second electrode plate Cst2 in the storage capacitor Cst is on a surface of the second interlayer insulating layer away from the substrate.

Specifically, the storage capacitor Cst included in the sub-pixel driving circuit has a first electrode plate Cst1 and a second electrode plate Cst2, the first electrode plate Cst1 and the second electrode plate Cst2 are oppositely disposed, and the first electrode plate Cst1 is coupled to the gate of the driving transistor, and the second electrode plate Cst2 is coupled to the power supply signal line pattern VDD. When the storage capacitor Cst is arranged, the first electrode plate Cst1 can be directly multiplexed as the gate of the driving transistor, so that the storage capacitor Cst can be coupled to the gate of the driving transistor, the space occupied by the sub-pixel driving circuit is reduced, and the resolution of the display substrate can be improved. In addition, the second electrode plate Cst2 in the storage capacitor Cst is provided on the surface of the second interlayer insulating layer away from the substrate, so that the second electrode plate Cst2 in the storage capacitor Cst can be formed simultaneously with the second shielding member 301 and the initialization signal pattern in the same patterning process, thereby simplifying the forming process of the display substrate and saving the production cost.

As shown in FIG. 14, in some embodiments, the sub-pixel further includes a reset signal line pattern (RST1 in FIG. 3) extending in a second direction intersecting the first direction, and the sub-pixel driving circuit further includes:

A first conductive connection 405 whose orthographic projection on the substrate 50 covers at least part of the orthographic projection of the sixth conductor pattern 101px on the substrate 50;

A second transistor T2 having a first electrode (e.g., source S2) coupled to the initialization signal line pattern (e.g., VINT1) through the first conductive connection 405, a second electrode (e.g., drain D2) of the second transistor T2 coupled to the gate of the driving transistor, and a gate 202g of the second transistor T2 coupled to the reset signal line pattern (e.g., RST1).

Specifically, the first conductive connection portion 405 may be made of a metal material and may be formed in the same patterning process as the data line pattern.

The orthographic projection of the first conductive connection portion 405 on the substrate 50 covers at least a part of the orthographic projection of the sixth conductive pattern 101px on the substrate 50, so that the first conductive connection portion 405 can cover the sixth conductive pattern 101px, and since the first conductive connection portion 405 is coupled to the initialization signal line pattern, the first conductive connection portion 405 has a fixed potential, thereby better reducing the coupling effect between the sixth conductive pattern 101px and other conductive patterns in the vicinity of the first conductive connection portion 405, thereby making the operation performance of the display substrate more stable.

As shown in FIG. 3, in some embodiments, the sub-pixel further includes a gate line pattern GATE, a light emission control signal pattern EM, a reset signal line pattern (RST1 in FIG. 3), and a power supply signal pattern VDD; The gate line pattern GATE, the light emission control signal pattern EM, and the reset signal pattern each extend in the second direction, and the power supply signal pattern VDD includes a portion extending in the first direction;

The sub-pixel driving circuit further includes a second transistor T2, a fourth transistor T4, a fifth transistor T5, a sixth transistor T6, and a seventh transistor T7;

A gate of the driving transistor, such as a gate 203g of a third transistor T3, is coupled to a second electrode of the first transistor T1, a first electrode of the driving transistor is coupled to a second electrode of the fifth transistor T5, and a second electrode of the driving transistor is coupled to a first electrode of the first transistor T1;

A gate 201g of the first transistor T1 is coupled to the gate pattern GATE;

A gate 202g of the second transistor T2 is coupled to the reset signal line pattern, a first electrode of the second transistor T2 is coupled to the initialization signal line pattern, and a second electrode of the second transistor T2 is coupled to the gate of the driving transistor;

A gate 204g of the fourth transistor T4 is coupled to the gate line pattern GATE, a first electrode of the fourth transistor T4 is coupled to the data line pattern (DATA1 in FIG. 3), and a second electrode of the fourth transistor T4 is coupled to the first electrode of the driving transistor;

A gate 205g of the fifth transistor T5 is coupled to the light emission control signal pattern EM, and a first electrode of the fifth transistor T5 is coupled to the power supply signal pattern VDD;

A gate 206g of the sixth transistor T6 is coupled to the light-emitting control signal pattern EM, a first electrode of the sixth transistor T6 is coupled to a second electrode of the driving transistor, and a second electrode of the sixth transistor T6 is coupled to a light-emitting element in the sub-pixel;

The gate 207g of the seventh transistor T7 is coupled to a reset signal pattern (e.g., RST2) included in the next sub-pixel adjacent in the first direction, the first electrode of the seventh transistor T7 is coupled to an initialization signal pattern (e.g., VINT2) included in the next sub-pixel, and the second electrode of the seventh transistor T7 is coupled to a light-emitting element in the sub-pixel.

Specifically, a plurality of sub-pixels included in the display substrate may be arranged in an array, the plurality of sub-pixels may be divided into a plurality of rows of sub-pixels and a plurality of columns of sub-pixels, each row of the sub-pixels including a plurality of sub-pixels arranged in a second direction, each column of sub-pixels including a plurality of sub-pixels arranged in a first direction, the first direction intersecting the second direction.

It is noted that, the next sub-pixel adjacent to the first direction is the next sub-pixel adjacent to the seventh transistor T7 in the same column.

The sub-pixel and the sub-pixel driving circuit included in the sub-pixel driving circuit are in the above-described structure, so that the layout space occupied by the sub-pixel driving circuit can be effectively reduced while the operation performance of the sub-pixel driving circuit is ensured, thereby facilitating improvement of the resolution of the display substrate.

It should be noted that the gates of the transistors included in the sub-pixel driving circuit and the functional patterns coupled thereto may be integrated. For example, the gates of the first transistor and the fourth transistor are integrated with the corresponding coupled gate line patterns, the gates of the fifth transistor and the sixth transistor are integrated with the corresponding coupled light-emitting control signal line patterns, and the gates of the second transistor and the seventh transistor are integrated with the corresponding coupled reset signal line patterns.

In addition, the first transistor T1 is used for threshold compensation of the driving transistor (e.g., the third transistor T3), the second transistor T2 is used for resetting the gate of the driving transistor, the fourth transistor T4 is used for writing the data signal transmitted by the data line pattern, the fifth transistor T5 is used for writing the power signal transmitted by the power signal line pattern to the first electrode of the driving transistor, the sixth transistor T6 is used for controlling whether the corresponding light-emitting element emits light, and the seventh transistor T7 is used for resetting the anode of the light-emitting element.

In some embodiments, the sub-pixel further includes a gate line pattern GATE, a light emission control signal pattern EM, a reset signal pattern RST, and a power supply signal pattern VDD; The grid line pattern GATE, the light emission control signal line pattern EM, and the reset signal line pattern RST each extend in the second direction, the power supply signal line pattern VDD including a portion extending in the first direction; The orthographic projection of the first shielding member 404 on the substrate 50 overlaps the orthographic projection of the gate pattern GATE on the substrate 50 and the orthographic projection portion of the light emission control signal pattern EM on the substrate 50.

Specifically, the first shielding member 404 is arranged in the above-described manner so that the first shielding member 404 can combine both the first transistor T1 and the driving transistor with the target data line pattern (e.g., DATA2) quarantine, thereby more advantageously reducing data signal variation on the target data line pattern, crosstalk caused by the first transistor T1 and the driving transistor.

In some embodiments, the second electrode of the seventh transistor T7 is coupled to the light-emitting element in the sub-pixel in a plurality of ways. Exemplarily, the orthographic projection of the anode of the light-emitting element on the substrate overlaps the orthographic projection of the second electrode of the seventh transistor T7 on the substrate, and the anode of the light-emitting element can be coupled to the second electrode of the seventh transistor T7 through a via hole at the overlap; alternatively, the orthographic projection of the anode of the light-emitting element on the substrate does not overlap the orthographic projection of the second electrode of the seventh transistor T7 on the substrate, the sub-pixel driving circuit further includes a second conductive connection portion 406 and a third conductive connection portion 407, the orthographic projection of the anode of the light-emitting element on the substrate overlaps the orthographic projection of the first end of the third conductive connection portion 407 on the substrate, the anode of the light-emitting element is coupled to the first end of the third conductive connection portion 407 through a via hole at the overlap, the second end of the third conductive connection portion 407 overlaps the first end of the second conductive connection portion 406, the second end of the third conductive connection portion 407 is coupled to the first end of the second conductive connection portion 406 through a via hole at the overlap, and the orthographic projection of the second electrode of the seventh transistor T7 on the substrate overlaps the orthographic projection of the second end of the second conductive connection portion 406 on the substrate, The second electrode of the seventh transistor T7 is coupled to the second terminal of the second conductive connection portion 406 through a via hole at the overlap, so that the anode of the light-emitting element can be coupled to the second electrode of the seventh transistor T7 through the second conductive connection portion 406 and the third conductive connection portion 407.

When the anode of the light-emitting element is provided to be coupled to the second electrode of the seventh transistor T7 through the second conductive connection 406 and the third conductive connection 407, the second conductive connection 406 may include a portion extending in the first direction, the anode of the light-emitting element may be on the upper side of the light-emitting control signal pattern in its corresponding sub-pixel, and the second electrode of the seventh transistor T7 may be on the lower side of the light-emitting control signal pattern in its corresponding sub-pixel.

As shown in FIG. 15, the structure of the three-color sub-pixels will be described by taking the three-color sub-pixels shown in the figure as an example.

The light-emitting element in the first color sub-pixel includes a first anode 601, a first organic light-emitting material layer, and a first cathode, which are sequentially stacked in a direction away from the substrate; the orthographic projection of the first anode 601 on the substrate overlaps with the corresponding orthographic projection portion of the second electrode of the seventh transistor T7 on the substrate, and the first anode 601 is coupled to the corresponding second electrode of the seventh transistor T7 through a via hole at the overlap.

The light-emitting element in the second color sub-pixel includes a second anode 602, a second organic light-emitting material layer, and a second cathode, which are sequentially stacked in a direction away from the substrate; the orthographic projection of the second anode 602 on the substrate does not overlap with the forward projection of the corresponding second electrode of the seventh transistor T7 on the substrate, and the sub-pixel driving circuit in the second color sub-pixel further includes a second conductive connection 406 and a third conductive connection 407, and the second anode 602 is coupled to the corresponding second electrode of the seventh transistor T7 through the second conductive connection 406 and the third conductive connection 407.

The light-emitting element in the third color sub-pixel includes a third anode 603, a third organic light-emitting material layer, and a third cathode, which are sequentially stacked in a direction away from the substrate; an orthographic projection of the third anode 603 on the substrate overlaps with a corresponding orthographic projection portion of the second electrode of the seventh transistor T7 on the substrate, and the third anode 603 is coupled to the corresponding second electrode of the seventh transistor T7 through a via hole at the overlap.

For example, as shown in FIG. 15, the anode of the organic light-emitting element of each color sub-pixel includes a main part electrode and a connecting electrode, and the main part electrode has a hexagonal shape.

As shown in FIG. 15, the first anode 601 of the first color sub-pixel includes a first main part electrode 6011 and a first connection electrode 6012, the first main part electrode 6011 and the first connection electrode 6012 may be integrated, and the first connection electrode 6012 is connected to the second electrode of the seventh transistor T7 of the first color sub-pixel through a connection hole. The second anode 602 of the second color sub-pixel includes a second main part electrode 6021 and a second connecting electrode 6022, the second main part electrode 6021 and the second connecting electrode 6022 may be an integral structure, and the second connecting electrode 6022 is connected to the second electrode of the seventh transistor T7 of the second color sub-pixel through the second conductive connecting portion 406 and the third conductive connecting portion 407. The third anode electrode 603 of the third color sub-pixel includes a third main part electrode 6031 and a third connection electrode 6032, the third main part electrode 6031 and the third connection electrode 6032 may be of an integral structure, and the third connection electrode 6032 is connected to the second electrode of the seventh transistor T7 of the third color sub-pixel through the connection hole.

For example, the first connection electrode 6012 of the first color sub-pixel is on the side of the data line pattern in which the center of the first main part electrode 6011 is away from the sub-pixel pixel pixel circuit in the X direction, and on the side of the light emission control signal line in which the center of the first main part electrode 6011 is away from the sub-pixel pixel pixel circuit in the Y direction. For example, the first connection electrode 6012 of the first color sub-pixel and the first main part electrode 6011 are arranged in the Y direction, and the first connection electrode 6012 is located in the lower right corner of the first main part electrode 6011. For example, the second connection electrode 6022 of the second color sub-pixel is located at one side of the center of the second main part electrode 6021 away from the data line of the sub-pixel pixel pixel circuit in the X direction, and at one side of the center of the second main part electrode 6021 adjacent to the light emission control signal line of the sub-pixel pixel circuit in the Y direction. For example, the second connection electrode 6022 and the second main part electrode 6021 of the second color sub-pixel are arranged in the Y direction, and the second connection electrode 6022 is located in the lower right corner of the first main part electrode 1231. For example, the third connection electrode 6032 of the third color sub-pixel and the third main part electrode 6031 are arranged in the X direction, and the third connection electrode 6032 is on the right side of the third main part electrode 6031, that is, near the side of the sub-pixel pixel circuit near the shielding line.

As shown in FIG. 15, the first main part electrode 6011 of the first anode 601 of the first color sub-pixel covers the driving transistor of the first color sub-pixel, the second main part electrode 6021 of the second anode 602 of the second color sub-pixel and the driving transistor of the second color sub-pixel are substantially not overlapped or partially overlapped, and the third main part electrode 6031 of the third anode 603 of the third color sub-image and the driving transistor of the third color sub-pixel are not overlapped.

As shown in FIG. 15, a first main part electrode 6011 of a first color sub-pixel 601 (e.g., a blue sub-pixel) overlaps a gate line pattern and a light emission control signal line pattern; a second main part electrode 6021 of a second color sub-pixel (e.g., a red sub-pixel) overlaps the gate line pattern and the reset signal line pattern; a third main part electrode 6031 of a third color sub-pixel (for example, a green sub-pixel) overlaps with the light emission control signal line pattern, the reset signal line pattern of the next row sub-pixel driving circuit, and the initialization signal line pattern of the next row sub-pixel driving circuit. For example, the third main part electrode 6031 of the third color sub-pixel (e.g., green sub-pixel) overlaps the pixel driving circuit area of the next row of the first color sub-pixel (e.g., blue sub-pixel) adjacent thereto.

For example, the first main part electrode 6011 of the first color sub-pixel 601 overlaps with a portion of a driving transistor of an adjacent third color sub-pixel, and the first main part electrode 6011 of the first color sub-pixel 601 overlaps with a data line pattern in a sub-pixel driving circuit of the first color sub-pixel 601, a data line pattern in a sub-pixel driving circuit of the first shielding member 404, and a data line pattern in a sub-pixel driving circuit of an adjacent second color sub-pixel. The second main part electrode 6021 of the second color sub-pixel is not overlapped with the data line pattern in the sub-pixel driving circuit of the second color sub-pixel, and overlapped with the power supply signal line pattern in the sub-pixel driving circuit of the second color sub-pixel and the power supply signal line pattern and the data line pattern in the sub-pixel driving circuit of the adjacent third color sub-pixel. The third main part electrode 6031 of the third color sub-pixel overlaps both the data line pattern and the power supply signal line pattern in the sub-pixel driving circuit of the third color sub-pixel, and overlaps the power supply signal line pattern in the sub-pixel driving circuit of the adjacent second color sub-pixel.

For example, as shown in FIG. 15, the first main part electrode 6011 of the first color sub-pixel 601 is provided with a first connection electrode 6012 connected to the first main part electrode 6011 of the first color sub-pixel 601 near the next line reset signal line shape; a second main part electrode 6021 of the second color sub-pixel is provided with a second connection electrode 6022 connected to the second main part electrode 6021 near the next line reset signal line shape; The third main part electrode 6031 of the third color sub-pixel is provided with a third connection electrode 6032 connected to the third main part electrode 6031 of the third color sub-pixel adjacent to one side of the seventh transistor T7 thereof.

For example, as shown in FIG. 15, the first connection electrode 6012 of the first color sub-pixel 601 overlaps the second electrode of the seventh transistor T7 in the sub-pixel driving circuit thereof. The second connection electrode 6022 of the second color sub-pixel is not overlapped with the second electrode of the seventh transistor T7 in the sub-pixel driving circuit, and the second electrode of the seventh transistor T7 of the second color sub-pixel is overlapped with the third main part electrode 6031 of the third color sub-pixel. The third connection electrode 6032 of the third color sub-pixel overlaps with the second electrode of the seventh transistor T7 in the sub-pixel driving circuit.

An embodiment of the present disclosure further provides a display device including the display substrate in the above embodiment.

In the display substrate in the above-described embodiment, it is possible to reduce the influence of the signal change transmitted on the target data line pattern on the performance of the first transistor T1 by providing the first shielding member 404, thereby reducing the influence of the coupling between the gate (i.e., 203g) of the driving transistor and the target data line pattern, and reducing the problem of vertical crosstalk, so that a better display effect can be obtained when the display substrate is used for display. In addition, in the display substrate in the above embodiment, coupling the first shielding member 404 to the initialization signal line pattern enables the voltage of the initialization signal line pattern to be enhanced in addition to the first shielding member 404 having a fixed potential, so that the voltage of the initialization signal transmitted on the initialization signal line pattern is more stable, thereby facilitating the operation performance of the sub-pixel driving circuit.

Therefore, the display device according to the embodiment of the present invention also has the above advantageous effects when the display substrate is included, and details are not described herein.

It should be noted that the display device may be any product or component having a display function such as a television, a display, a digital photo frame, a mobile phone, or a tablet computer.

An embodiment of the present disclosure further provides a method of forming a display substrate, the method including:

forming a plurality of sub-pixels arranged in an array on a substrate 50; The sub-pixels include:
a data line pattern (DATA1 in FIG. 3) extending in a first direction;

an initialization signal line pattern (VINT1 in FIG. 3) including a portion extending in a second direction intersecting the first direction, the initialization signal line pattern configured to transmit an initialization signal having a fixed potential;

a sub-pixel driving circuit including a driving transistor (T3 in FIG. 3), a first transistor T1 coupled to a gate of the driving transistor, and a first shielding member 404 coupled to the initialization signal pattern, the first shielding member 404 having an orthographic projection on the substrate 50 between the orthographic projection of the first transistor T1 on the substrate 50 and an orthographic projection of a target data line pattern (DATA2 in FIG. 3) on the substrate 50; The target data line pattern is included in a next sub-pixel adjacent to the sub-pixel in the second direction.

When the display substrate is manufactured by using the forming method in the present disclosure, the first shielding member 404 coupled to the initialization signal line pattern (VINT1 in FIG. 3) is in the sub-pixel driving circuit, so that the first shielding member 404 has the same fixed potential as the initialization signal, and the orthographic projection of the first shielding member 404 on the substrate 50 is provided between the orthographic projection of the first transistor T1 on the substrate 50 and the orthographic projection of the target data line pattern (DATA2 in FIG. 3) on the substrate 50, so that the first shielding member 404 can reduce the influence of the signal transmitted on the target data line pattern on the performance of the first transistor T1, thereby reducing the influence of the coupling between the gate (i.e., 203g) of the driving transistor and the target data line pattern, and reducing the problem of vertical crosstalk, thereby enabling the display substrate to obtain a better display effect when used for display.

In addition, when the display substrate is manufactured by using the forming method in the embodiment of the present invention, the first shielding member 404 is coupled to the initialization signal pattern. In addition to the first shielding member 404 having a fixed potential, the voltage of the initialization signal pattern is enhanced, so that the voltage of the initialization signal transmitted on the initialization signal line pattern is more stable, thereby facilitating the operation performance of the sub-pixel driving circuit.

Figure 16:
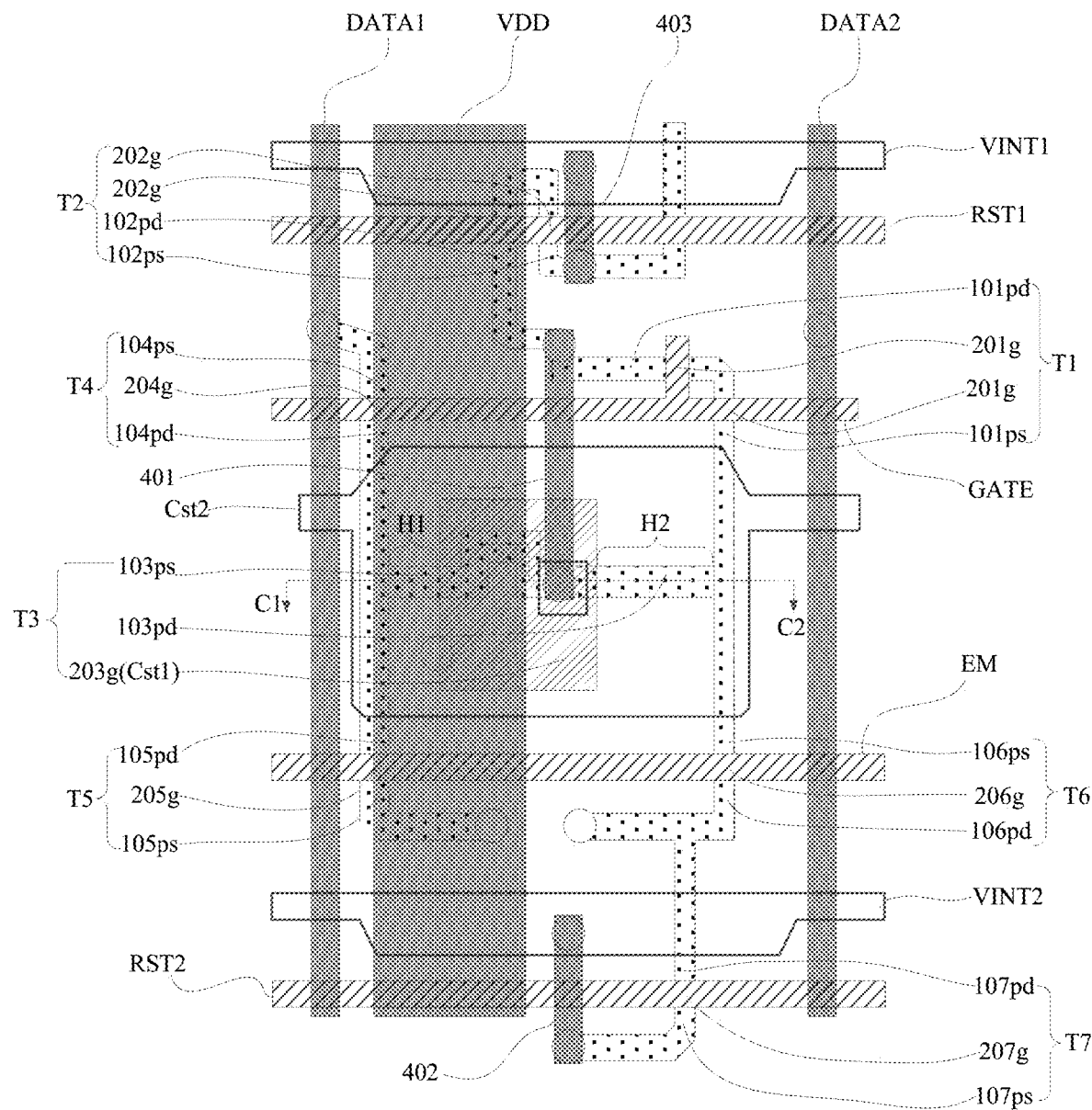
FIG. 16 is a seventh layout diagram of a sub-pixel driving circuit in a display substrate according to an embodiment of the present disclosure.

As shown in FIG. 16, an embodiment of the present disclosure further provides a display substrate including a substrate 50 and a plurality of sub-pixels arranged in an array on the substrate 50; the sub-pixels include:

a data line pattern (e.g., DATA1) extending in a first direction;

a power supply signal pattern VDD including a portion extending in the first direction;

a sub-pixel driving circuit including two switching transistors (e.g., a fourth transistor T4 and a fifth transistor T5), a driving transistor (e.g., a third transistor T3), and a storage capacitor Cst; a first electrode plate Cst1 of the storage capacitor Cst is coupled to a gate of the driving transistor (e.g., a gate 203g of the third transistor T3), and a second electrode plate Cst2 of the storage capacitor Cst is coupled to the power supply signal pattern VDD; the second electrodes of the two switching transistors, such as the drain D4 of the fourth transistor T4 and the drain D5 of the fifth transistor T5, are coupled to the first electrodes of the driving transistors, such as the source S3 of the third transistor T3, and the orthographic projection of the second electrodes of at least one of the two switching transistors on the substrate 50 at least partially overlaps the orthographic projection of the power supply signal pattern VDD on the substrate 50 and at least partially overlaps the orthographic projection of the second electrode plate Cst2 of the storage capacitor Cst on the substrate 50.

Specifically, the display substrate generally includes a plurality of sub-pixels arranged in an array, each sub-pixel including a data line pattern (e.g., DATA1) extending in a first direction, and a power supply signal line pattern VDD extending at least partially in the first direction; For example, the first direction includes a Y direction and the second direction includes an X direction.

It is noted that, the specific structure of the power supply signal pattern VDD is various. For example, the power supply signal pattern VDD is a grid-like structure in which a portion extending in the first direction is included in the power supply signal pattern VDD of the grid-like structure.

Each sub-pixel further includes a sub-pixel driving circuit, and a light-emitting element corresponding to the sub-pixel driving circuit one by one, the light-emitting element including an anode, an organic light-emitting material layer, and a cathode arranged in a stacked manner, where the anode of the light-emitting element is coupled to the corresponding sub-pixel driving circuit, and the light-emitting element emits light under the driving of the driving signal provided by the sub-pixel driving circuit.

In more detail, as shown in FIG. 16, the gate 203g of the third transistor T3 (i.e., the driving transistor) is multiplexed with the first electrode plate Cst1 of the storage capacitor Cst, the second electrode plate Cst2 of the storage capacitor Cst is on the side of the first electrode plate Cst1 away from the substrate, the orthographic projection of the first electrode plate Cst1 on the substrate at least partially overlaps the orthographic projection of the second electrode plate Cst2 on the substrate, and the orthographic projection of the second electrode plate Cst2 on the substrate, the orthographic projection of the second electrode plate Cst2 on the substrate with the second electrode of at least one of the fourth transistor T4 and the fifth transistor T5 on the substrate 50, and the orthographic projection of the power supply signal pattern VDD on the substrate 50 are all at least partially overlapped.

According to the specific structure of the display substrate, in the display substrate in the embodiment of the present disclosure, the second electrode plate Cst2 of the storage capacitor Cst is coupled to the power supply signal pattern VDD so that the second electrode plate Cst2 of the storage capacitor Cst has the same fixed potential as the power supply signal transmitted on the power supply signal pattern VDD; At the same time, the second electrodes of the two switching transistors are arranged to be coupled to the first electrodes of the driving transistors, the orthographic projection of the second electrodes of at least one of the two switching transistors on the substrate 50 at least partially overlaps the orthographic projection of the power supply signal pattern VDD on the substrate 50 and at least partially overlaps the orthographic projection of the second electrode plate Cst2 of the storage capacitor Cst on the substrate 50, so that the second electrode plate Cst2 of the storage capacitor Cst and the power supply signal pattern VDD can both block the second electrodes of at least one of the two switching transistors, thereby reducing signals on other conductive patterns (such as signal line patterns) located around the periphery of the at least one of the two switching transistors, crosstalk phenomena generated on the second electrodes of the at least one of the two switching transistors, and thereby reducing crosstalk phenomena generated on the first electrodes of the driving transistors.

As shown in FIG. 16, in some embodiments, the second electrodes of the two switching transistors (e.g., the fourth transistor T4 and the fifth transistor T5) are integrated with the first electrode of the driving transistor (e.g., the third transistor T3), and the integrated structure includes a first conductive portion 108 extending in the first direction, orthogonally projection of the first conductive portion 108 on the substrate, orthogonally projected on the substrate with the power supply signal pattern VDD, and the second electrode plate Cst2 of the storage capacitor Cst being orthogonally projected on the substrate 50 having a first overlapping region that does not overlap the orthogonally projection on the substrate 50 with the data line pattern (e.g., DATA1).

Specifically, the second electrodes of the two switching transistors and the first electrodes of the driving transistors are integrally formed so that the second electrodes of the two switching transistors and the first electrodes of the driving transistors can be formed by a one-time patterning process.

In the display substrate in the above embodiment, the integrated structure includes a first conductive portion 108 extending in the first direction, the orthographic projection of the data line pattern on the substrate is on the side of the orthographic projection of the first conductive portion 108 on the substrate away from the orthographic projection of the driving transistor on the substrate, and the orthographic projection of the first conductive portion 108 on the substrate, the orthographic projection of the first conductive portion 108 on the substrate, the orthographic projection of the power supply signal pattern VDD on the substrate, and the orthographic projection of the second electrode plate Cst2 of the storage capacitor Cst on the substrate 50 are provided with a first overlapping region, so that both the second electrode plate Cst2 of the storage capacitor Cst and the power supply signal pattern VDD can block the first conductive portion 108, thereby reducing a signal transmitted on the data line pattern, generating crosstalk to the first conductive portion 108, and further reducing a crosstalk phenomenon generated to the first electrode of the driving transistor.

As shown in FIG. 16, in some embodiments, an orthographic projection of the first electrode of the drive transistor on the substrate 50 may be provided, inside an orthographic projection of the second electrode electrode plate Cst2 of the storage capacitor Cst on the substrate.

The above arrangement enables the second electrode plate Cst2 of the storage capacitor Cst to completely cover the first electrode of the driving transistor, thereby more effectively reducing the crosstalk phenomenon caused to the first electrode of the driving transistor by the signal transmitted on the data line pattern.

Figure 17:
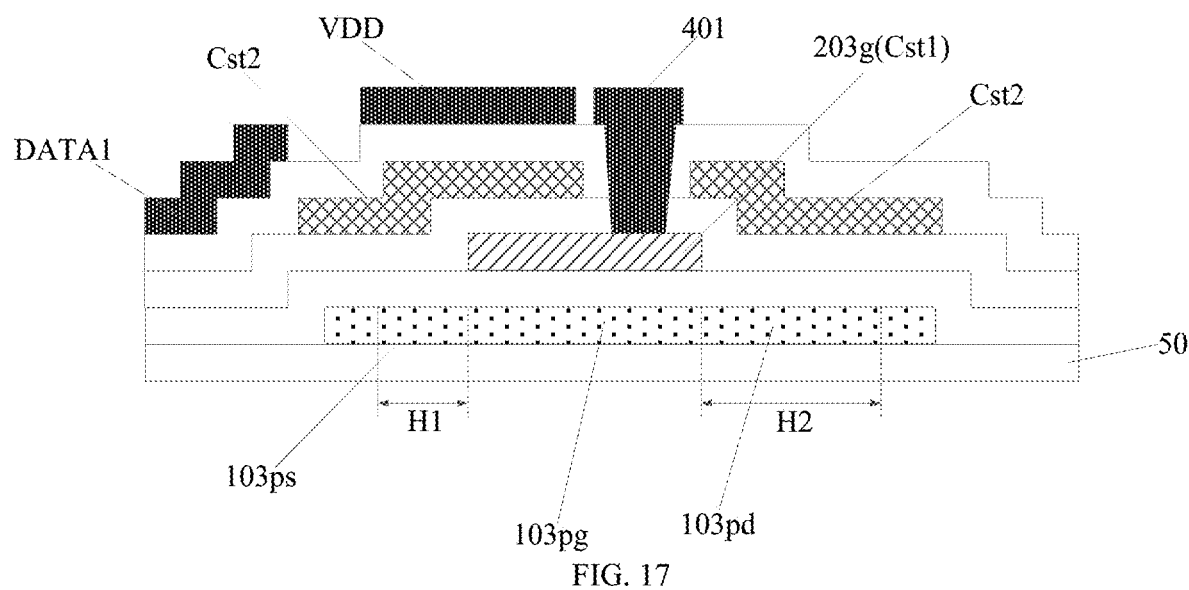
FIG. 17 is a schematic cross-sectional view in the C1C2 direction of FIG. 16.

As shown in FIGS. 16 and 17, in some embodiments, the sub-pixel further includes a gate line pattern GATE and a light emission control signal pattern EM each extending in a second direction, the second direction intersecting the first direction;

The sub-pixel driving circuit further includes a first transistor T1 and a sixth transistor T6; The two switching transistors include a fourth transistor T4 and a fifth transistor T5;

The gate 204g of the fourth transistor T4 is coupled to the gate line pattern GATE, the first electrode of the fourth transistor T4 is coupled to the data line pattern (e.g., DATA1), the second electrode of the fourth transistor T4 is coupled to the second electrode of the fifth transistor T5, the gate 205g of the fifth transistor T5 is coupled to the light emission control signal pattern EM, and the first electrode of the fifth transistor T5 is coupled to the power supply signal pattern VDD;

The gate electrode 201g of the first transistor T1 is coupled to the gate line pattern GATE, the second electrode of the first transistor T1 is coupled to the gate electrode of the driving transistor, and the first electrode of the first transistor T1, the first electrode of the sixth transistor T6 and the second electrode of the driving transistor are formed in an integrated structure including a second conductive portion 109 extending in the first direction, the gate electrode 206g of the sixth transistor T6 is coupled to the light-emitting control signal pattern EM, and the second electrode of the sixth transistor T6 is coupled to a light-emitting element in the sub-pixel;

An orthographic projection of the channel region of the driving transistor (103pg in FIG. 18) on the substrate, between the orthographic projection of the first conductive portion 108 on the substrate 50 and the orthographic projection of the second conductive portion 109 on the substrate 50; And in the second direction, the minimum distance between the orthographic projection of the channel region of the driving transistor on the substrate and the orthographic projection of the first conductive portion 108 on the substrate is smaller than the minimum distance between the orthographic projection of the channel region on the substrate 50 and the orthographic projection of the second conductive portion 109 on the substrate.

Specifically, a plurality of sub-pixels included in the display substrate may be arranged in an array, the plurality of sub-pixels may be divided into a plurality of rows of sub-pixels and a plurality of columns of sub-pixels, each row of the sub-pixels including a plurality of sub-pixels arranged in a second direction, each column of sub-pixels including a plurality of sub-pixels arranged in a first direction, the first direction intersecting the second direction. A sub-pixel driving circuit included in each column of sub-pixels is located between a data line pattern included in the column of sub-pixels and a data line pattern included in a next column of sub-pixels adjacent to the column of sub-pixels.

It is noted that, the minimum distance between the orthogonal projection of the channel region of the driving transistor on the substrate and the orthogonal projection of the first conductive portion 108 on the substrate in the second direction refers to the distance between the orthogonal projection of the channel region of the driving transistor on the substrate in the second direction and the orthogonal projection of the first conductive portion 108 on the substrate closest to the boundary of the orthogonal projection of the first conductive portion 108 on the substrate; The minimum distance between the orthogonal projection of the channel region on the substrate 50 and the orthogonal projection of the second conductive portion 109 on the substrate in the second direction is the distance between the orthogonal projection of the channel region of the driving transistor on the substrate, the boundary of the orthogonal projection of the second conductive portion 109 on the substrate, and the orthogonal projection of the second conductive portion 109 on the substrate in the second direction.

Figure 25:
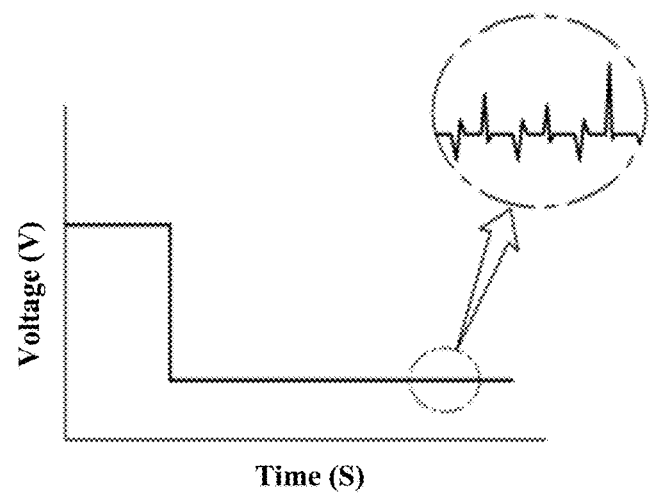
FIG. 25 is a schematic diagram of a crosstalk phenomenon occurring at a gate of a driving transistor in the related art.

In more detail, each sub-pixel includes a sub-pixel driving circuit located between two adjacent data line patterns (e.g., DATA1 and DATA2). Since the data transmitted on the two data line patterns changes, when the data changes, crosstalk is easily generated to the gate of the driving transistor in the sub-pixel driving circuit, as shown in FIG. 25, thereby affecting the operation stability of the driving transistor.

In the technical solution in the above embodiment, each of the fourth transistor T4, the fifth transistor T5, the first transistor T1, and the sixth transistor T6 is in a peripheral region of the driving transistor, and one (e.g., DATA1) of the two data line patterns is provided on one side of the fourth transistor T4 and the fifth transistor T5 far away from the driving transistor, and the other (e.g., DATA2) of the two data line patterns is provided on one side of the first transistor T1 and the sixth transistor T6 far away from the driving transistor; Simultaneously providing an orthographic projection of the channel region of the driving transistor (103pg in FIG. 18) on the substrate, between the orthographic projection of the first conductive portion 108 on the substrate 50 and the orthographic projection of the second conductive portion 109 on the substrate 50, and a minimum distance between the orthographic projection of the channel region of the driving transistor on the substrate and the orthographic projection of the first conductive portion 108 on the substrate is smaller than a minimum distance between the orthographic projection of the channel region on the substrate and the orthographic projection of the second conductive portion 109 on the substrate; It is possible to make the channel region of the driving transistor maximally increase the distance between the channel region of the driving transistor and the DATA2 while ensuring that the channel region of the driving transistor meets an appropriate distance from the DATA1, thereby better reducing crosstalk caused by the DATA2 to the driving transistor.

Further, since a portion of the channel region of the driving transistor close to the DATA1 can be covered by the power supply signal pattern VDD, crosstalk caused by the DATA1 to the channel region of the driving transistor can be effectively reduced. Therefore, even if the channel region of the driving transistor is close to the DATA, crosstalk is less affected by the crosstalk.

In addition, since the second electrode plate Cst2 of the storage capacitor Cst has the same fixed potential as the power supply signal transmitted on the power supply signal pattern VDD, and the orthographic projection of the first conductive portion 108 on the base, the orthographic projection of the first conductive portion 108 on the base with the power supply signal pattern VDD, and the orthographic projection of the second electrode plate Cst2 of the storage capacitor Cst on the base 50 have the first overlapping region, both the second electrode plate Cst2 of the storage capacitor Cst and the power supply signal pattern VDD are shielded from the first conductive portion 108, the signal transmitted on the DATA1 is reduced, and crosstalk is generated on the first conductive portion 108, thereby reducing crosstalk phenomenon generated on the first electrode of the driving transistor and the channel region.

As shown in FIG. 16, in some embodiments, the sub-pixel further includes a gate line pattern GATE and a light emission control signal pattern EM each extending in a second direction, the second direction intersecting the first direction;

The sub-pixel driving circuit further includes a first transistor T1 and a sixth transistor T6; The two switching transistors include a fourth transistor T4 and a fifth transistor T5;

The gate 204g of the fourth transistor T4 is coupled to the gate line pattern GATE, the first electrode of the fourth transistor T4 is coupled to the data line pattern (e.g., DATA1), the second electrode of the fourth transistor T4 is coupled to the second electrode of the fifth transistor T5, the gate 205g of the fifth transistor T5 is coupled to the light emission control signal pattern EM, and the first electrode of the fifth transistor T5 is coupled to the power supply signal pattern VDD;

The gate electrode 201g of the first transistor T1 is coupled to the gate line pattern GATE, the second electrode of the first transistor T1 is coupled to the gate electrode of the driving transistor, and the first electrode of the first transistor T1, the first electrode of the sixth transistor T6 and the second electrode of the driving transistor are formed in an integrated structure including a second conductive portion 109 extending in the first direction, the gate electrode 206g of the sixth transistor T6 is coupled to the light-emitting control signal pattern EM, and the second electrode of the sixth transistor T6 is coupled to a light-emitting element in the sub-pixel;

An orthographic projection of the channel region of the driving transistor (103pg in FIG. 18) on the substrate, between the orthographic projection of the first conductive portion 108 on the substrate and the orthographic projection of the second conductive portion 109 on the substrate; Each of the first and second electrodes of the driving transistor includes a first portion extending in the second direction, and a length of the first portion of the first electrode in the second direction is different from a length of the first portion of the second electrode extending in the second direction.

Specifically, each of the first and second electrodes provided with the driving transistor includes a first portion extending in the second direction, and a length of the first portion of the first electrode extending in the second direction is different from a length of the first portion of the second electrode extending in the second direction, specifically including:

In the first case, the length H1 of the first portion of the first electrode in the second direction is smaller than the length H2 of the first portion of the second electrode extending in the second direction, so that the channel region of the driving transistor (103pg in FIG. 18) is close to the data line pattern (e.g., DATA1) included in the sub-pixel in which it is located and is far away from the data line pattern (e.g., DATA2) included in the next sub-pixel adjacent to the sub-pixel in which it is located in the second direction, so that the channel region of the driving transistor maximally increases the distance between the channel region of the driving transistor and the DATA2 while ensuring that the proper distance from the DATA1 is met, thereby better reducing crosstalk of the DATA2 to the driving transistor. At the same time, since both the second electrode plate Cst2 of the storage capacitor Cst and the power supply signal line pattern VDD can block the first conductive portion 108, the signal transmitted on the DATA1 is reduced, crosstalk is generated to the first conductive portion 108, and crosstalk caused to the first electrode and the channel region of the driving transistor is reduced.

In a second case, the length of the first portion of the first electrode in the second direction is greater than the length of the first portion of the second electrode extending in the second direction, so that the channel region of the drive transistor (103pg in FIG. 18) is away from the data line pattern (e.g., DATA1) included in the sub-pixel in which it is located and is close to the data line pattern (e.g., DATA2) included in the next sub-pixel adjacent to the sub-pixel in which it is located in the second direction, enabling the channel region of the drive transistor to maximize the distance between the channel region of the drive transistor and the DATA1 while ensuring that a suitable distance is met with DATA2, thereby better reducing crosstalk of the drive transistor by the DATA1. Further, when the display substrate includes the first shielding member, and the first shielding member can completely block the DATA2 from the second conductive portion 109, the signal transmitted on the DATA2 can be reduced, and crosstalk is generated to the second conductive portion 109, thereby reducing crosstalk caused to the second electrode and the channel region of the driving transistor.

As shown in FIG. 16, in some embodiments, the sub-pixel further includes an initialization signal pattern (e.g., VINT1) including a portion extending in a second direction intersecting the first direction, the initialization signal pattern configured to transmit an initialization signal having a fixed potential;

The sub-pixel driving circuit further includes a second transistor T2 coupled to the gate of the driving transistor, the second transistor T2 including:

A first semiconductor pattern, a second semiconductor pattern, and a third conductor pattern coupled to the first semiconductor pattern and the second semiconductor pattern, the third conductor pattern having a conductivity superior to conductivities of the first semiconductor pattern and the second semiconductor pattern;

A first gate pattern and a second gate pattern coupled, an orthographic projection of the first gate pattern on the substrate at least partially overlapping with an orthographic projection of the first semiconductor pattern on the substrate, an orthographic projection of the second gate pattern on the substrate at least partially overlapping with an orthographic projection of the second semiconductor pattern on the substrate;

The orthographic projection of the third conductor pattern on the substrate does not overlap with the orthographic projection of the first gate pattern on the substrate and the orthographic projection of the second gate pattern on the substrate;

An orthographic projection of the third conductor pattern on the substrate at least partially overlaps with an orthographic projection of the initialization signal pattern on the substrate.

Specifically, as shown in FIG. 16, the above-mentioned second transistor T2 is a double-gate structure including the first semiconductor pattern and the second semiconductor pattern formed as channel regions of the second transistor T2 (corresponding to the positions of the marks 102pg in FIG. 18), and including the third conductor pattern 102px whose conductivity is superior to conductivities of the first semiconductor pattern and the second semiconductor pattern due to doping, and the second transistor T2 includes the first gate pattern and the second gate pattern which correspondingly cover the first semiconductor pattern and the second semiconductor pattern, and can collectively serve as the gate 202g of the second transistor T2.

In the second transistor T2 of the above-described structure, since the third conductor pattern 102px has good conductivity and is not covered by the gate pattern, it is easy to couple with other conductive patterns in the vicinity of the third conductor pattern 102px, and crosstalk is generated. According to the above-described embodiment, by providing an orthographic projection of the third conductor pattern on the substrate 50, and at least partially overlapping with the orthographic projection of the initialization signal line pattern on the substrate 50, the initialization signal line pattern can cover the third conductor pattern 102px. Since an initialization signal having a fixed potential is transmitted on the initialization signal line pattern, coupling between the third conductor pattern 102px and other conductive patterns in the vicinity of the third conductor pattern 102px is preferably reduced, so that the operation performance of the display substrate is more stable.

Figure 18:
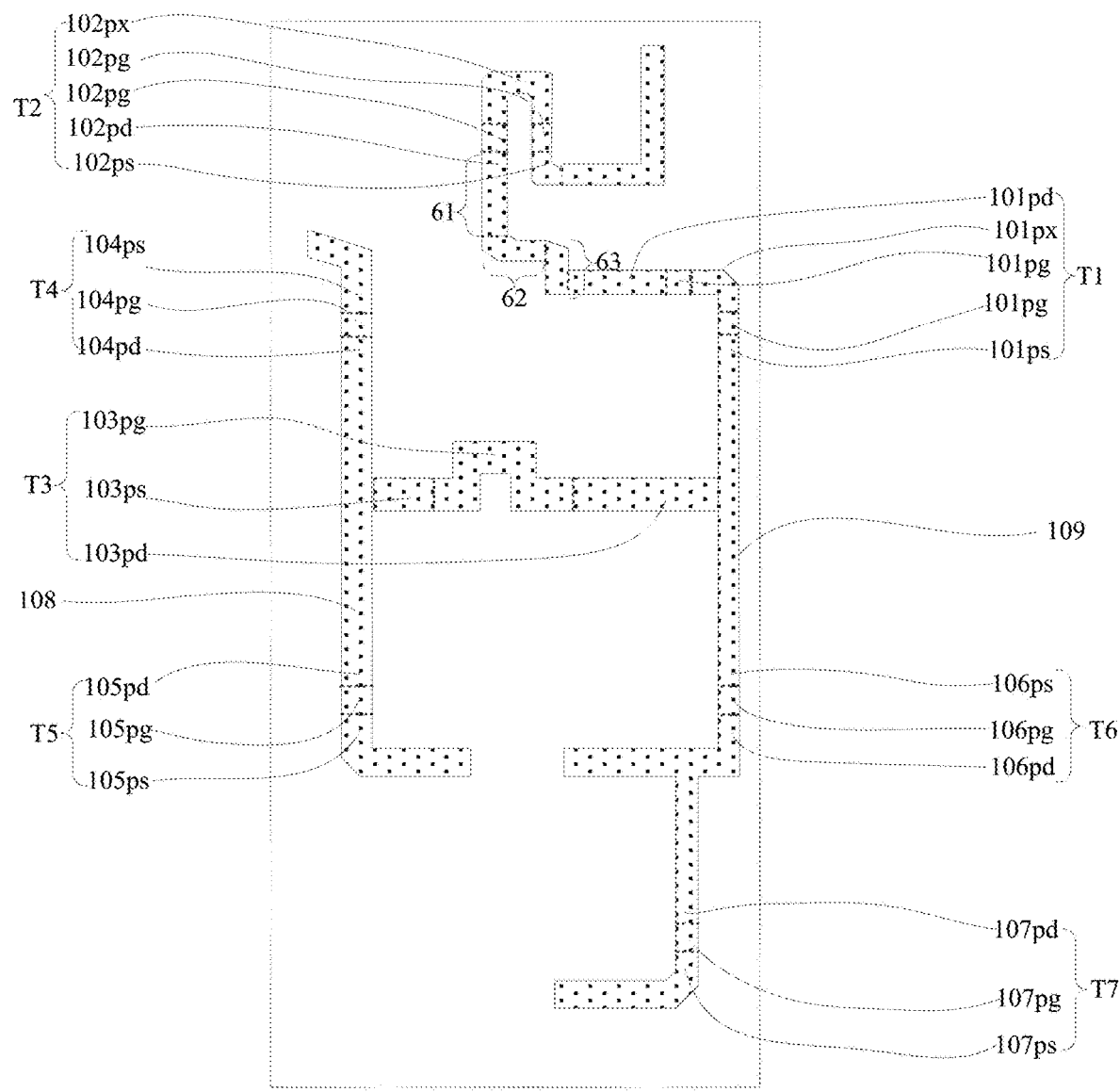
FIG. 18 is a schematic diagram of a second layout of an active film layer according to an embodiment of the present disclosure.

As shown in FIGS. 16 and 18, in some embodiments, the sub-pixel driving circuit further includes a first extension extending from the first semiconductor pattern, the first extension having a superior conductivity to the first semiconductor pattern; The first extension includes a first portion 61, a second portion 62, and a third portion 63, each extending in the first direction, the second portion 62 extending in the second direction, one end of the second portion 62 coupled to the first portion 61, and the other end of the second portion 62 coupled to the third portion 63; The third portion 63 is coupled to the first transistor T1 at an end away from the second portion 62.

Specifically, the first extension portion and the first semiconductor pattern may be formed in a one-time patterning process, and after the first semiconductor pattern is formed, the first extension portion is doped so that the first extension portion is superior in conductivity to the first semiconductor pattern.

After the first shielding member 404 is added, the first extension portion is provided so that when the second transistor T2 is coupled to the first transistor T1 and the gate of the driving transistor, through the first extension portion, it is more advantageous to reduce the influence of the signal change transmitted on the target data line pattern on the performance of the first transistor T1 and the performance of the second transistor T2, thereby reducing the influence of the coupling between the gate of the driving transistor (i.e., 203g) and the target data line pattern, and reducing the problem of vertical crosstalk, so that the display substrate can obtain a better display effect when used for display.

In some embodiments, the first transistor includes:

A fourth semiconductor pattern, a fifth semiconductor pattern, and a sixth conductor pattern coupled to the fourth semiconductor pattern and the fifth semiconductor pattern, the sixth conductor pattern having a conductivity superior to conductivities of the fourth semiconductor pattern and the fifth semiconductor pattern;

A third gate pattern and a fourth gate pattern coupled to the third gate pattern, the orthographic projection of the third gate pattern on the substrate and the orthographic projection portion of the fourth semiconductor pattern on the substrate, the orthographic projection of the fourth gate pattern on the substrate and the orthographic projection portion of the fifth semiconductor pattern on the substrate;

The orthographic projection of the sixth conductor pattern on the substrate and the orthographic projection of the third gate pattern on the substrate, and the orthographic projection of the fourth gate pattern on the substrate do not overlap.

Specifically, as shown in FIG. 16, the first transistor is a double-gate structure including the fourth semiconductor pattern and the fifth semiconductor pattern formed as channel regions of the first transistor (corresponding to the marks 101pg in FIG. 18), and including the sixth conductor pattern 101px whose conductivity is superior to conductivities of the fourth semiconductor pattern and the fifth semiconductor pattern due to doping, and the first transistor includes a third gate pattern and a fourth gate pattern that cover the fourth semiconductor pattern and the fifth semiconductor pattern one by one, and can collectively serve as a gate 201g of the first transistor T1.

Figure 19:
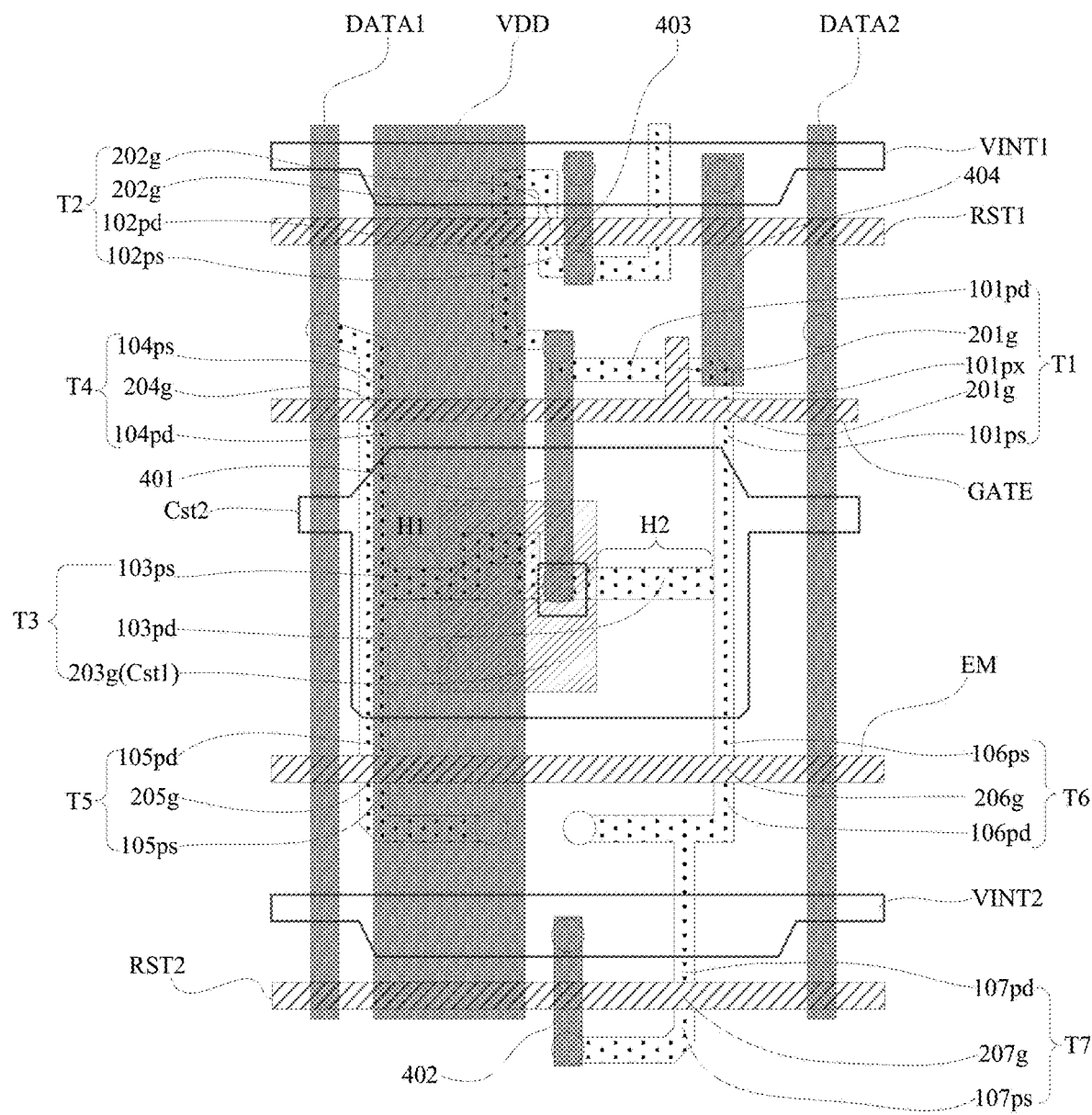
FIG. 19 is an eighth layout diagram of a sub-pixel driving circuit in a display substrate according to an embodiment of the present disclosure.

As shown in FIG. 19, in some embodiments, the sub-pixel further includes an initialization signal pattern (e.g., VINT1) including a portion extending in a second direction intersecting the first direction, the initialization signal pattern configured to transmit an initialization signal having a fixed potential;

The sub-pixel driving circuit further includes a first shielding member 404 coupled to the initialization signal line pattern, the first shielding member 404 having an orthographic projection on the substrate 50 at least partially overlapped with the orthographic projection of the sixth conductor pattern 101px on the substrate 50.

In the technical solution in the above embodiment, the first shielding member 404 can cover the sixth conductor pattern 101px by providing an orthographic projection of the first shielding member 404 on the substrate 50 and at least partially overlapping with the orthographic projection of the sixth conductor pattern 101px on the substrate 50, and since the first shielding member 404 has a fixed potential, coupling between the sixth conductor pattern 101px and other conductive patterns in the vicinity of the sixth conductor pattern 101px is better reduced, so that the operation performance of the display substrate is more stable.

Figure 20:
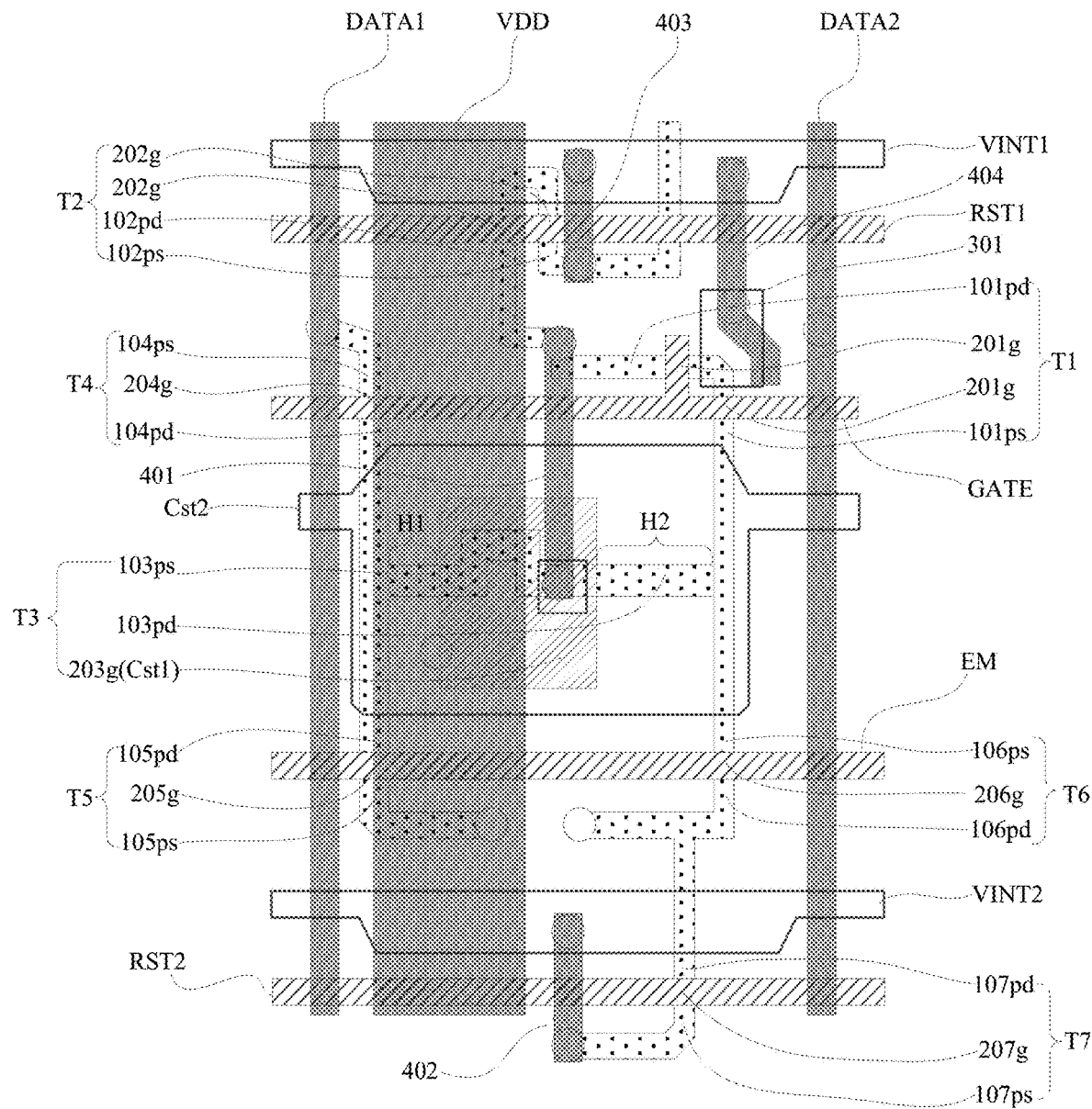
FIG. 20 is a ninth layout diagram of a sub-pixel driving circuit in a display substrate according to an embodiment of the present disclosure.

As shown in FIG. 20, in some embodiments, the sub-pixel further includes an initialization signal pattern (e.g., VINT1) including a portion extending in a second direction intersecting the first direction, the initialization signal pattern configured to transmit an initialization signal having a fixed potential;

The sub-pixel driving circuit further includes a first shielding member 404 coupled to the initialization signal line pattern, and a second shielding member 301 coupled to the first shielding member 404, the second shielding member 301 having an orthographic projection on the substrate at least partially overlapped with the orthographic projection of the sixth conductor pattern on the substrate.

Specifically, the orthographic projection of the second shielding member 301 provided on the substrate 50 at least partially overlaps with the orthographic projection of the sixth conductor pattern 101px on the substrate 50, so that the second shielding member 301 can cover the sixth conductor pattern 101px, and since the second shielding member 301 is coupled to the first shielding member 404, the second shielding member 301 has a fixed potential, thereby better reducing the coupling effect between the sixth conductor pattern 101px and other conductive patterns in the vicinity thereof, so that the operation performance of the display substrate is more stable.

Therefore, in the display substrate in the above embodiment, since the first shielding member 404 and the second shielding member 301 each have a fixed potential, the parasitic capacitance formed between the first transistor T1 and the target data line pattern (e.g., DATA2) is better prevented or reduced, and the vertical crosstalk defect is effectively prevented or reduced.

Figure 21:
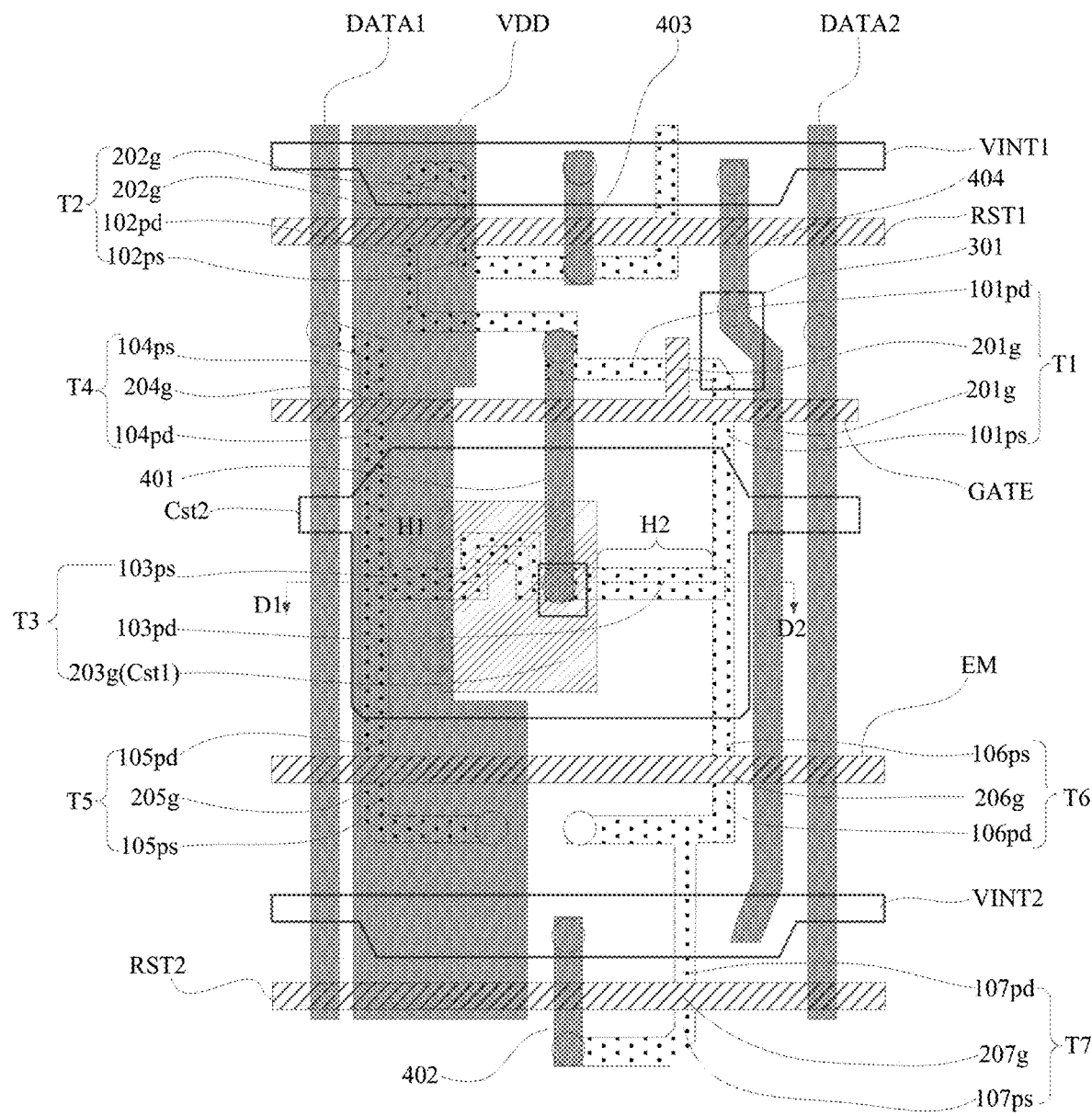
FIG. 21 is a tenth layout diagram of a sub-pixel driving circuit in a display substrate according to an embodiment of the present disclosure.
Figure 22:
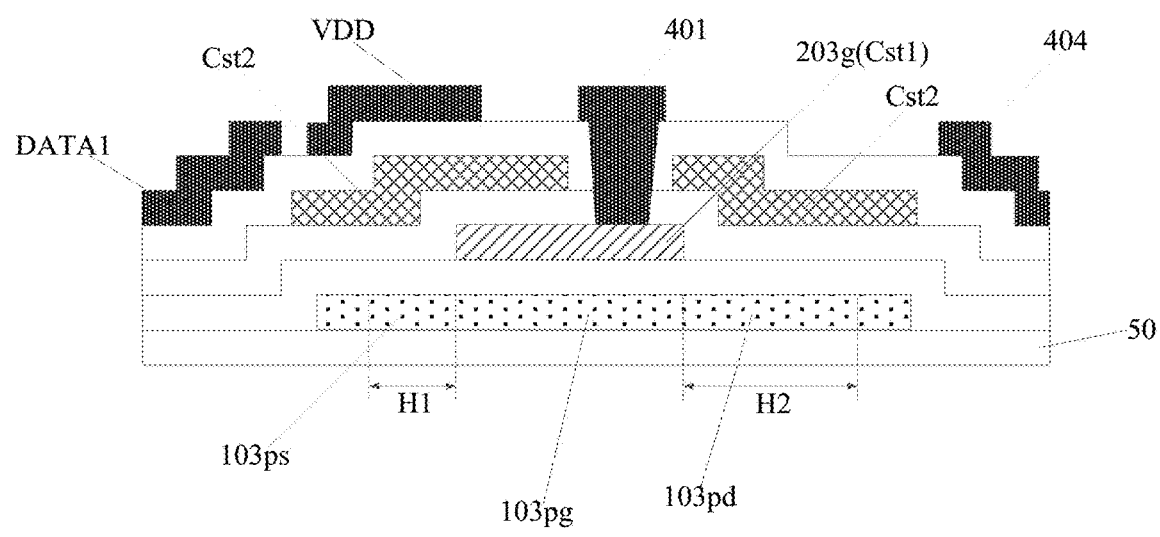
FIG. 22 is a schematic cross-sectional view in the D1D2 direction of FIG. 21.

As shown in FIGS. 21 and 22, in some embodiments, the plurality of sub-pixels includes a plurality of rows of sub-pixels, each row of the sub-pixels including a plurality of the sub-pixels arranged in the second direction, and the initialization signal lines corresponding to the rows of sub-pixels are formed by sequentially coupling the initialization signal lines in the same row of sub-pixels; The first shielding member 404 extends in the first direction and is coupled to two adjacent initialization signal lines.

In some embodiments, the shape of the power supply signal pattern may be laid out according to actual needs, illustratively, along the second direction, the width of the power supply signal pattern in the vicinity of the channel region of the driving transistor is smaller than the width thereof in the vicinity of the channel region of the driving transistor, so that the influence of the power supply signal pattern on the gate of the driving transistor can be reduced in the vicinity of the channel region of the driving transistor.

Figure 23:
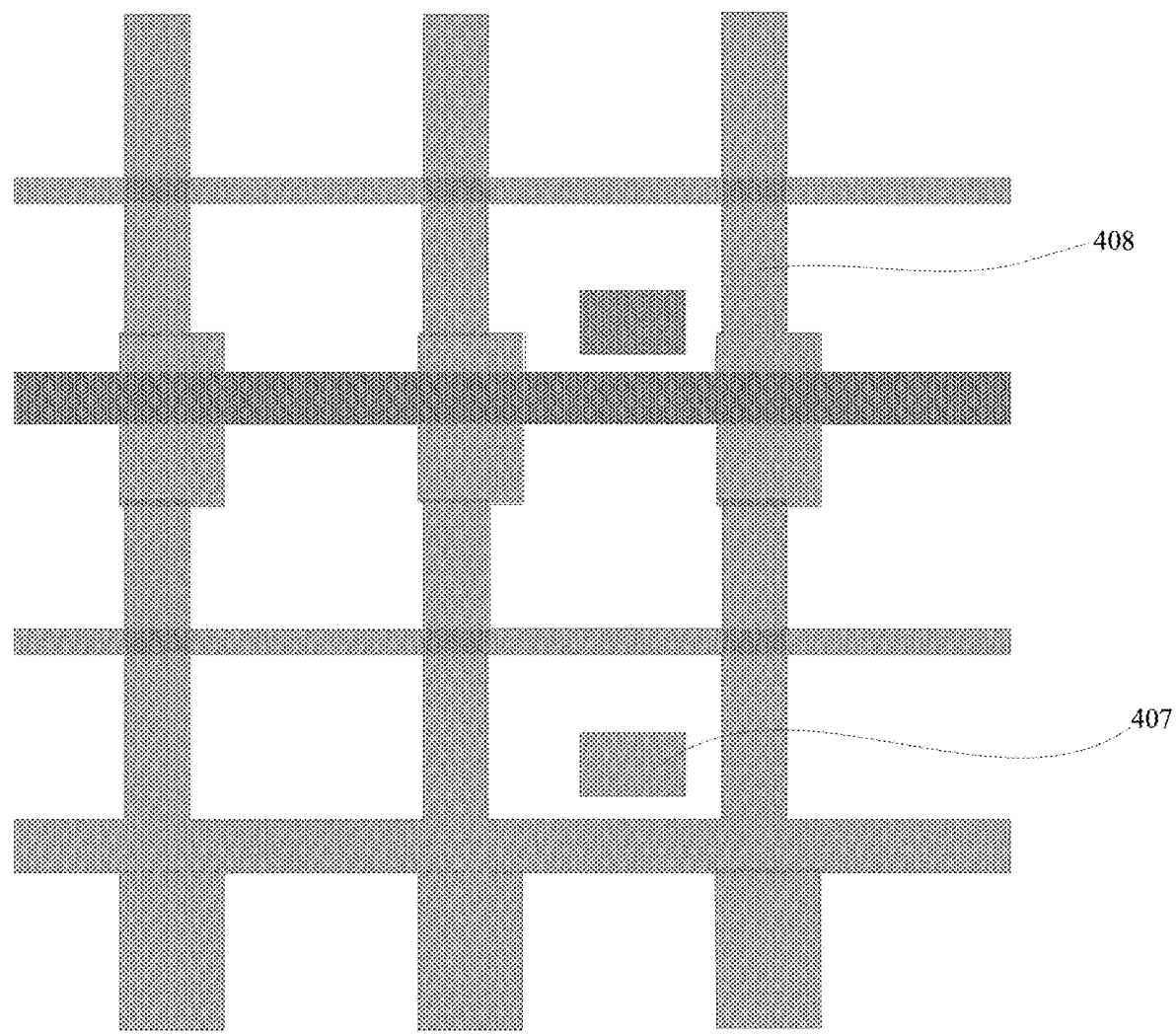
FIG. 23 is a schematic layout of a third metal layer.

In some embodiments, as shown in FIG. 23, a compensation pattern 408 may be in the display substrate and connected in parallel with the power supply signal pattern to improve transmission performance of the power supply signal pattern. It is noted that, the compensation pattern 408 may be in the same layer as the third conductive connection portion 407 so that the compensation pattern 408 may be formed in the same patterning process as the third conductive connection portion 407.

In some embodiments, in one sub-pixel, the orthographic projection of the power signal pattern VDD on the substrate completely covers the orthographic projection of the first conductive portion 108 on the substrate.

In some embodiments, in one sub-pixel, an orthographic projection of the power supply signal line pattern VDD on the substrate, an orthographic projection of a first semiconductor pattern, a second semiconductor pattern, and a third conductor pattern covering the second transistor T2 on the substrate, while also covering at least a portion of the orthographic projection of the first electrode of the second transistor T2 on the substrate, and at least a portion of the orthographic projection of the second electrode of the second transistor T2 on the substrate.

In some embodiments, the first shield member 404 is an extended structure extending from the initialization signal pattern.

Specifically, the first shielding member 404 is provided as an extended structure extending from the initialization signal line pattern so that the first shielding member 404 and the initialization signal line pattern can be formed in the same patterning process, thereby better simplifying the forming process flow of the display substrate.

As shown in FIG. 20, in some embodiments, the first shielding member 404 is at a different layer from the initialization signal line pattern, and an orthographic projection of the first shielding member 404 on the substrate 50 and an orthographic projection of the initialization signal line pattern on the substrate 50 overlap at a first overlapping region, and the first shielding member is coupled to the initialization signal line pattern through a first via-hole in the first overlapping region;

The second shielding member 301 and the first shielding member 404 are in a different layer, and there is a second overlapping region between the orthographic projection of the second shielding member 301 on the substrate 50 and the orthographic projection of the first shielding member 404 on the substrate 50, and the second shielding member 301 and the first shielding member 404 are coupled through a second via-hole in the second overlapping region.

Specifically, the first shielding member 404 may be in the same layer or different layer as the initialization signal line shape, and when the first shielding member 404 is in the different layer as the initialization signal line shape, an orthographic projection of the first shielding member 404 on the substrate 50 may be provided, and there is a first overlap area with the orthographic projection of the initialization signal line shape on the substrate 50, so that coupling between the first shielding member 404 and the initialization signal line may be realized by providing the first through hole in the first overlap area. Similarly, the second shielding member 301 may be in the same layer or different layers from the first shielding member 404, and when the second shielding member 301 is in different layers from the first shielding member 404, a second overlapping region may exist between the orthographic projection of the second shielding member 301 on the substrate 50 and the orthographic projection of the first shielding member 404 on the substrate 50, so that coupling between the second shielding member 301 and the first shielding member 404 can be realized through the second via-hole by providing the second via-hole in the second overlapping region.

In some embodiments, the first shield member 404 is disposed in the same material as the data line pattern.

In some embodiments, the display substrate includes a first interlayer insulating layer, and both the first shield member 404 and the data line pattern are on a surface of the first interlayer insulating layer away from the substrate.

Specifically, the first shielding member 404 is in the manner described above, so that the first shielding member 404 and the data line pattern can be simultaneously formed on the surface of the first interlayer insulating layer away from the substrate by the one-time patterning process, thereby avoiding the addition of an additional patterning process for forming the first shielding member 404, thereby simplifying the forming process of the display substrate and saving the forming cost.

In some embodiments, the second shielding member 301 is arranged of the same material as the initialization signal pattern.

In some embodiments, the display substrate further includes a second interlayer insulating layer, the second shielding member 301 and the initialization signal pattern are both on a surface of the second interlayer insulating layer away from the substrate.

Specifically, the second shielding member 301 and the initialization signal line pattern (VINT1 in FIG. 3) are made of a same material, and both the second shielding member 301 and the initialization signal line pattern (VINT1 in FIG. 3) are on the surface of the second interlayer insulating layer away from the substrate, so that the second shielding member 301 and the initialization signal line pattern can be simultaneously formed in the same primary patterning process, thereby avoiding the addition of an additional forming process specifically for forming the second shielding member 301, thereby simplifying the forming process of the display substrate and saving the production cost.

In some embodiments, the first electrode plate Cst1 of the storage capacitor Cst is multiplexed as the gate of the drive transistor, the second electrode plate Cst2 of the storage capacitor Cst is provided of the same material as the second shielding member 301, and the second electrode plate Cst2 of the storage capacitor Cst is on the surface of the second interlayer insulating layer away from the substrate 50.

Specifically, the storage capacitor Cst included in the sub-pixel driving circuit has a first electrode plate Cst1 and a second electrode plate Cst2, the first electrode plate Cst1 and the second electrode plate Cst2 are oppositely disposed, and the first electrode plate Cst1 is coupled to the gate of the driving transistor, and the second electrode plate Cst2 is coupled to the power supply signal line pattern VDD. When the storage capacitor Cst is arranged, the first electrode plate Cst1 can be directly multiplexed as the gate of the driving transistor, so that the storage capacitor Cst can be coupled to the gate of the driving transistor, the space occupied by the sub-pixel driving circuit is reduced, and the resolution of the display substrate can be improved. In addition, the second electrode plate Cst2 in the storage capacitor Cst is provided on the surface of the second interlayer insulating layer away from the substrate, so that the second electrode plate Cst2 in the storage capacitor Cst can be formed simultaneously with the second shielding member 301 and the initialization signal pattern in the same patterning process, thereby simplifying the forming process of the display substrate and saving the production cost.

In some embodiments, the sub-pixel further includes a reset signal pattern (e.g., RST1) extending in a second direction intersecting the first direction, the sub-pixel driving circuit further includes:

A first conductive connection 405 whose orthographic projection on the substrate 50 covers at least part of the orthographic projection of the sixth conductor pattern 101px on the substrate 50;

A second transistor T2 having a first electrode (e.g., source S2) coupled to the initialization signal line pattern (e.g., VINT1) through the first conductive connection 405, a second electrode (e.g., drain D2) of the second transistor T2 coupled to the gate of the driving transistor, and a gate 202g of the second transistor T2 coupled to the reset signal line pattern (e.g., RST1).

Specifically, the first conductive connection portion 405 may be made of a metal material and may be formed in the same patterning process as the data line pattern.

The orthographic projection of the first conductive connection portion 405 on the substrate 50 covers at least a part of the orthographic projection of the sixth conductive pattern 101px on the substrate 50, so that the first conductive connection portion 405 can cover the sixth conductive pattern 101px, and since the first conductive connection portion 405 is coupled to the initialization signal line pattern, the first conductive connection portion 405 has a fixed potential, thereby better reducing the coupling effect between the sixth conductive pattern 101px and other conductive patterns in the vicinity of the first conductive connection portion 405, thereby making the operation performance of the display substrate more stable.

As shown in FIG. 16, in some embodiments, the sub-pixel further includes a gate line pattern GATE, a light emission control signal pattern EM, a reset signal pattern (e.g., RST1), and an initialization signal pattern (e.g., VINT1); The grid line pattern GATE, the light emission control signal line pattern EM, the reset signal line pattern and the initialization signal line pattern each extend in a second direction, the second direction intersecting the first direction;

The two switching transistors include a fourth transistor T4 and a fifth transistor T5;

The sub-pixel driving circuit further includes a first transistor T1, a second transistor T2, a sixth transistor T6, and a seventh transistor T7;

A gate of the driving transistor, such as a gate 203g of a third transistor T3, is coupled to a second electrode of the first transistor T1, a first electrode of the driving transistor is coupled to a second electrode of the fifth transistor T5, and a second electrode of the driving transistor is coupled to a first electrode of the first transistor T1;

A gate 201g of the first transistor T1 is coupled to the gate pattern GATE;

A gate 202g of the second transistor T2 is coupled to the reset signal line pattern, a first electrode of the second transistor T2 is coupled to the initialization signal line pattern, and a second electrode of the second transistor T2 is coupled to the gate of the driving transistor;

A gate 204g of the fourth transistor T4 is coupled to the gate line pattern GATE, a first electrode of the fourth transistor T4 is coupled to the data line pattern (DATA1 in FIG. ( )), and a second electrode of the fourth transistor T4 is coupled to the first electrode of the driving transistor;

A gate 205g of the fifth transistor T5 is coupled to the light emission control signal pattern EM, and a first electrode of the fifth transistor T5 is coupled to the power supply signal pattern VDD;

A gate 206g of the sixth transistor T6 is coupled to the light-emitting control signal pattern EM, a first electrode of the sixth transistor T6 is coupled to a second electrode of the driving transistor, and a second electrode of the sixth transistor T6 is coupled to a light-emitting element in the sub-pixel;

The gate 207g of the seventh transistor T7 is coupled to a reset signal pattern (e.g., RST2) included in the next sub-pixel adjacent in the first direction, the first electrode of the seventh transistor T7 is coupled to an initialization signal pattern (e.g., VINT2) included in the next sub-pixel, and the second electrode of the seventh transistor T7 is coupled to a light-emitting element in the sub-pixel.

Specifically, a plurality of sub-pixels included in the display substrate may be arranged in an array, the plurality of sub-pixels may be divided into a plurality of rows of sub-pixels and a plurality of columns of sub-pixels, each row of the sub-pixels including a plurality of sub-pixels arranged in a second direction, each column of sub-pixels including a plurality of sub-pixels arranged in a first direction, the first direction intersecting the second direction.

It is noted that, the next sub-pixel adjacent to the first direction is the next sub-pixel adjacent to the seventh transistor T7 in the same column.

The sub-pixel and the sub-pixel driving circuit included in the sub-pixel driving circuit are in the above-described structure, so that the layout space occupied by the sub-pixel driving circuit can be effectively reduced while the operation performance of the sub-pixel driving circuit is ensured, thereby facilitating improvement of the resolution of the display substrate.

An embodiment of the present disclosure further provides a display device including the display substrate in the above embodiment.

In the display substrate in the above embodiment, a second electrode plate Cst2 provided with the storage capacitor Cst is coupled to the power supply signal pattern VDD so that the second electrode plate Cst2 of the storage capacitor Cst has the same fixed potential as the power supply signal transmitted on the power supply signal pattern VDD; At the same time, the second electrodes of the two switching transistors are arranged to be coupled to the first electrodes of the driving transistors, the orthographic projection of the second electrodes of at least one of the two switching transistors on the substrate 50 at least partially overlaps the orthographic projection of the power supply signal pattern VDD on the substrate 50 and at least partially overlaps the orthographic projection of the second electrode plate Cst2 of the storage capacitor Cst on the substrate 50, so that the second electrode plate Cst2 of the storage capacitor Cst and the power supply signal pattern VDD can both block the second electrodes of at least one of the two switching transistors, thereby reducing signals on other conductive patterns (such as signal line patterns) located around the periphery of the at least one of the two switching transistors, crosstalk phenomena generated on the second electrodes of the at least one of the two switching transistors, and thereby reducing crosstalk phenomena generated on the first electrodes of the driving transistors.

Therefore, the display device according to the embodiment of the present invention also has the above advantageous effects when the display substrate is included, and details are not described herein.

An embodiment of the present disclosure further provides a method of fabricating a display substrate, the method including: Fabricating a plurality of sub-pixels distributed in an array on a substrate; The sub-pixel includes a data line pattern extending in a first direction; A power signal line pattern including a portion extending in the first direction; A sub-pixel driving circuit including two switching transistors, a driving transistor, and a storage capacitor; A first electrode plate of the storage capacitor is coupled to a gate of the drive transistor, and a second electrode plate of the storage capacitor is coupled to the power supply signal line pattern; A second electrode of each of the two switching transistors is coupled to a first electrode of the driving transistor, an orthographic projection of at least one of the two switching transistors on the substrate, an orthographic projection of at least one of the two switching transistors at least partially overlapped with the power supply signal line pattern on the substrate, and an orthographic projection of at least partially overlapped with the second electrode electrode plate of the storage capacitor on the substrate.

In the display substrate manufactured by using the forming method in the present disclosure, a second electrode plate Cst2 of the storage capacitor Cst is coupled to the power supply signal pattern VDD so that the second electrode plate Cst2 of the storage capacitor Cst has the same fixed potential as the power supply signal transmitted on the power supply signal pattern VDD; At the same time, the second electrodes of the two switching transistors are arranged to be coupled to the first electrodes of the driving transistors, the orthographic projection of the second electrodes of at least one of the two switching transistors on the substrate 50 at least partially overlaps the orthographic projection of the power supply signal pattern VDD on the substrate 50 and at least partially overlaps the orthographic projection of the second electrode plate Cst2 of the storage capacitor Cst on the substrate 50, so that the second electrode plate Cst2 of the storage capacitor Cst and the power supply signal pattern VDD can both block the second electrodes of at least one of the two switching transistors, thereby reducing signals on other conductive patterns (such as signal line patterns) located around the periphery of the at least one of the two switching transistors, crosstalk phenomena generated on the second electrodes of the at least one of the two switching transistors, and thereby reducing crosstalk phenomena generated on the first electrodes of the driving transistors.

It should be noted that the various embodiments in this specification have been described in a progressive manner, and that the same and similar parts among the various embodiments can be referred to each other, and that each embodiment highlights differences from other embodiments. In particular, with respect to the method embodiment, since it is substantially similar to the product embodiment, the description is relatively simple, and the related matter can be referred to the partial description of the product embodiment.

Unless defined otherwise, technical or scientific terms used in the present disclosure shall be in the ordinary sense understood by those of ordinary skill in the art to which the disclosure belongs. As used in this disclosure, "first," "second," and like words do not denote any order, number, or importance, but are merely used to distinguish between different components. "Including" and the like are intended to mean that an element or article preceding the word encompasses an element or article recited after the word and equivalents thereof, but not other elements or articles rule out "connected" and the like are not limited to physical or mechanical connections, but may include electrical connections, whether direct or indirect. "upper", "lower", "left" and "right" are only to refer to a relative position, and the absolute position of the described objects is changed, the relative position relationship thereof are also changed.

It will be appreciated that when an element, such as a layer, film, region, or substrate, is referred to as being located directly "above" or "under" another object.

In the description of the above embodiments, specific features, structures, materials, or features may be combined in any one or more embodiments or examples in a suitable manner.

The foregoing description is merely illustrative of the specific embodiments of the present disclosure, but the scope of protection of the present disclosure is not limited thereto. Variations or substitutions may readily occur to those skilled in the art within the technical scope of the present disclosure, and are intended to be included within the scope of protection of the present disclosure. Accordingly, the scope of the present disclosure should is subject to the scope of the claims.

What is claimed is:

1. A display substrate, comprising a substrate and a plurality of sub-pixels arranged in an array on the substrate, wherein the sub-pixels comprise:
    a data line pattern extending in a first direction;
    an initialization signal line pattern comprising a portion extending in a second direction intersecting the first direction, wherein the initialization signal line pattern is configured to transmit an initialization signal having a fixed potential; and
    a sub-pixel driving circuit comprising a driving transistor, a first transistor coupled to a gate of the driving transistor, and a first shielding member coupled to the initialization signal line pattern, wherein an orthographic projection of the first shielding member on the substrate is between an orthographic projection of the first transistor on the substrate and an orthographic projection of a target data line pattern on the substrate; the target data line pattern is arranged in a next sub-pixel adjacent to a sub-pixel in the second direction,
    wherein the first shielding member is at a different layer from the initialization signal line pattern, an orthographic projection of the first shielding member on the substrate and an orthographic projection of the initialization signal line pattern on the substrate overlap at a first overlapping region, and the first shielding member is coupled to the initialization signal line pattern through a first via-hole in the first overlapping region,
    wherein the first transistor comprises:
        a fourth semiconductor pattern, a fifth semiconductor pattern, and a sixth conductor pattern coupled to the fourth semiconductor pattern and the fifth semiconductor pattern, the sixth conductor pattern having a conductivity superior to conductivities of the fourth semiconductor pattern and the fifth semiconductor pattern; and
        a third gate pattern and a fourth gate pattern coupled to the third gate pattern,
    wherein the orthographic projection of the third gate pattern on the substrate partially overlaps with the orthographic projection portion of the fourth semiconductor pattern on the substrate, the orthographic projection of the fourth gate pattern on the substrate partially overlaps with the orthographic projection portion of the fifth semiconductor pattern on the substrate, wherein an orthographic projection of the sixth conductor pattern on the substrate does not overlap with the orthographic projection of the third gate pattern on the substrate and the orthographic projection of the fourth gate pattern on the substrate, wherein the sub-pixel driving circuit further comprises a second shielding member provided with the fixed potential, wherein an orthographic projection of the second shielding member on the substrate at least partially overlaps with the orthographic projection of the sixth conductor pattern on the substrate, and wherein the sub-pixel further comprises a gate line pattern, a light emission control signal line pattern, a reset signal line pattern, and a power supply signal line pattern; the gate line pattern, the light emission control signal line pattern, and the reset signal line pattern each extends in the second direction, the power supply signal line pattern comprises a portion extending in the first direction.

2. The display substrate according to claim 1, wherein the plurality of sub-pixels arranged in the array comprise a plurality of rows of sub-pixels, each row of the sub-pixels comprises the sub-pixels arranged in the second direction, and a plurality of initialization signal lines corresponding to the rows of sub-pixels are formed by sequentially coupling the initialization signal line patterns in the same row of sub-pixels;

the first shielding member extends in the first direction and is coupled to at least one of the initialization signal lines.

3. The display substrate according to claim 1, wherein the first shielding member and the data line pattern are made of a same material.

4. The display substrate according to claim 1, wherein the display substrate comprises a first interlayer insulating layer, and the first shielding member and the data line pattern are both on a surface of the first interlayer insulating layer away from the substrate.

5. The display substrate according to claim 1, wherein the sub-pixel driving circuit further comprises a second transistor coupled to a gate of the driving transistor, the second transistor comprises:

a first semiconductor pattern, a second semiconductor pattern, and a third conductor pattern coupled to the first semiconductor pattern and the second semiconductor pattern, the third conductor pattern having a conductivity superior to conductivities of the first semiconductor pattern and the second semiconductor pattern;

a first gate pattern and a second gate pattern, an orthographic projection of the first gate pattern on the substrate at least partially overlapping with an orthographic projection of the first semiconductor pattern on the substrate, an orthographic projection of the second gate pattern on the substrate at least partially overlapping with an orthographic projection of the second semiconductor pattern on the substrate;

wherein an orthographic projection of the third conductor pattern on the substrate does not overlap with the orthographic projection of the first gate pattern on the substrate and the orthographic projection of the second gate pattern on the substrate;

the orthographic projection of the third conductor pattern on the substrate at least partially overlaps with an orthographic projection of the initialization signal pattern on the substrate.

6. The display substrate according to claim 5, wherein the sub-pixel driving circuit further comprises a first extension portion extending from the first semiconductor pattern, a conductivity of the first extension portion is superior to the conductivity of the first semiconductor pattern;

the first extension comprises a first portion, a second portion and a third portion, the first portion and the third portion each extends in the first direction, the second portion extends in the second direction, one end of the second portion is coupled to the first portion, and the other end of the second portion is coupled to the third portion;

an end of the third portion away from the second portion is coupled to the first transistor.

7. The display substrate according to claim 1, wherein the second shielding member and the first shielding member are in different layers, an orthographic projection of the second shielding member on the substrate and the orthographic projection of the first shielding member on the substrate overlaps at a second overlapping region, and the second shielding member and the first shielding member are coupled through a second via-hole in the second overlapping region.

8. The display substrate according to claim 1, wherein the second shielding member and the initialization signal line pattern are made of a same material.

9. The display substrate according to claim 1, wherein the display substrate further comprises a second interlayer insulating layer, the second shielding member and the initialization signal pattern are both on a surface of the second interlayer insulating layer away from the substrate.

10. The display substrate according to claim 9, wherein the sub-pixel further comprises a power signal line pattern, the power signal line pattern comprising a portion extending in the first direction, the sub-pixel drive circuit further comprises a storage capacitor, a first electrode plate of the storage capacitor is used as a gate of the drive transistor, a second electrode plate of the storage capacitor is coupled to the power signal line pattern, and the second electrode plate of the storage capacitor is on a surface of the second interlayer insulating layer away from the substrate.

11. The display substrate according to claim 1, wherein the sub-pixel driving circuit further comprises a second transistor, a fourth transistor, a fifth transistor, a sixth transistor, and a seventh transistor;

a gate of the driving transistor is coupled to a second electrode of the first transistor, a first electrode of the driving transistor is coupled to a second electrode of the fifth transistor, and a second electrode of the driving transistor is coupled to a first electrode of the first transistor;

a gate of the first transistor is coupled to the gate line pattern;

a gate of the second transistor is coupled to the reset signal line pattern, a first electrode of the second transistor is coupled to the initialization signal line pattern, and a second electrode of the second transistor is coupled to a gate of the driving transistor;

a gate of the fourth transistor is coupled to the gate line pattern, a first electrode of the fourth transistor is coupled to the data line pattern, and a second electrode of the fourth transistor is coupled to the first electrode of the driving transistor;

a gate of the fifth transistor is coupled to the light emission control signal line pattern, and a first electrode of the fifth transistor is coupled to the power supply signal line pattern;

a gate of the sixth transistor is coupled to the light-emitting control signal line pattern, a first electrode of the sixth transistor is coupled to a second electrode of the driving transistor, and a second electrode of the sixth transistor is coupled to a light-emitting element in the sub-pixel;

a gate of the seventh transistor is coupled to a reset signal pattern arranged in a next sub-pixel adjacent in the first direction, a first electrode of the seventh transistor is coupled to an initialization signal pattern arranged in the next sub-pixel, and a second electrode of the seventh transistor is coupled to a light-emitting element in the sub-pixel.

12. A display substrate comprising a substrate and a plurality of sub-pixels arranged in an array on the substrate; the sub-pixels comprise:

a data line pattern extending in a first direction;

an initialization signal line pattern comprising a portion extending in a second direction intersecting the first direction, the initialization signal line pattern is configured to transmit an initialization signal having a fixed potential;

a sub-pixel driving circuit comprising a driving transistor, a first transistor coupled to a gate of the driving transistor and a first shielding member coupled to the initialization signal line pattern, wherein the first shielding member is configured to form a coupling capacitor with a first electrode of the first transistor, an orthographic projection of the first shielding member on the substrate does not overlap with an orthographic projection of a target data line pattern on the substrate; the target data line pattern is arranged in a next sub-pixel adjacent to the sub-pixel in the second direction, wherein the first shielding member is at a different layer from the initialization signal line pattern, an orthographic projection of the first shielding member on the substrate and an orthographic projection of the initialization signal line pattern on the substrate overlap at a first overlapping region, and the first shielding member is coupled to the initialization signal line pattern through a first via-hole in the first overlapping region, wherein the first transistor comprises:
 a fourth semiconductor pattern, a fifth semiconductor pattern, and a sixth conductor pattern coupled to the fourth semiconductor pattern and the fifth semiconductor pattern, the sixth conductor pattern having a conductivity superior to conductivities of the fourth semiconductor pattern and the fifth semiconductor pattern; and
 a third gate pattern and a fourth gate pattern coupled to the third gate pattern, wherein the orthographic projection of the third gate pattern on the substrate partially overlaps with the orthographic projection portion of the fourth semiconductor pattern on the substrate, the orthographic projection of the fourth gate pattern on the substrate partially overlaps with the orthographic projection portion of the fifth semiconductor pattern on the substrate, wherein an orthographic projection of the sixth conductor pattern on the substrate does not overlap with the orthographic projection of the third gate pattern on the substrate and the orthographic projection of the fourth gate pattern on the substrate, wherein the sub-pixel driving circuit further comprises a second shielding member provided with the fixed potential, wherein an orthographic projection of the second shielding member on the substrate at least partially overlaps with the orthographic projection of the sixth conductor pattern on the substrate, and wherein the sub-pixel further comprises a gate line pattern, a light emission control signal line pattern, a reset signal line pattern, and a power supply signal line pattern; the gate line pattern, the light emission control signal line pattern, and the reset signal line pattern each extends in the second direction, the power supply signal line pattern comprises a portion extending in the first direction.

13. The display substrate according to claim 12, wherein the plurality of sub-pixels arranged in the array comprise a plurality of rows of sub-pixels, each row of the sub-pixels comprises the sub-pixels arranged in the second direction, and a plurality of initialization signal lines corresponding to the rows of sub-pixels are formed by sequentially coupling the initialization signal line patterns in the same row of sub-pixels;
 the first shielding member extends in the first direction and is coupled to at least one of the initialization signal lines.

14. The display substrate according to claim 12, wherein the first shielding member and the data line pattern are made of a same material.

15. The display substrate according to claim 12, wherein the display substrate comprises a first interlayer insulating layer, and the first shielding member and the data line pattern are both on a surface of the first interlayer insulating layer away from the substrate.

16. The display substrate according to claim 12, wherein the sub-pixel driving circuit further comprises a second transistor coupled to a gate of the driving transistor, the second transistor comprises:
 a first semiconductor pattern, a second semiconductor pattern, and a third conductor pattern coupled to the first semiconductor pattern and the second semiconductor pattern, the third conductor pattern having a conductivity superior to conductivities of the first semiconductor pattern and the second semiconductor pattern;
 a first gate pattern and a second gate pattern, an orthographic projection of the first gate pattern on the substrate at least partially overlapping with an orthographic projection of the first semiconductor pattern on the substrate, an orthographic projection of the second gate pattern on the substrate at least partially overlapping with an orthographic projection of the second semiconductor pattern on the substrate;
 wherein an orthographic projection of the third conductor pattern on the substrate does not overlap with the orthographic projection of the first gate pattern on the substrate and the orthographic projection of the second gate pattern on the substrate;
 the orthographic projection of the third conductor pattern on the substrate at least partially overlaps with an orthographic projection of the initialization signal pattern on the substrate.

17. The display substrate according to claim 16, wherein the sub-pixel driving circuit further comprises a first extension portion extending from the first semiconductor pattern, a conductivity of the first extension portion is superior to the conductivity of the first semiconductor pattern;
 the first extension comprises a first portion, a second portion and a third portion, the first portion and the third portion each extends in the first direction, the second portion extends in the second direction, one end of the second portion is coupled to the first portion, and the other end of the second portion is coupled to the third portion;
an end of the third portion away from the second portion is coupled to the first transistor.

18. The display substrate according to claim 12, wherein the second shielding member and the first shielding member are in different layers, an orthographic projection of the second shielding member on the substrate and the orthographic projection of the first shielding member on the substrate overlaps at a second overlapping region, and the second shielding member and the first shielding member are coupled through a second via-hole in the second overlapping region.

19. The display substrate according to claim 12, wherein the second shielding member and the initialization signal line pattern are made of a same material.

20. The display substrate according to claim 12, wherein the display substrate further comprises a second interlayer insulating layer, the second shielding member and the initialization signal pattern are both on a surface of the second interlayer insulating layer away from the substrate.

21. The display substrate according to claim 20, wherein the sub-pixel further comprises a power signal line pattern, the power signal line pattern comprising a portion extending in the first direction, the sub-pixel drive circuit further comprises a storage capacitor, a first electrode plate of the storage capacitor is used as a gate of the drive transistor, a second electrode plate of the storage capacitor is coupled to the power signal line pattern, and the second electrode plate of the storage capacitor is on a surface of the second interlayer insulating layer away from the substrate.

22. The display substrate according to claim 12, wherein the sub-pixel driving circuit further comprises a second transistor, a fourth transistor, a fifth transistor, a sixth transistor, and a seventh transistor;
a gate of the driving transistor is coupled to a second electrode of the first transistor, a first electrode of the driving transistor is coupled to a second electrode of the fifth transistor, and a second electrode of the driving transistor is coupled to a first electrode of the first transistor;
a gate of the first transistor is coupled to the gate line pattern;
a gate of the second transistor is coupled to the reset signal line pattern, a first electrode of the second transistor is coupled to the initialization signal line pattern, and a second electrode of the second transistor is coupled to a gate of the driving transistor;
a gate of the fourth transistor is coupled to the gate line pattern, a first electrode of the fourth transistor is coupled to the data line pattern, and a second electrode of the fourth transistor is coupled to the first electrode of the driving transistor;
a gate of the fifth transistor is coupled to the light emission control signal line pattern, and a first electrode of the fifth transistor is coupled to the power supply signal line pattern;
a gate of the sixth transistor is coupled to the light-emitting control signal line pattern, a first electrode of the sixth transistor is coupled to a second electrode of the driving transistor, and a second electrode of the sixth transistor is coupled to a light-emitting element in the sub-pixel;
a gate of the seventh transistor is coupled to a reset signal pattern arranged in a next sub-pixel adjacent in the first direction, a first electrode of the seventh transistor is coupled to an initialization signal pattern arranged in the next sub-pixel, and a second electrode of the seventh transistor is coupled to a light-emitting element in the sub-pixel.

23. A method of forming a display substrate, comprising:
forming a plurality of sub-pixels arranged in an array on a substrate, wherein the sub-pixels comprise:
a data line pattern extending in a first direction;
an initialization signal line pattern comprising a portion extending in a second direction intersecting the first direction, wherein the initialization signal line pattern is configured to transmit an initialization signal having a fixed potential;
a sub-pixel driving circuit comprising a driving transistor, a first transistor coupled to a gate of the driving transistor, and a first shielding member coupled to the initialization signal line pattern, wherein an orthographic projection of the first shielding member on the substrate is between an orthographic projection of the first transistor on the substrate and an orthographic projection of a target data line pattern on the substrate; the target data line pattern is arranged in a next sub-pixel adjacent to a sub-pixel in the second direction,
wherein the first shielding member is at a different layer from the initialization signal line pattern, an orthographic projection of the first shielding member on the substrate and an orthographic projection of the initialization signal line pattern on the substrate overlap at a first overlapping region, and the first shielding member is coupled to the initialization signal line pattern through a first via-hole in the first overlapping region,
wherein the first transistor comprises:
a fourth semiconductor pattern, a fifth semiconductor pattern, and a sixth conductor pattern coupled to the fourth semiconductor pattern and the fifth semiconductor pattern, the sixth conductor pattern having a conductivity superior to conductivities of the fourth semiconductor pattern and the fifth semiconductor pattern; and
a third gate pattern and a fourth gate pattern coupled to the third gate pattern,
wherein the orthographic projection of the third gate pattern on the substrate partially overlaps with the orthographic projection portion of the fourth semiconductor pattern on the substrate, the orthographic projection of the fourth gate pattern on the substrate partially overlaps with the orthographic projection portion of the fifth semiconductor pattern on the substrate,
an orthographic projection of the sixth conductor pattern on the substrate does not overlap with the orthographic projection of the third gate pattern on the substrate and the orthographic projection of the fourth gate pattern on the substrate, and
wherein the sub-pixel driving circuit further comprises a second shielding member provided with the fixed potential, wherein an orthographic projection of the second shielding member on the substrate at least partially overlaps with the orthographic projection of the sixth conductor pattern on the substrate; and
wherein the sub-pixel further comprises a gate line pattern, a light emission control signal line pattern, a reset signal line pattern, and a power supply signal line pattern; the gate line pattern, the light emission control signal line pattern, and the reset signal line pattern each extends in the second direction, the power supply signal line pattern comprises a portion extending in the first direction.

* * * * *